United States Patent
Maeda et al.

(10) Patent No.: US 7,504,291 B2
(45) Date of Patent: Mar. 17, 2009

(54) MOS TRANSISTOR ON AN SOI SUBSTRATE WITH A BODY CONTACT AND A GATE INSULATING FILM WITH VARIABLE THICKNESS

(75) Inventors: Shigenobu Maeda, Tokyo (JP); Takuji Matsumoto, Tokyo (JP); Toshiaki Iwamatsu, Tokyo (JP); Takashi Ipposhi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/929,626

(22) Filed: Oct. 30, 2007

(65) Prior Publication Data

US 2008/0081436 A1    Apr. 3, 2008

Related U.S. Application Data

(60) Division of application No. 11/317,687, filed on Dec. 27, 2005, now Pat. No. 7,300,847, which is a continuation of application No. 10/261,665, filed on Oct. 2, 2002, now Pat. No. 7,005,705.

(30) Foreign Application Priority Data

Apr. 25, 2002   (JP)   ............................. 2002-124180

(51) Int. Cl.
*H01L 21/84* (2006.01)
(52) U.S. Cl. ................. 438/165; 438/981; 257/E21.625
(58) Field of Classification Search ................... 438/295
See application file for complete search history.

(56) References Cited

U.S. PATENT DOCUMENTS 5,440,161 A   8/1995   Iwamatsu et al.
5,559,368 A   9/1996   Hu et al.
5,872,383 A   2/1999   Yagishita
6,335,262 B1  1/2002   Crowder et al.

(Continued)

FOREIGN PATENT DOCUMENTS

JP   8-125187   5/1996

(Continued)

OTHER PUBLICATIONS

Y. Hirano, et al., IEEE International SOI Conference, pp. 131-132, "Bulk-Layout-Compatible 0.18 μm SOI-CMOS Technology Using Body-Fixed Partial Trench Isolation (PTI)", Oct. 1999.

(Continued)

*Primary Examiner*—Stephen W Smoot
(74) *Attorney, Agent, or Firm*—Oblon, Spivak, McClelland, Maier & Neustadt, P.C.

(57) ABSTRACT

It is an object to provide an SOI device capable of carrying out body fixation and implementing a quick and stable operation. A gate insulating film (11) having a thickness of 1 to 5 nm is provided between a portion other than a gate contact pad (GP) of a gate electrode (12) and an SOI layer (3), and a gate insulating film (110) having a thickness of 5 to 15 nm is provided between the gate contact pad (GP) and the SOI layer (3). The gate insulating film (11) and the gate insulating film (110) are provided continuously.

12 Claims, 55 Drawing Sheets

U.S. PATENT DOCUMENTS

| | | |
|---|---|---|
| 6,462,379 B2 | 10/2002 | Higashi et al. |
| 6,521,959 B2 | 2/2003 | Kim et al. |
| 6,620,656 B2 | 9/2003 | Min et al. |
| 6,724,048 B2 | 4/2004 | Min et al. |
| 7,135,742 B1 | 11/2006 | Harada et al. |
| 2001/0031518 A1 | 10/2001 | Kim et al. |
| 2002/0048972 A1 | 4/2002 | Yamaguchi et al. |
| 2003/0052347 A1 | 3/2003 | Fung |
| 2003/0141543 A1 | 7/2003 | Bryant et al. |

FOREIGN PATENT DOCUMENTS

| | | |
|---|---|---|
| JP | 10-242471 | 9/1998 |
| JP | 11-97693 | 4/1999 |
| JP | 11-317528 | 11/1999 |
| JP | 2000-294794 | 10/2000 |
| JP | 2001-77368 | 3/2001 |
| JP | 2001-168349 | 6/2001 |
| JP | 2001-298195 | 10/2001 |
| JP | 2001298195 A | 10/2001 |

OTHER PUBLICATIONS

S. Maeda, et al., IEEE Symposium on VLSI Technology Digest of Technical Papers, pp. 154-155, "Impact of 0.18 μm SOI CMOS Technology Using Hybrid Trench Isolation With High Resistivity Substrate on Embedded RF/Analog Application", 2000.

Y. Hirano, et al., IEEE IEDM, pp. 467-470. "Impact of 0.10 μm SOI CMOS With Body-Tied Hybrid Trench Isolation Structure to Break Through the Scaling Crisis of Silicon Technology", 2000.

S. Maeda, et al., Extended Abstracts of the 2001 International Conference on Solid State Devices and Materials, pp. 270-271, "A Highly Reliable 0.18 μm SOI CMOS Tecnlology for 3.3V/1.8V Operation Using Hybrid Trench Isolation and Dual Gate Oxide". 2001.

B. W. Min, IEEE International SOI Conference, pp. 71-72, Partial Trench Isolated Body-Tied (PTIBT) Structure for SOI Application, 2001.

L. K. Han, et al., IEEE IEDM 97, pp. 643-646, "Electrical Characteristics and Reliability of SUB-3 nm Gate Oxides Grown on Nitrogen Implanted Silicon Substrates". 1997.

Imai et al., "Method and System for Fabricating MOS Type Semiconductor Device Having SOI Structure," English translation of JP 8-125187 A, published on May 17, 1996.

F I G. 15
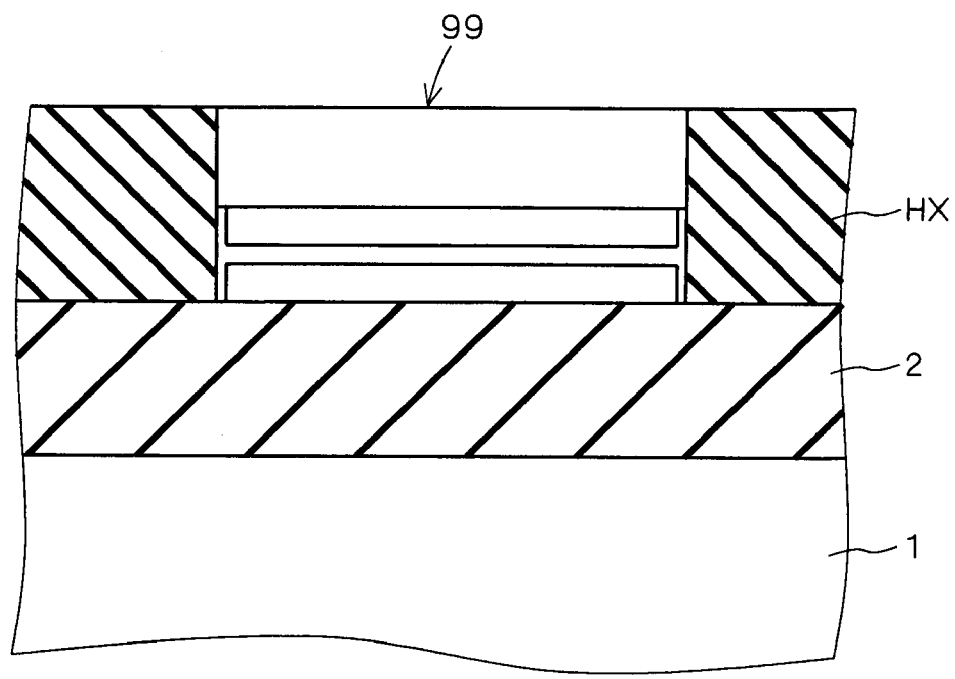
F I G. 16
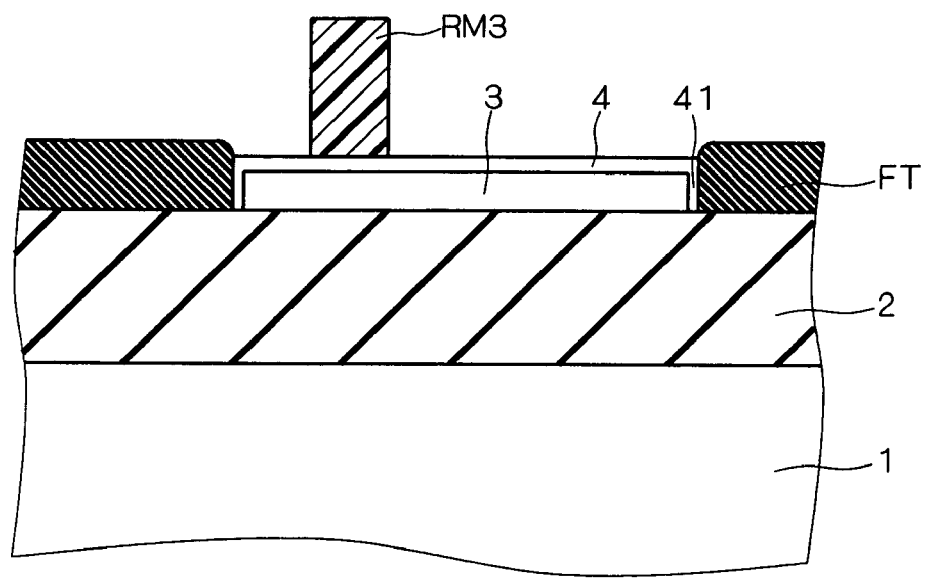

FIG. 43
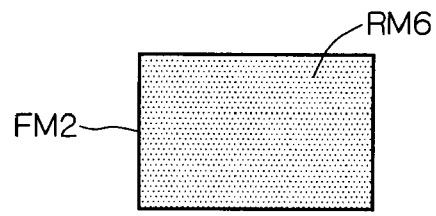
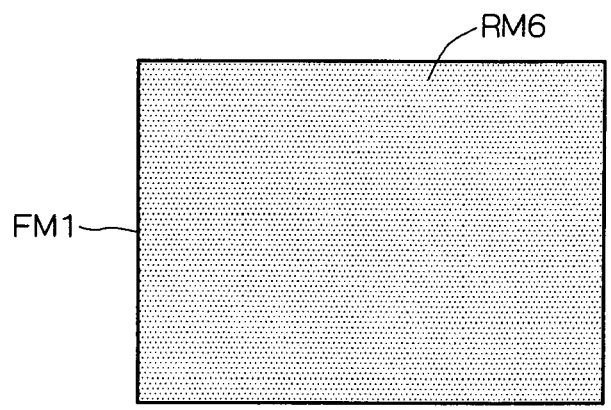
FIG. 44
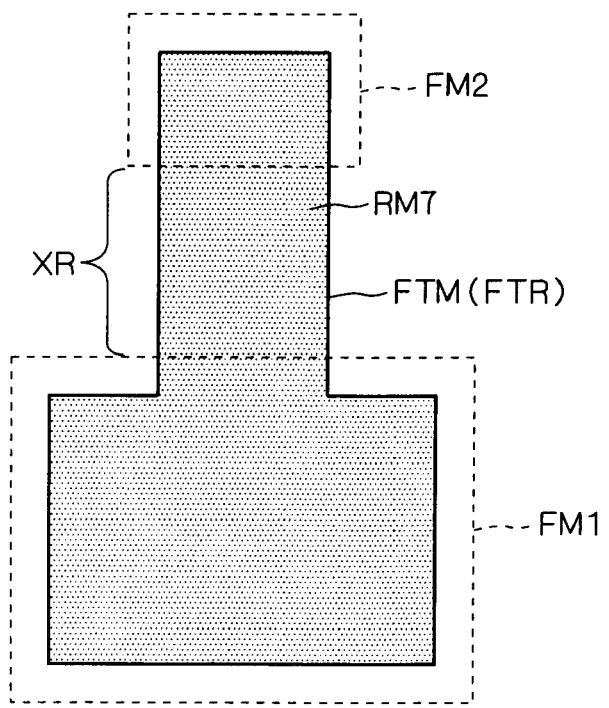

F I G. 45
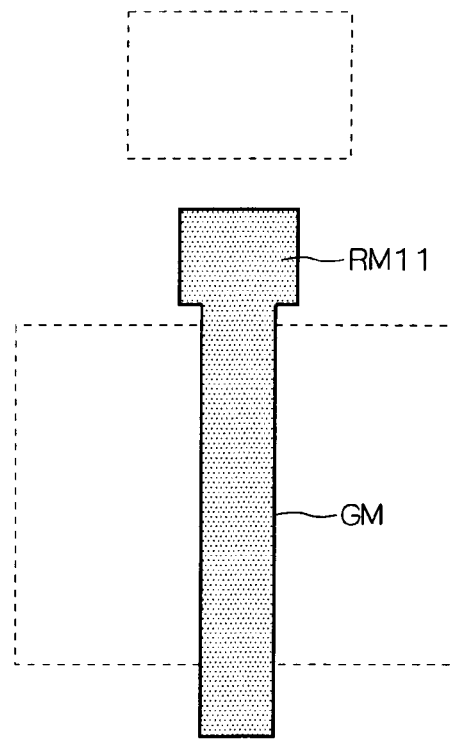
F I G. 46
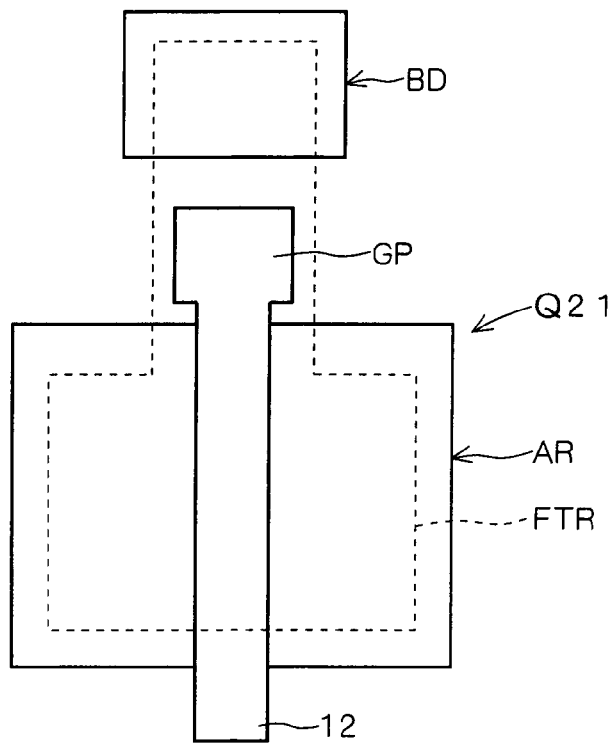

F I G. 5 1
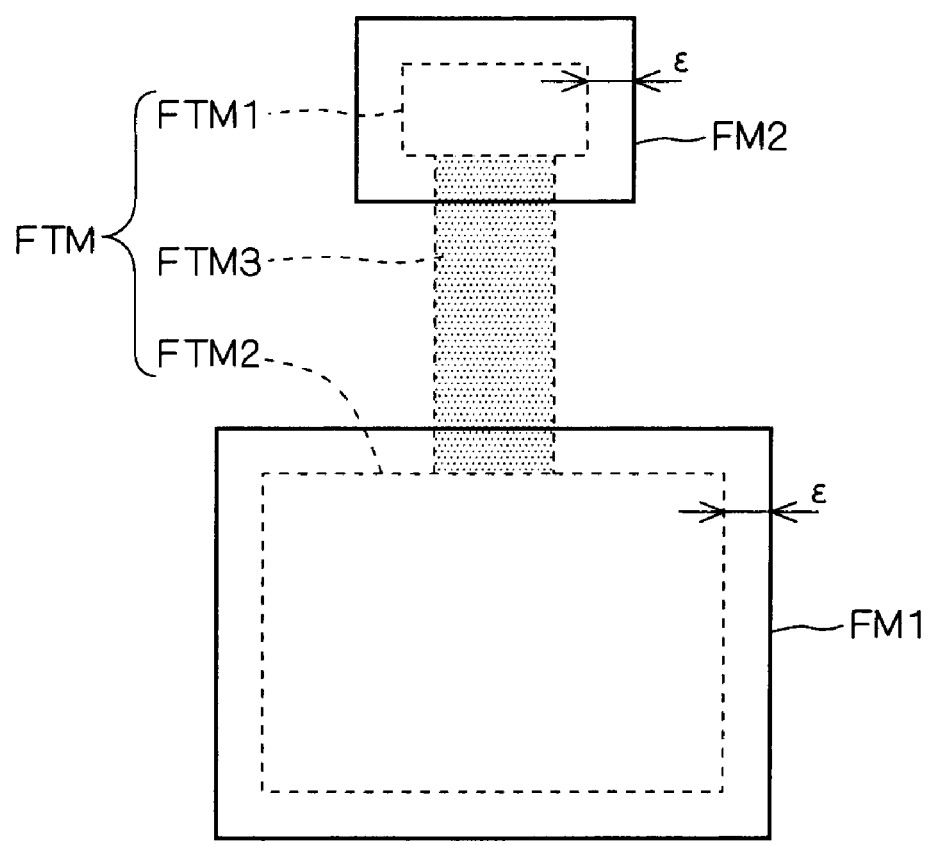

F I G. 63
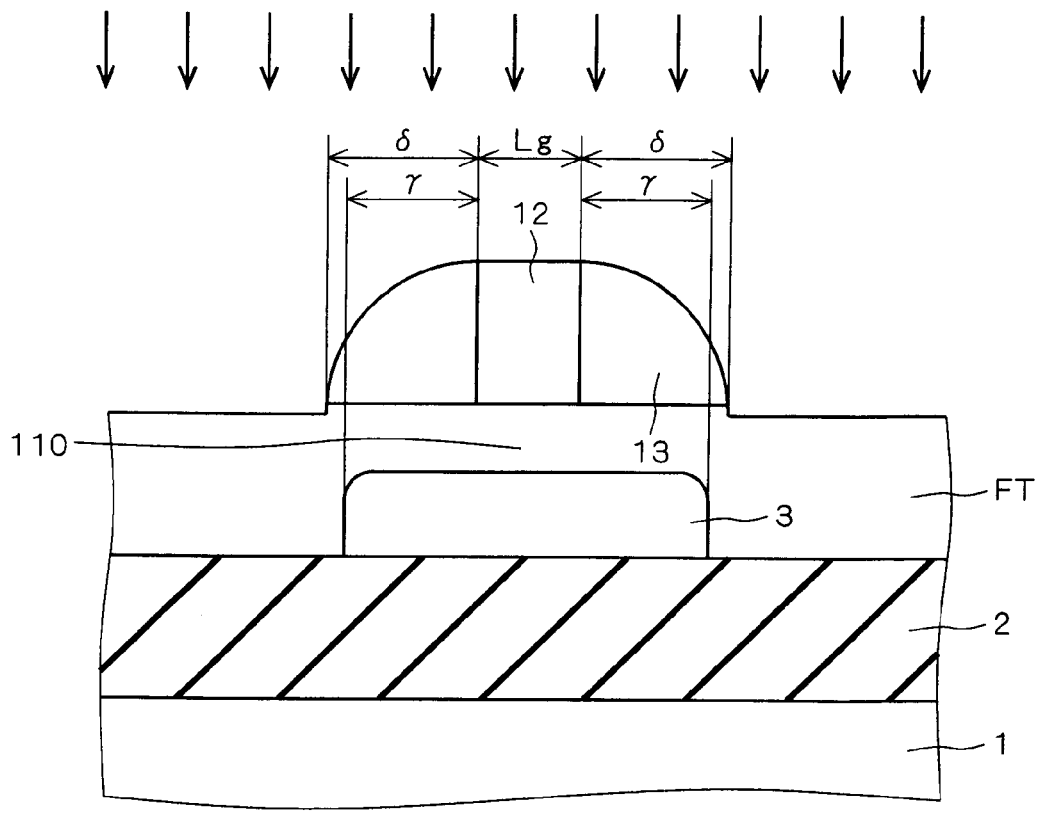
F I G. 64
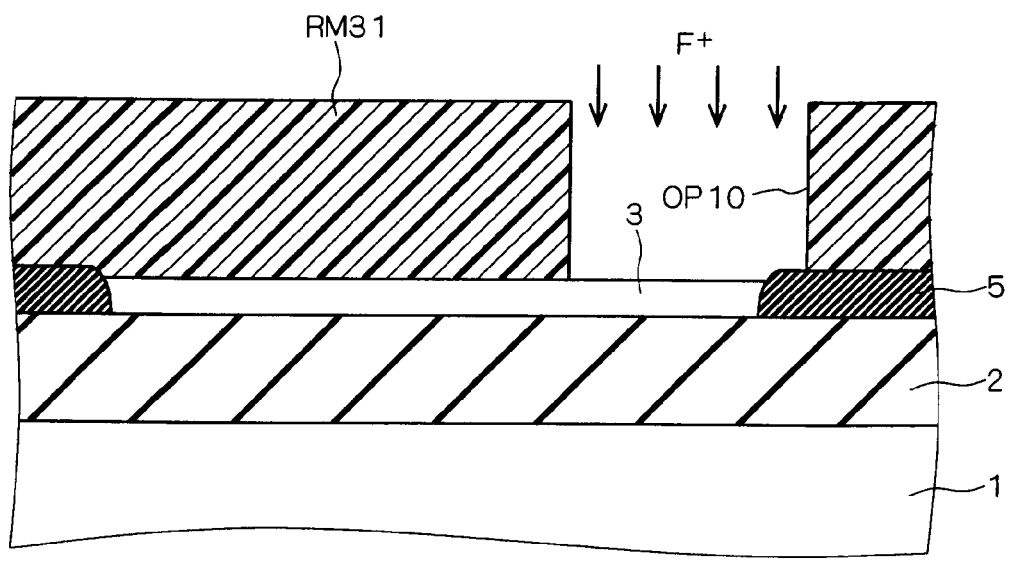

F I G. 65
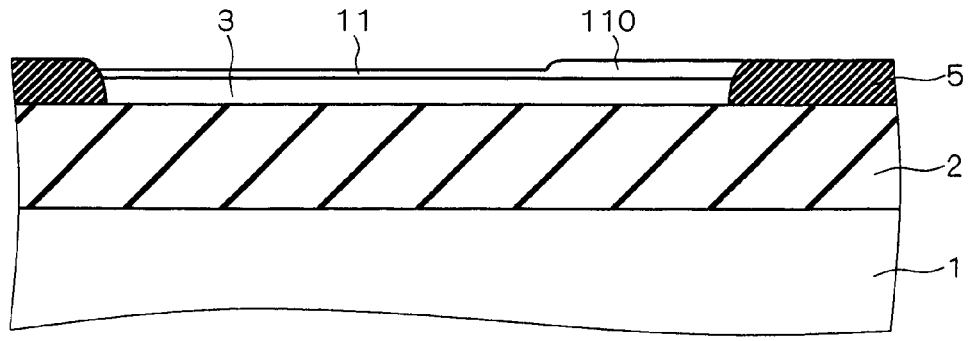
F I G. 66
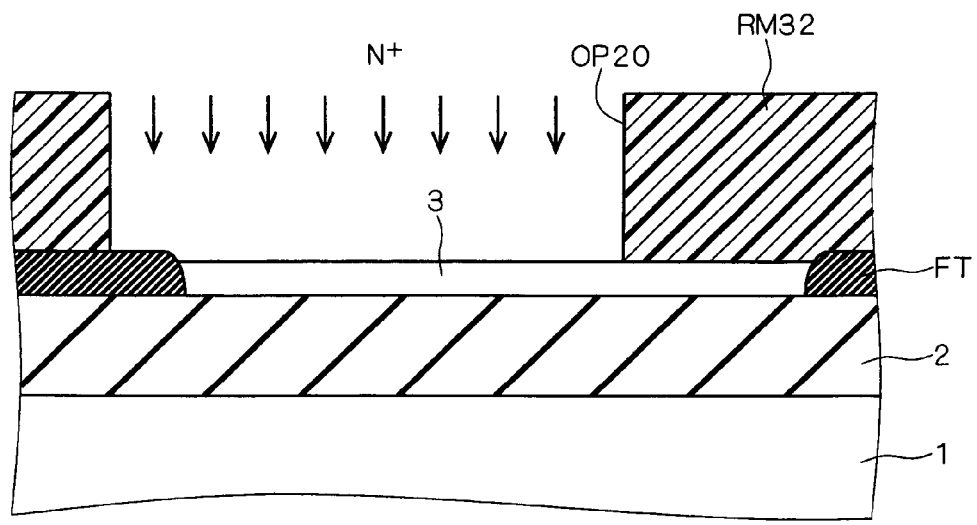
F I G. 67
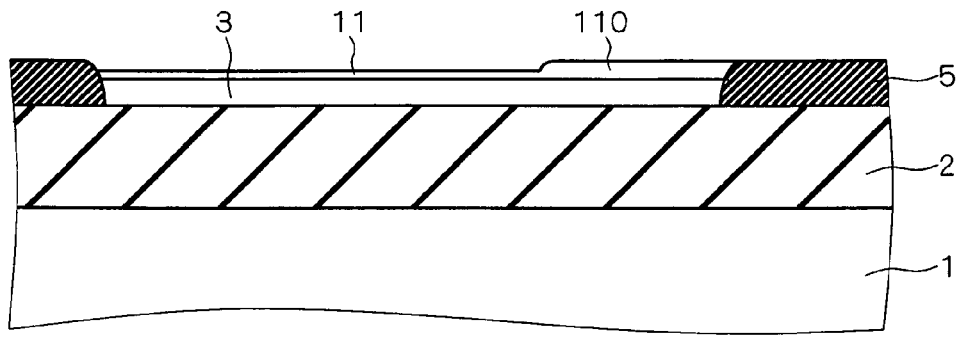

F I G. 71
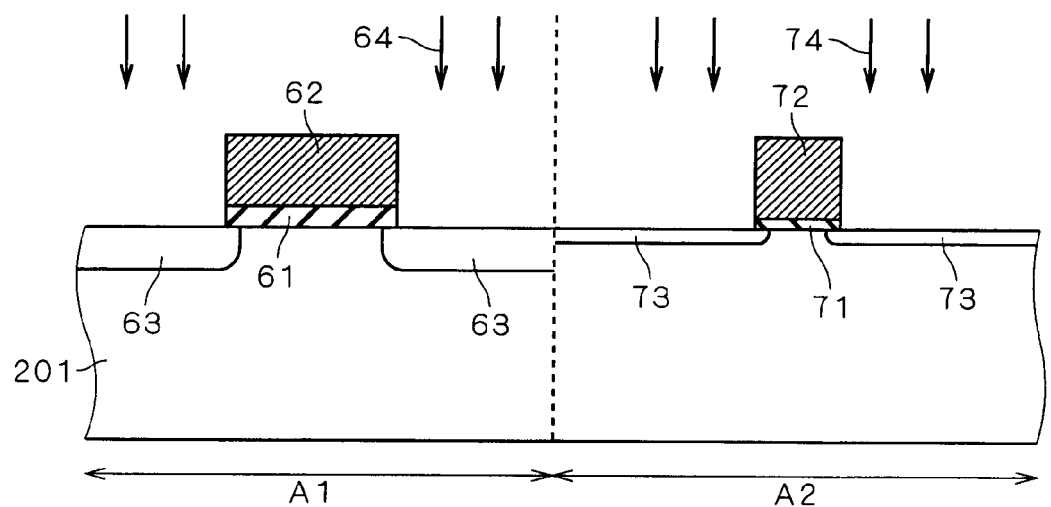
F I G. 72
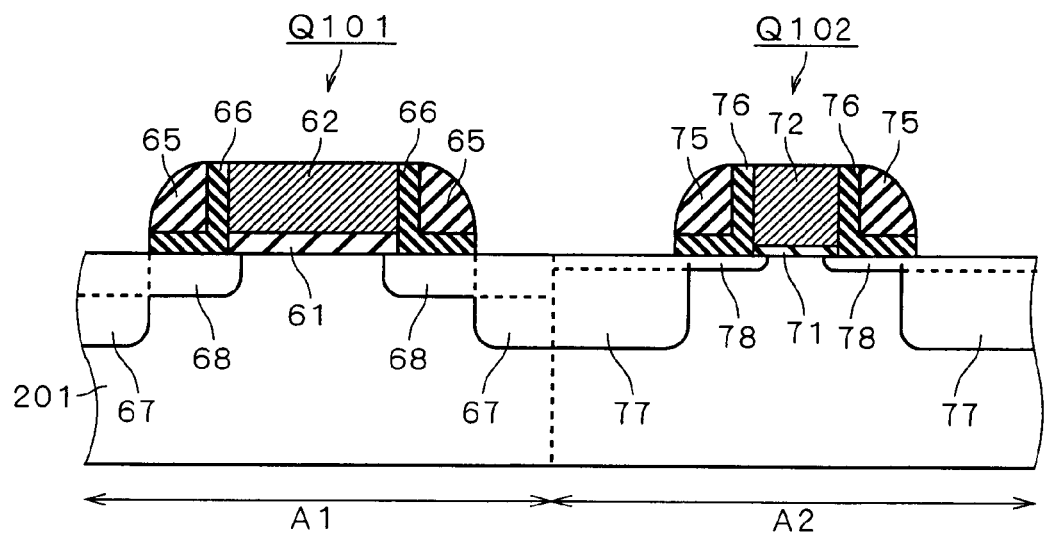

F I G. 73
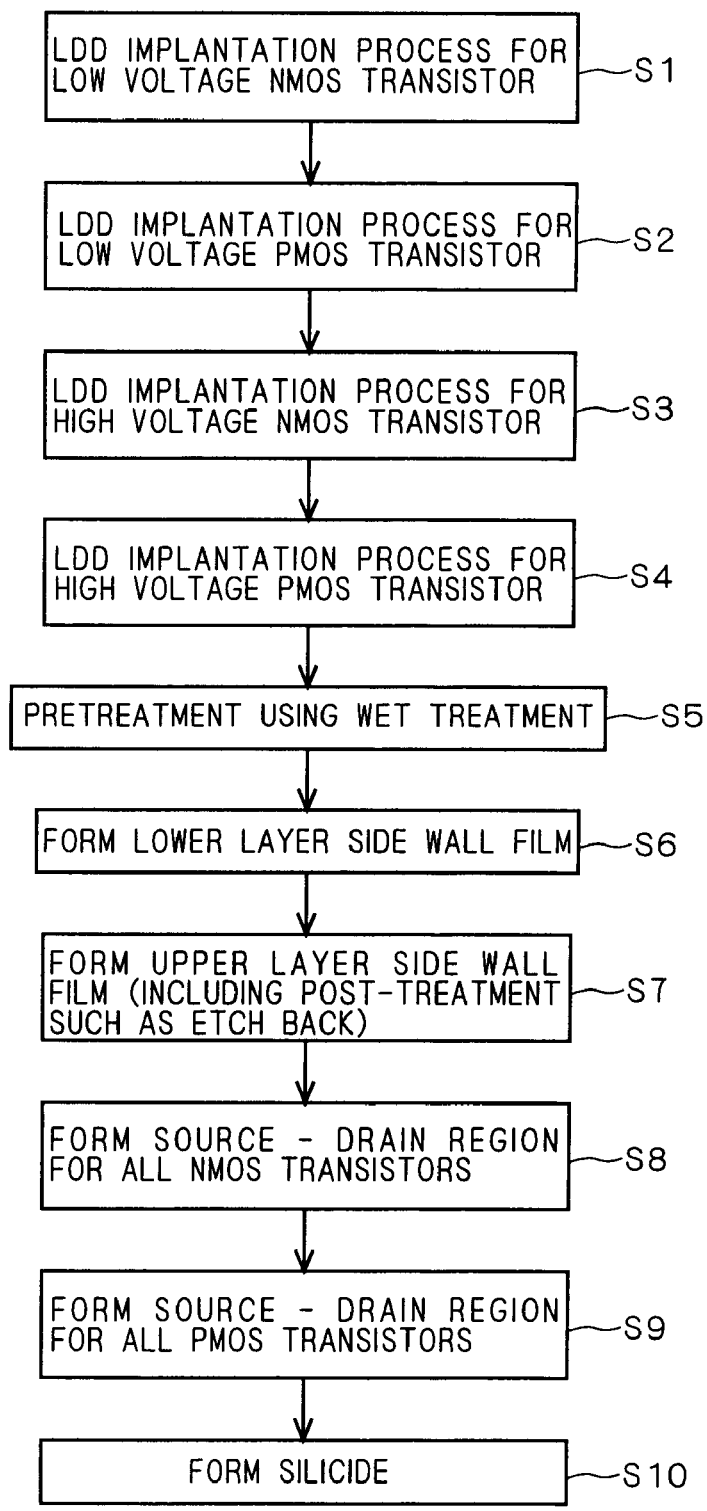

MOS TRANSISTOR ON AN SOI SUBSTRATE WITH A BODY CONTACT AND A GATE INSULATING FILM WITH VARIABLE THICKNESS

CROSS REFERENCE TO RELATED APPLICATIONS

This application is a divisional of application Ser. No. 11/317,687, filed Dec. 27, 2005, now U.S. Pat. No. 7,300,847, issued Nov. 27, 2007, which is a continuation of application Ser. No. 10/261,665 filed Oct. 2, 2002, now U.S. Pat. No. 7,005,705 and claims priority to the Japanese Application No. 2002-124180, filed on Apr. 25, 2002, the entire contents of each which are being incorporated herein by reference.

BACKGROUND OF THE INVENTION

1. Field of the Invention

The present invention relates to a semiconductor device, and more particularly to a method of manufacturing a semiconductor device having a trench isolating film.

2. Description of the Background Art

A semiconductor device (which will be hereinafter referred to as an SOI device) having an SOI structure formed on an SOI substrate in which a buried oxide film and an SOI (Silicon On Insulator) layer are provided on a silicon substrate can reduce a parasitic capacitance and is characterized by a quick and stable operation and low power consumption, and is thereby used for portable equipment or the like.

As an example, an SOI device has a perfect trench isolation (FTI) structure for electrically isolating elements by a perfect trench isolating film formed by providing a trench reaching a buried oxide film in a surface of an SOI layer and burying an insulating material in the trench. However, a carrier (a hole in NMOS) generated by an impact ionization phenomenon is accumulated in a channel formation region. Consequently, various problems arise by a substrate floating effect, for example, a kink is generated and an operating breakdown voltage is deteriorated, and furthermore, an electric potential of the channel formation region is not stabilized so that a frequency dependency of a delay time is generated.

Therefore, there has been devised a partial trench isolation (PTI) structure formed by providing a trench in a surface of an SOI layer to leave the SOI layer having a predetermined thickness between a bottom portion of the trench and a buried oxide film and burying an insulating material in the trench.

FIG. 74 shows a sectional structure of an MOS transistor Q10 having the PTI structure. In FIG. 74, a sectional structure in a direction of a gate width of the MOS transistor Q10 is illustrated.

As shown in FIG. 74, a partial isolating oxide film PT is provided in a surface of an SOI layer 3 of an SOI substrate constituted by a silicon substrate 1, a buried oxide film 2 and the SOI layer 3, and a gate oxide film 11 and a gate electrode 12 are sequentially provided on an active region AR defined by the partial isolating oxide film PT.

The SOI layer 3 is present between a bottom portion of the partial isolating oxide film PT and the buried oxide film 2 to form a well region WR, and a carrier can be moved through the well region WR and can be prevented from being accumulated in a channel formation region, and furthermore, an electric potential of the channel formation region can be fixed through the well region WR (body fixation). Therefore, there is an advantage that various problems do not arise by the substrate floating effect.

In the PTI structure, however, a depth of the partial isolating oxide film PT is mainly defined by etching during formation of a trench, and is also varied in the same wafer or between different wafers due to a variation in the etching.

As shown in FIG. 74, the depth of the partial isolating oxide film PT is defined as a depth d10 from a surface of a main surface of the SOI layer 3 to a bottom portion. For example, in the case in which d10=100 nm is set to be a design value, the depth of the partial isolating oxide film PT to be actually formed is set to d10=100 nm±5 nm and is varied within a range of 95 to 105 nm.

The foregoing implies that a thickness of the well region WR in a lower part of the partial isolating oxide film PT is varied within a range of 45 to 55 nm if a thickness of the SOI layer 3 is set to be approximately 150 nm. If the design value of the well region WR is set to be 50 nm, the variation is equivalent to ±10%.

The etching to be carried out when forming the trench in the partial isolating oxide film PT will be further described with reference to FIGS. 75 and 76.

As shown in FIG. 75, first of all, an SOI substrate is prepared and an oxide film 4 is formed on the SOI layer 3 of the SOI substrate.

Next, a polysilicon film 21 is formed on the oxide film 4 by a CVD (Chemical Vapor Deposition) method, and a nitride film 22 is formed on the polysilicon film 21 by the CVD method. The oxide film 4, the polysilicon film 21 and the nitride film 22 are also referred to as auxiliary films because they auxiliary function for forming an isolating oxide film.

As shown in FIG. 76, then, the nitride film 22 and the polysilicon film 21 are selectively removed by dry etching or wet etching using a resist mask (not shown) having a predetermined opening pattern.

By using the patterned nitride film 22 as an etching mask, furthermore, the oxide film 4 is penetrated and the SOI layer 3 is etched in a predetermined depth to form a trench TR. In the etching, etching conditions are adjusted such that the SOI layer 3 is not completely etched to expose the buried oxide film 2 but the SOI layer 3 having a predetermined thickness remains in a bottom portion of the trench TR.

A total amount of etching of the nitride film 22, the polysilicon film 21, the oxide film 4 and the SOI layer 3 is 200 to 400 nm. Even if a depth of a partial isolating oxide film PT is set to be small, for example, approximately 50 nm, the total amount of etching is 150 to 350 nm. Thus, the total amount of etching is not very changed. Consequently, a variation is not greatly changed.

For this reason, in the case in which a depth of the trench TR is set to be 50 nm for the SOI layer 3 having a thickness of 70 nm, the thickness of the well region WR in the lower part of the partial isolating oxide film PT is varied within a range of approximately ±5 nm. If the design value of the thickness of the well region WR is set to be 20 nm, a variation is equivalent to ±25%, which cannot be permitted. The variation is further increased with a reduction in the thickness of the SOI layer 3 so that the body fixation of the PTI structure is substantially limited. In the thin SOI layer, thus, it is hard to form a partial isolating oxide film and it is difficult to carry out the body fixation by the PTI structure.

As a method of carrying out the body fixation other than the body fixation using the PTI structure, moreover, there has been proposed such a structure that a planar shape of a gate electrode is changed or a position in which a body contact portion for the body fixation is to be formed is taken into consideration.

FIG. 77 is a planar layout of a gate electrode which is referred to as a T type gate, illustrating a gate electrode 12T in which one of ends in a direction of a gate width is greatly enlarged in a direction of a gate length to constitute a gate contact pad GP and which has a "T" shape seen on a plane.

A body contact portion BD is provided on the outside of a tip of a head portion of the "T" shape in the gate electrode 12T. An impurity region having a reverse conductivity type to that of a source-drain region is formed in a surface of the SOI layer 3 in the body contact portion BD.

Moreover, an active region AR including the source-drain region and the body contact portion BD are provided continuously.

FIG. 78 shows a structure of a section taken along a line A-A in FIG. 77. As shown in FIG. 78, in the case in which an MOS transistor has an N conductivity type, the SOI layer 3 provided under the gate electrode 12T contains a P type impurity in a comparatively low concentration (P−), while the body contact portion BD contains the P type impurity in a comparatively high concentration (P+). The active region AR and the body contact portion BD are defined by a perfect trench isolating oxide film FT.

By employing such a structure, the active region AR is defined by the perfect trench isolating oxide film FT. Therefore, a variation in the depth of the trench is not generated so that a reduction in the thickness of the SOI layer 3 has no problem. Moreover, the electric potential of the channel formation region can be fixed through the body contact portion BD so that a stable operation can be implemented.

Examples of a structure to produce the same functions and effects includes a structure referred to as an H type gate shown in FIG. 79 and a structure referred to as a source tie shown in FIG. 80.

In the H type gate shown in FIG. 79, both ends in a direction of a gate width are greatly enlarged in a direction of a gate length, and a gate electrode 12H having an H-shaped planar shape is provided and two body contact portions BD are provided.

In the source tie structure shown in FIG. 79, the band-shaped body contact portion BD is provided in a part of a source region SR and one end of the body contact portion BD is connected to a channel region provided under the gate electrode 12.

In the case in which the T type gate structure or the H type gate structure is employed, however, there is a problem in that a parasitic capacitance between a gate and a drain is increased corresponding to an increase in an area of a gate electrode and a quick and stable operation cannot be carried out.

SUMMARY OF THE INVENTION

In order to solve the above-mentioned problems, it is an object of the present invention to carry out body fixation and to implement a quick and stable operation in an SOI device in which a thickness of an SOI layer is reduced.

A first aspect of the present invention is directed to a semiconductor device including an MOS transistor provided on an SOI layer of an SOI substrate in which a semiconductor substrate, a buried insulating film and the SOI layer are sequentially provided, and a body contact portion provided in a surface of the SOI layer and capable of fixing an electric potential from an outside. A gate electrode of the MOS transistor has a shape seen on a plane such that at least one of ends in a direction of a gate width is enlarged in a direction of a gate length to constitute a gate contact pad, and the body contact portion is provided in the surface of the SOI layer on an outside of the end in the direction of the gate width of the gate contact pad and is electrically connected to a channel formation region provided under the gate electrode through the SOI layer. Moreover, a gate insulating film of the MOS transistor includes a first portion having a first thickness and a second portion having a second thickness in the direction of the gate width, the second thickness being greater than the first thickness, and the second portion of the gate insulating film is provided at least under the gate contact pad.

For example, the thickness of the gate insulating film provided under the gate contact pad formed over a large area of the SOI layer is increased and the thickness of the gate insulating film in a region in which a current flows in a large amount is reduced. Consequently, it is possible to reduce a parasitic capacitance between a gate and a drain with such a structure that body fixation can be carried out. Thus, it is possible to obtain an MOS transistor capable of carrying out a quick and stable operation with low power consumption.

A second aspect of the present invention is directed to a semiconductor device including an MOS transistor provided on an SOI layer of an SOI substrate in which a semiconductor substrate, a buried insulating film and the SOI layer are sequentially provided, and a body contact portion provided in a surface of the SOI layer and capable of fixing an electric potential from an outside. A gate insulating film of the MOS transistor includes a first portion having a first thickness and a second portion having a second thickness in a direction of a gate width, the second thickness being greater than the first thickness. Moreover, the body contact portion is provided like a band adjacently to a source region of the MOS transistor in the surface of the SOI layer on an outside of an edge portion in the direction of the gate width in the source region. An insulating film having the second thickness including the second portion of the gate insulating film is provided on one of two ends in the direction of the gate width of a gate electrode of the MOS transistor in which the band-shaped body contact portion is provided.

In a source tie structure, the thick gate insulating film is provided on the connecting portion of the body contact portion and the channel region and the thickness of the gate insulating film in the region of the gate electrode in which a current flows in a large amount is reduced. Consequently, it is possible to reduce a parasitic capacitance between a gate and a drain with such a structure that body fixation can be carried out. Thus, it is possible to obtain an MOS transistor capable of carrying out a quick and stable operation with low power consumption.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 13 to 19 are views illustrating a process for manufacturing an MOS transistor according to a fourth embodiment of the present invention, FIGS. 43 to 46 are plan views illustrating the process for manufacturing an MOS transistor according to the fifth embodiment of the present invention, FIG. 51 is a plan view for explaining creation of mask data in the MOS transistor according to the fifth embodiment of the present invention, FIGS. 62 and 63 are views showing a sectional structure in the middle of manufacture of the MOS transistor according to the sixth embodiment of the present invention, FIGS. 64 to 67 are views illustrating a process for manufacturing an MOS transistor according to a seventh embodiment of the present invention, FIGS. 68 to 72 are views illustrating a dual oxide process, FIG. 73 is a flow chart for explaining the dual oxide process.

DESCRIPTION OF THE PREFERRED EMBODIMENTS

A. First Embodiment

<A-1. Structure of Device>

Figure 1:
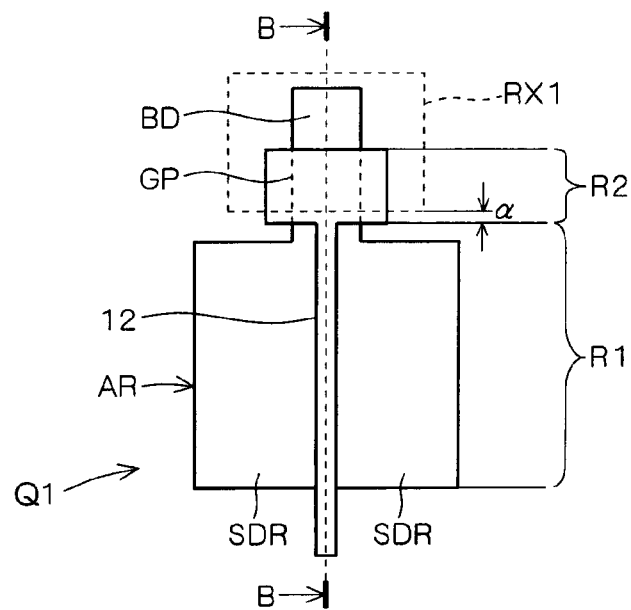
FIG. 1 is a view showing a planar structure of an MOS transistor according to a first embodiment of the present invention.

As a first embodiment according to the present invention, FIG. 1 shows a planar layout of an MOS transistor Q1 having a T-type gate.

As shown in FIG. 1, the MOS transistor Q1 includes a gate electrode 12 having one of ends in a direction of a gate width which is greatly enlarged in a direction of a gate length and has a T shape seen on a plane.

A T-shaped head portion of the gate electrode 12 is referred to as a gate contact pad GP and acts as an electrical contact portion for the gate electrode. A body contact portion BD is provided on the outside of a tip of the gate contact pad GP. An impurity region having a reverse conductivity type to that of a source-drain region is formed in a surface of an SOI layer 3 of the body contact portion BD.

Moreover, an active region AR including a source-drain region SDR and the body contact portion BD are provided continuously, and the gate contact pad GP is provided on the active region AR connecting the source-drain region SDR and the body contact portion BD.

In FIG. 1, R1 indicates a region in which a current flows in a large amount and R2 indicates a region corresponding to the gate contact pad GP in the gate electrode 12.

Figure 2:
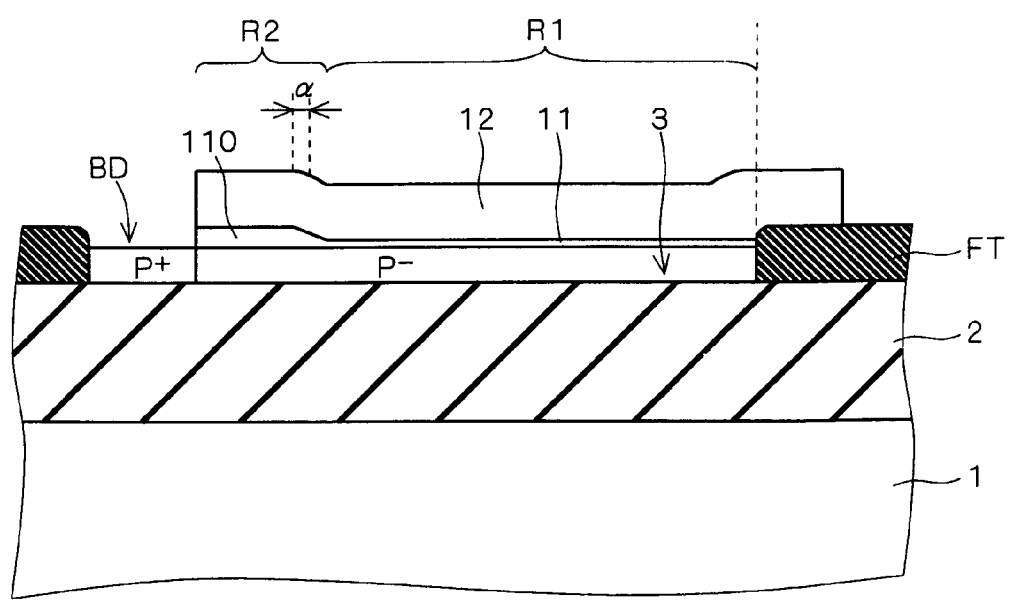
FIG. 2 is a view showing a sectional structure of the MOS transistor according to the first embodiment of the present invention.

FIG. 2 shows a structure of a section taken along a line B-B in FIG. 1. As shown in FIG. 2, the gate electrode 12 is provided on an SOI substrate constituted by a silicon substrate 1, a buried oxide film 2 and the SOI layer 3. In the case in which the MOS transistor Q1 has an N conductivity type, the SOI layer 3 provided under the gate electrode 12 contains a P-type impurity in a comparatively low concentration ($P^-$), while the body contact portion BD contains a P-type impurity in a comparatively high concentration ($P^+$). In the case in which the MOS transistor Q1 has a P conductivity type, the SOI layer 3 provided under the gate electrode 12 contains an N-type impurity in a comparatively low concentration ($N^-$), while the body contact portion BD contains an N-type impurity in a comparatively high concentration ($N^+$).

A gate insulating film 11 having a thickness of 1 to 5 nm is provided between a portion of the gate electrode 12 other than the gate contact pad GP and the SOI layer 3, and a gate insulating film 110 having a thickness of 5 to 15 nm is provided between the gate contact pad GP and the SOI layer 3. The gate insulating film 11 and the gate insulating film 110 are provided continuously.

Mask data for forming the gate insulating film 110 are indicated as RX1 in FIG. 1. Referring to the mask data RX1, the gate insulating film 110 covers the body contact portion BD and a periphery thereof in addition to a portion provided under the gate contact pad GP. The mask data RX1 have a rectangular shape seen on a plane and are provided such that a side thereof does not completely overlap with a side on the source-drain region side of the gate contact pad GP but is shifted toward the body contact portion BD side by a length of α. Such provision is carried out in consideration of a shift at time of actual mask alignment.

<A-2. Manufacturing Method>

A method of manufacturing the MOS transistor Q1 will be described below with reference to FIGS. 3 to 7.

Figure 3:
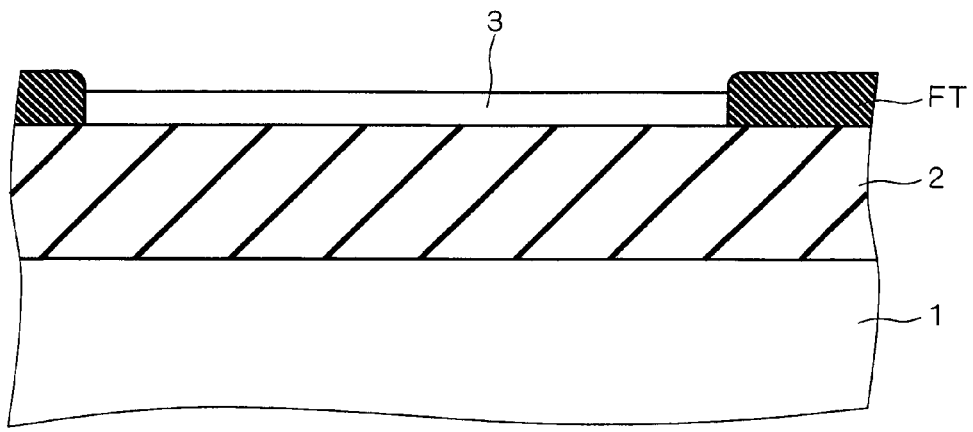
FIGS. 3 to 7 are views illustrating a process for manufacturing the MOS transistor according to the first embodiment of the present invention.

First of all, as shown in FIG. 3, an SOI substrate constituted by a silicon substrate 1, a buried oxide film 2 and an SOI layer 3 is prepared and a perfect trench isolating oxide film FT reaching the buried oxide film 2 through the SOI layer 3 of the SOI substrate is formed, and an active region and a region to be a body contact portion are then defined.

Figure 4:
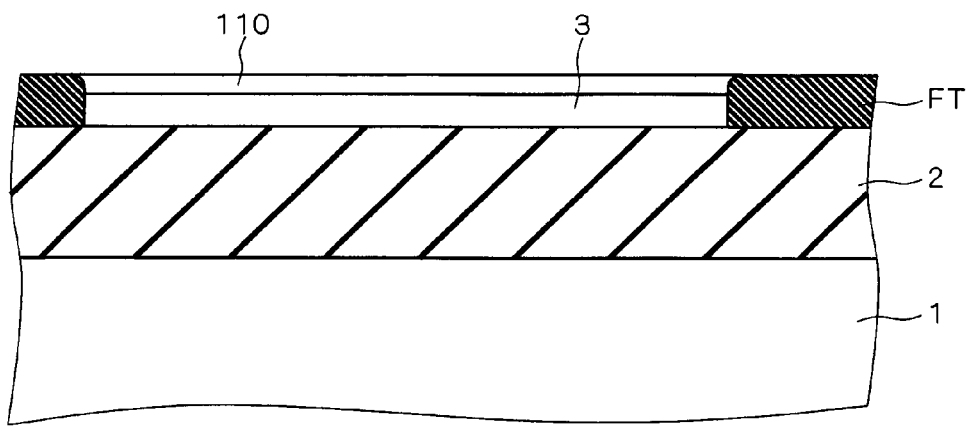

At a step shown in FIG. 4, next, a gate insulating film 110 having a thickness of 5 to 15 nm is formed over a whole surface of the SOI layer 3.

Figure 5:
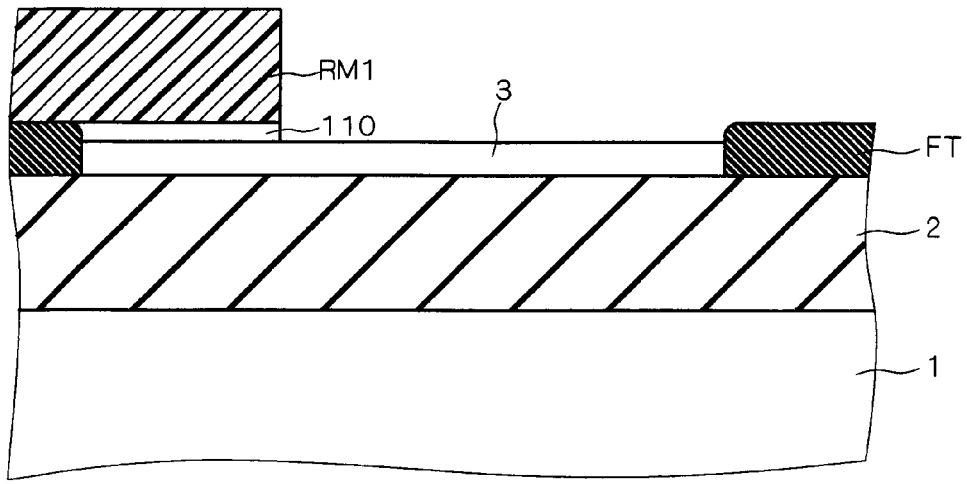

At a step shown in FIG. 5, then, a resist mask RM1 is patterned based on the mask data RX1 and a region leaving the gate insulating film 110 is defined. Thereafter, the gate insulating film 110 which is not covered by the resist mask RM1 is removed by wet etching.

Figure 6:
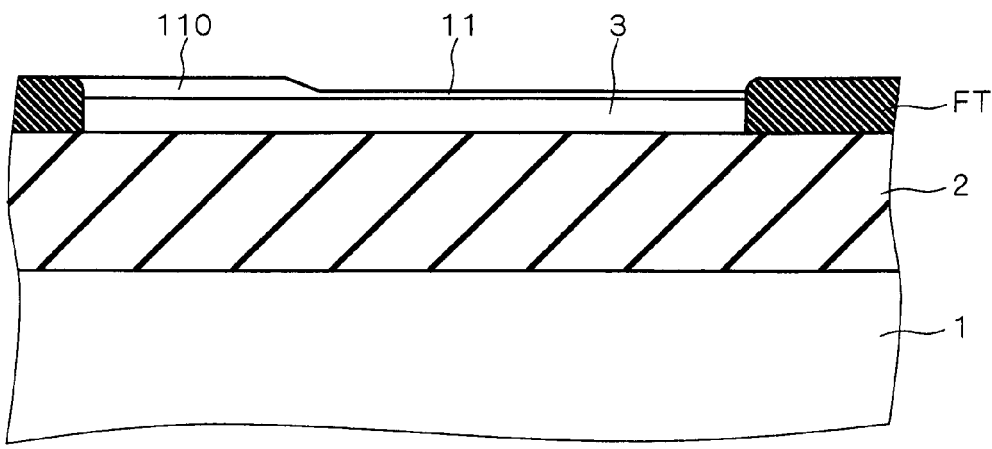

Subsequently, the resist mask RM1 is removed and a gate insulating film 11 having a thickness of 1 to 5 nm is formed on the exposed SOI layer 3 by thermal oxidation at a step shown in FIG. 6.

In the following, an oxide film may be formed by the thermal oxidation using a CVD (Chemical Vapor Deposition) method or the like. Moreover, the thermal oxidation includes an RTO (Rapid Thermal Oxidation) method in addition to a method using an oxidizing furnace. These oxide film forming processes and variants are simply referred to as oxidation in some cases.

Figure 7:
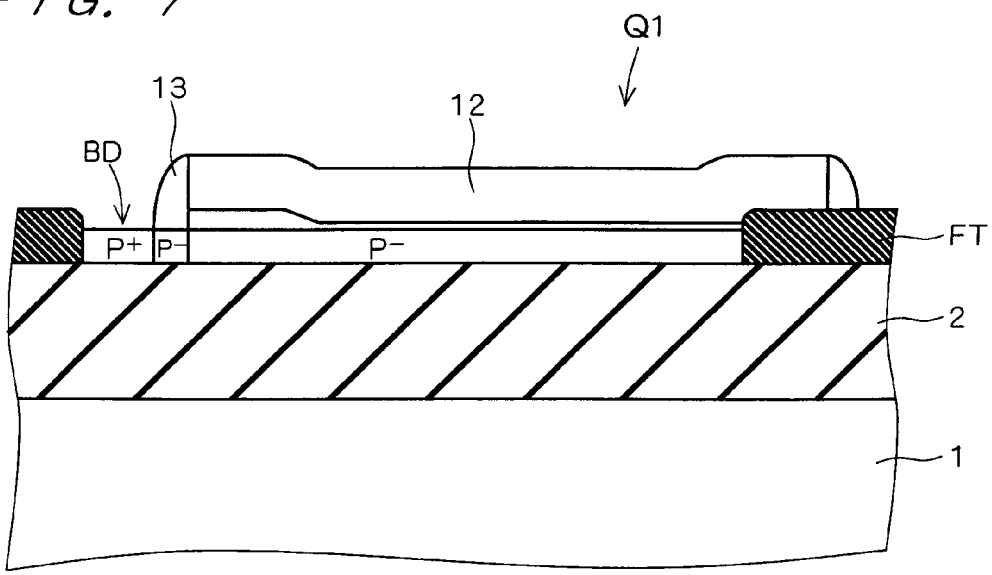

At a step shown in FIG. 7, next, the gate electrode 12 is patterned on the gate insulating films 11 and 110. A side wall insulating film 13 may be formed on a side surface of the gate electrode 12.

Then, an impurity implantation for forming a source-drain region and an impurity implantation for forming the body contact portion BD are carried out so that the MOS transistor Q1 is finished.

<A-3. Function and Effect>

As described above, in the MOS transistor Q1 according to the first embodiment, a thickness of the gate insulating film is varied in the direction of the gate width, and a thickness of the gate insulating film 110 provided under the gate contact pad GP over a large area of the SOI layer 3 is increased and a thickness of the gate insulating film 11 in the region R1 in which a current flows in a large amount is reduced. Consequently, body fixation can be carried out and a parasitic capacitance between a gate and a drain can be reduced. Thus, it is possible to obtain an MOS transistor capable of carrying out a quick and stable operation with low power consumption.

Moreover, the SOI layer 3 has a thickness of 10 to 100 nm, which is referred to as a thin SOI layer. Since the active region AR and the body contact portion BD are defined by the perfect trench isolating oxide film FT, a drawback is not caused by a variation in a depth of a trench.

In the thin SOI layer in which the body fixation is hard to perform with a PTI structure, thus, the body fixation is effectively carried out by a thick gate insulating film. Even if the gate insulating film and the trench isolating oxide film are formed of the same material, a provision pattern is completely different. For example, while the trench isolating oxide film is not formed on the body contact portion BD, the thick gate insulating film may be extended up to the body contact portion BD.

Moreover, since the gate insulating films 11 and 110 are formed by the thermal oxidation, a film thickness has an excellent controllability and is less varied. Consequently, it is possible to promote a reduction in the thickness of the SOI layer 3 by the formation of the gate insulating films 11 and 110.

While the T-type gate has been illustrated in the first embodiment, it is apparent that a thickness of a gate insulating film provided under two gate contact pads may be increased in an H-type gate having the gate contact pads provided on both ends in a direction of a width of a gate electrode.

B. Second Embodiment

<B-1. Structure of Device>

As a second embodiment according to the present invention, FIGS. 8 to 11 show planar structures of MOS transistors Q2 to Q5 having a source tie structure.

Figure 8:
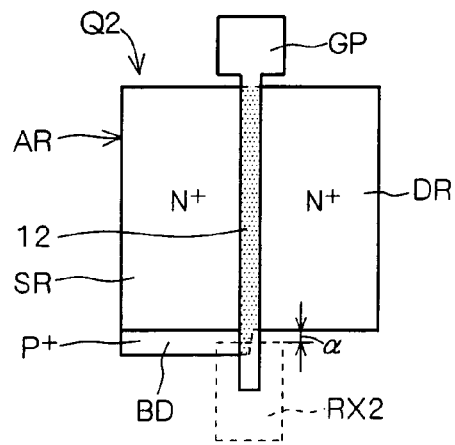
FIGS. 8 to 11 are views showing a planar structure of an MOS transistor having a source tie structure according to a second embodiment of the present invention.

In the source tie structure, a band-shaped body contact portion BD is provided in a part of a source region SR and one of ends of the body contact portion BD is connected to a channel region provided under a gate electrode 12. In FIG. 8, in the N-type MOS transistor Q2, the body contact portion BD is provided along the outside of an edge portion of a source region on the opposite side to the side of the gate electrode 12 on which a gate contact pad GP is provided, and an end of the body contact portion BD is connected to the channel region provided under the gate electrode 12. The body contact portion BD has a P conductivity type.

Figure 9:
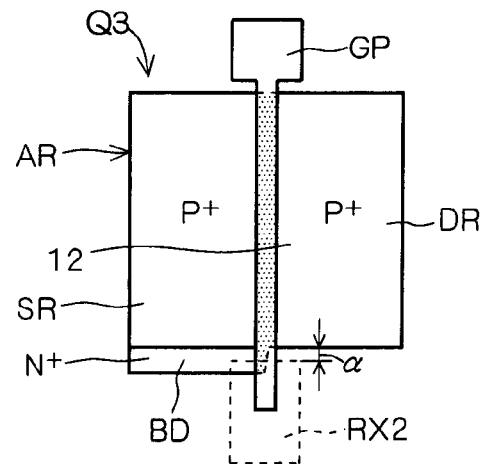

In FIG. 9, in the P-type MOS transistor Q3, the body contact portion BD is provided along the outside of the edge portion of the source region on the opposite side to the side of the gate electrode 12 on which the gate contact pad GP is provided, and the end of the body contact portion BD is connected to the channel region provided under the gate electrode 12. The body contact portion BD has an N conductivity type.

In the MOS transistors Q2 and Q3, a gate insulating film in a region of the gate electrode 12 in which a current flows in a large amount is formed thinly and a thick gate insulating film is provided on a connecting portion of the body contact portion BD and the channel region. In FIGS. 8 and 9, mask data for forming the thick gate insulating film are indicated as RX2. The mask data RX2 are provided to be shifted by a length of a from the edge portion of the source region toward the opposite side of the gate contact pad GP in consideration of a shift at time of mask formation.

Moreover, the channel region provided in contact with the body contact portion BD is extended up to the vicinity of a central part of a gate length of the gate electrode 12 in order to prevent an electrical short circuit of a drain region DR and a source region SR. In FIGS. 8 and 9, the channel region is shown in hatching.

Figure 10:
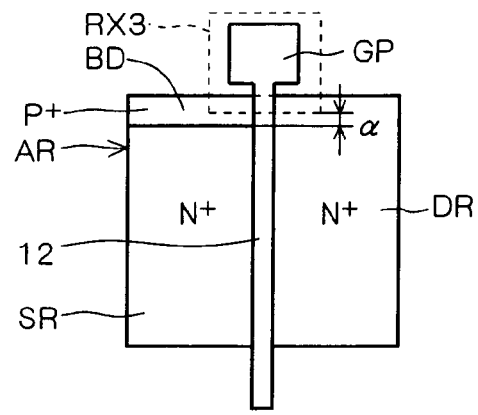

In FIG. 10, in the N-type MOS transistor Q4, the body contact portion BD is provided along the outside of the edge portion of the source region SR on the side of the gate electrode 12 on which the gate contact pad GP is provided, and the end of the body contact portion BD is connected to the channel region provided under the gate electrode 12. The body contact portion BD has a P conductivity type.

Figure 11:
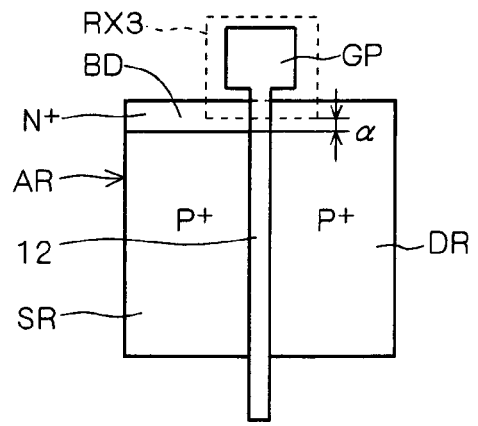

In FIG. 11, in the P-type MOS transistor Q5, the body contact portion BD is provided along the outside of the edge portion of the source region SR on the side of the gate electrode 12 on which the gate contact pad GP is provided, and the end of the body contact portion BD is connected to the channel region provided under the gate electrode 12. The body contact portion BD has an N conductivity type.

In the MOS transistors Q4 and Q5, a gate insulating film in a region of the gate electrode 12 in which a current flows in a large amount is formed thinly and a thick gate insulating film is provided on a connecting portion of the body contact portion BD and the channel region. In FIGS. 10 and 11, mask data for forming the thick gate insulating film are indicated as RX3. The mask data RX3 are provided to be shifted by a length of a from the edge portion of the source region toward the gate contact pad GP side in consideration of a shift at time of mask formation.

<B-2. Function and Effect>

As described above, in the MOS transistors Q2 to Q5 according to the second embodiment, the thick gate insulating film is provided on the connecting portion of the body contact portion BD and the channel region and the thickness of the gate insulating film is reduced in the region of the gate electrode in which a current flows in a large amount in the source tie structure. Consequently, body fixation can be carried out and a parasitic capacitance between a gate and a drain can be reduced. Thus, it is possible to obtain an MOS transistor capable of carrying out a quick and stable operation with low power consumption.

C. Third Embodiment

<C-1. Structure of Device>

Figure 12:
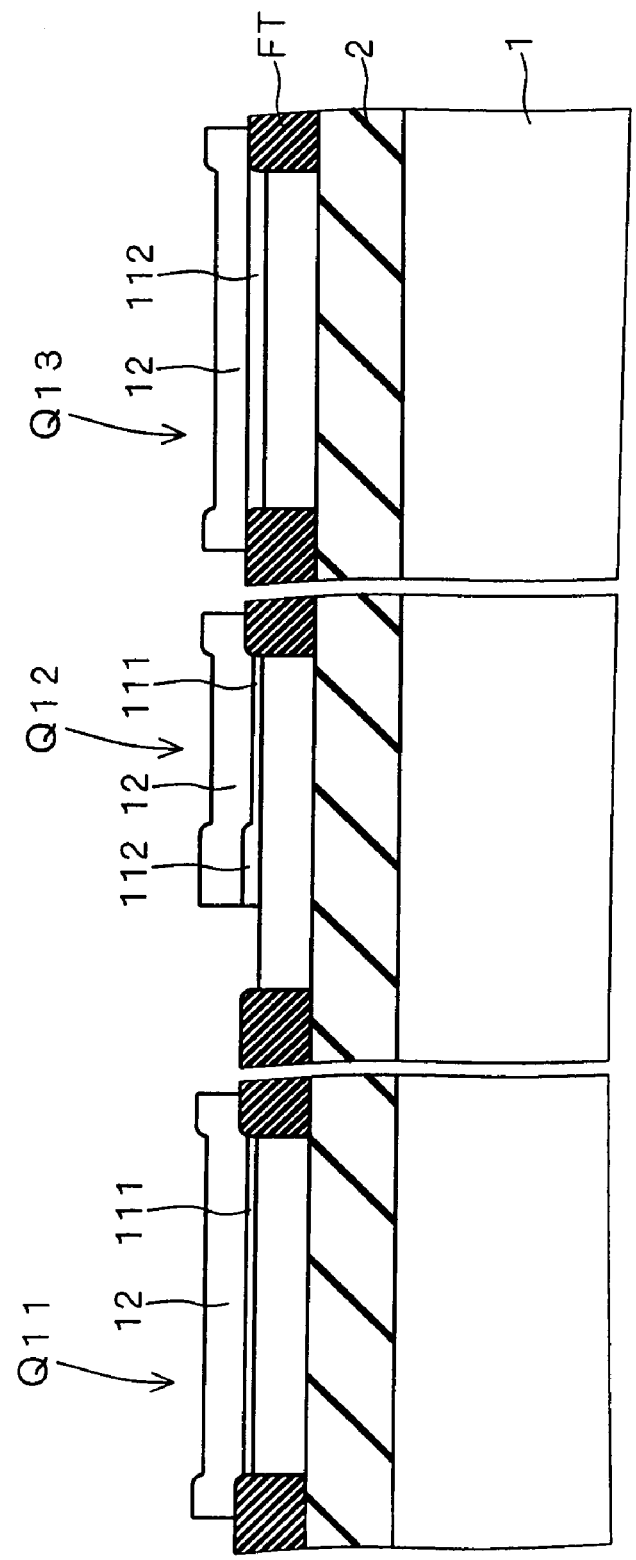
FIG. 12 is a view showing a sectional structure of an MOS transistor according to a third embodiment of the present invention.

As a third embodiment according to the present invention, FIG. 12 shows sectional structures of MOS transistors Q11, Q12 and Q13.

As shown in FIG. 12, the MOS transistors Q11 to Q13 are provided on one SOI substrate constituted by a silicon substrate 1, a buried oxide film 2 and an SOI layer 3.

In FIG. 12, the MOS transistor Q11 has a gate electrode 12 formed on the SOI layer 3 defined by a perfect trench isolating oxide film FT with a gate insulating film 111 having a comparatively small thickness (for example, a thickness of 1 to 5 nm) provided therebetween.

Moreover, the MOS transistor Q13 has the gate electrode 12 formed on the SOI layer 3 defined by the perfect trench isolating oxide film FT with a gate insulating film 112 having a comparatively great thickness (for example, a thickness of 3 to 15 nm) provided therebetween.

The MOS transistor Q12 has such a structure that the gate insulating film 111 having a comparatively small thickness and the gate insulating film 112 having a comparatively great thickness are provided continuously on the SOI layer 3 defined by the perfect trench isolating oxide film FT in a direction of a gate width, and the gate electrode 12 is formed on the SOI layer 3 with the gate insulating films 111 and 112 provided therebetween and a body contact portion BD is provided in a surface of the SOI layer 3 on the outside of an end of the gate electrode 12 on the side on which the gate insulating film 112 is to be provided.

The MOS transistor Q11 is a low voltage transistor having a gate voltage of 0.5 to 2.0 V, for example, the MOS transistor Q13 is a high voltage transistor having a gate voltage of 1.5 to 5.0 V, for example, and the MOS transistor Q12 can carry out the body fixation described in the first and second embodiments.

Thus, a process for forming two kinds of MOS transistors provided with gate insulating films having different thicknesses on a common semiconductor substrate will be referred to as a dual oxide process.

By the dual oxide process, formation of a low voltage transistor and a high voltage transistor including gate insulating films having different thicknesses on a common SOI substrate have conventionally been put to practical use. If a step of forming the gate insulating films is also used for a step of forming the gate insulating films 111 and 112 of the MOS transistor Q12, the MOS transistor Q12 can be formed without adding a new manufacturing step. Consequently, a manufacturing cost can be prevented from being increased.

The MOS transistor Q12 capable of carrying out the body fixation is suitable for use in a circuit portion in which a quick and stable operation is required.

More specifically, floating transistors such as the MOS transistors Q11 and Q13 have a drawback of a floating body effect such as a frequency dependency of a delay time and a timing margin is to be increased, and they are not suitable for a critical path in which a timing is important. On the other hand, a body fixed transistor having no drawback such as the floating body effect, for example, the MOS transistor Q12 is suitable for use in the critical path. Moreover, the body fixed transistor is also suitable for a dynamic circuit or the like.

Since the body contact portion BD is provided, a large provision region is required. In a circuit portion in which the quick and stable operation is not required, the floating transistors such as the MOS transistors Q11 and Q13 are used so that a size of a semiconductor integrated circuit can be reduced.

General structures and manufacturing methods of the low voltage transistor and the high voltage transistor will be described later.

<C-2. Function and Effect>

As in the MOS transistors Q11 to Q13 described above, two kinds of MOS transistors including gate insulating films having different thicknesses and a transistor capable of carrying out body fixation in which a gate insulating film having a comparatively small thickness and a gate insulating film having a comparatively great thickness are provided continuously in a direction of a gate width are constituted on a common SOI substrate. Consequently, it is possible to obtain three kinds of MOS transistors without adding a new manufacturing step.

D. Fourth Embodiment

<D-1. Manufacturing Method>

While the step of forming the thick gate insulating film 110 is required in the method of manufacturing the MOS transistor Q1 described with reference to FIGS. 3 to 7, the step of forming the thick gate insulating film can be omitted if the following method is employed.

A manufacturing method according to a fourth embodiment will be described below with reference to FIGS. 13 to 19.

Figure 13:
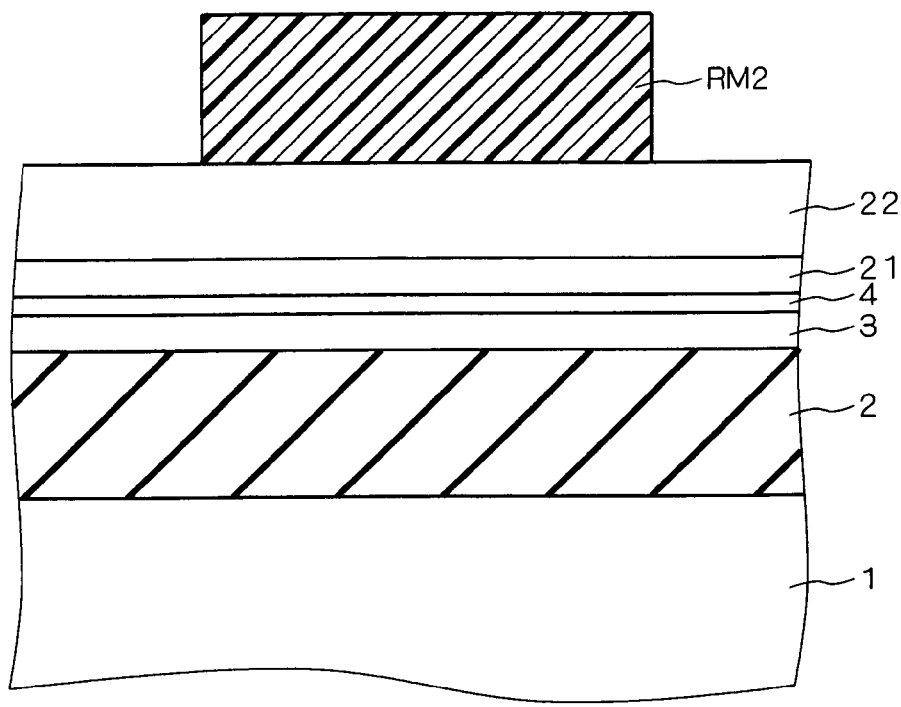

As shown in FIG. 13, first of all, an SOI substrate is prepared and an oxide film 4 is formed on an SOI layer 3 of the SOI substrate. The oxide film 4 is a so-called underlaid oxide film (a pad oxide film) and a thickness thereof is adapted to a thickness of a thick gate insulating film to be formed later.

Next, a polysilicon film 21 is formed on the oxide film 4 by a CVD method and a nitride film 22 is formed on the polysilicon film 21 by the CVD method. Since the oxide film 4, the polysilicon film 21 and the nitride film 22 auxiliary function for forming an isolating oxide film, they are also referred to as auxiliary films in some cases. The polysilicon film 21 is not always required.

Then, a region on the nitride film 22 which corresponds to an MOS transistor formation region is covered by a resist mask RM2.

Figure 14:
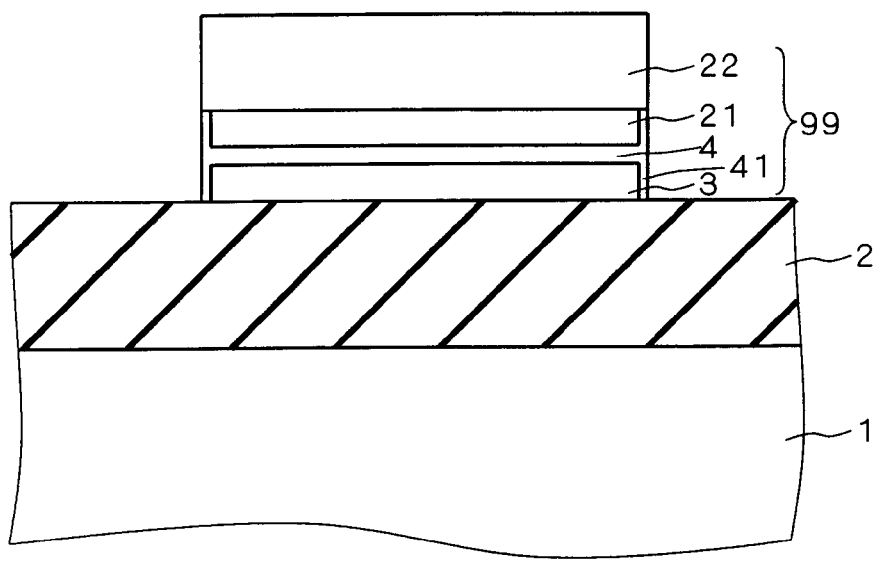

At a step shown in FIG. 14, thereafter, the nitride film 22 and the polysilicon film 21 are selectively removed by dry etching or wet etching using the resist mask RM2 as an etching mask.

Furthermore, the oxide film 4 and the SOI layer 3 which are not covered by the nitride film 22 are removed by using the patterned nitride film 22 as an etching mask. Thus, a stacked film 99 having the nitride film 22, the polysilicon film 21, the oxide film 4 and the SOI layer 3 is left in only the MOS transistor formation region.

Thereafter, a side wall oxide film 41 is formed on exposed side surfaces of the SOI layer 3 and the polysilicon layer 21 by thermal oxidation.

At a step shown in FIG. 15, subsequently, an oxide film ($SiO_2$) HX is formed over a whole surface of the substrate by an HDP (High—Density-Plasma)-CVD method, thereby covering the stacked film 99. Then, the oxide film HX is flattened by a CMP (Chemical Mechanical Polishing) treatment to expose an uppermost surface of the nitride film 22.

The HDP-CVD method uses a plasma having a higher density by one to two digits than that of general plasma CVD, and forms an oxide film while carrying out sputtering and deposition at the same time. Thus, it is possible to obtain an oxide film having high film quality.

At a step shown in FIG. 16, next, a thickness of the oxide film HX is reduced by the wet etching and the nitride film 22 is removed by thermal phosphoric acid, and furthermore, the polysilicon film 21 is removed. Consequently, it is possible to obtain such a structure that the oxide film 4 is left on the SOI layer 3 defined by a perfect trench isolating oxide film FT.

The polysilicon film 21 may be removed by wet etching using a mixed solution of an alkaline solution, for example, a KOH (potassium hydroxide) solution or ammonia and aqueous hydrogen peroxide or by dry etching having a selectivity with an oxide film.

Then, a resist mask RM3 is patterned to cover a predetermined region on the oxide film 4. The region covered by the resist mask RM3 acts as a region for a thick gate insulating film.

Figure 17:
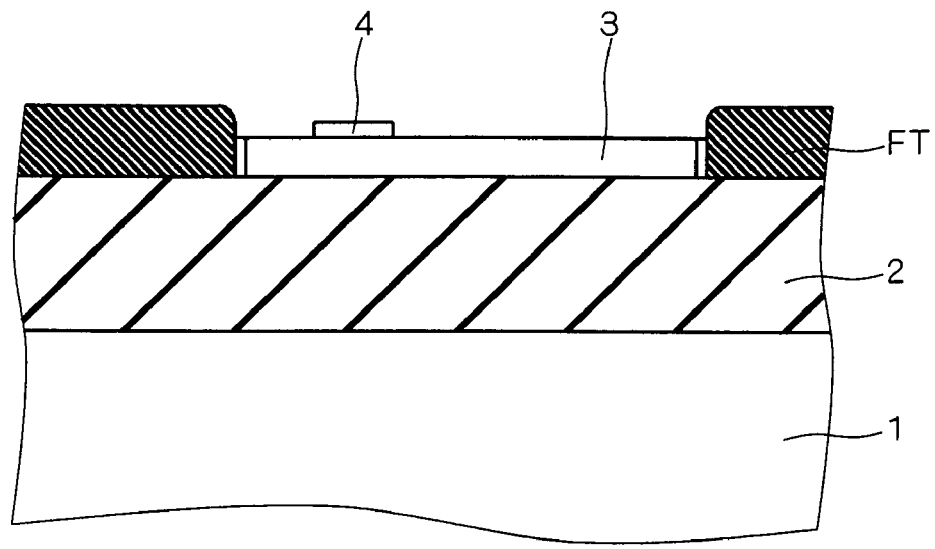

At a step shown in FIG. 17, then, the oxide film 4 in a region which is not covered by the resist mask RM3 is removed by the wet etching.

At a step shown in FIG. 18, subsequently, a thin gate insulating film 11 is formed by gate oxidation and a gate electrode 12 is thereafter patterned. At this time, the gate electrode 12 is formed such that one of ends of the gate electrode 12 in a direction of a gate width is engaged with the oxide film 4.

By the above-mentioned steps, it is possible to obtain such a structure that the gate insulating film 11 having a comparatively small thickness and the gate insulating film 4 having a comparatively great thickness are provided continuously in the direction of the gate width. Thus, the gate electrode 12 is provided on the SOI layer 3 with the gate insulating films 11 and 4 interposed therebetween.

Moreover, a body contact portion BD is provided in a surface of the SOI layer 3 on the outside of the end of the gate electrode 12 on the side on which the gate insulating film 4 is to be provided.

Figure 18:
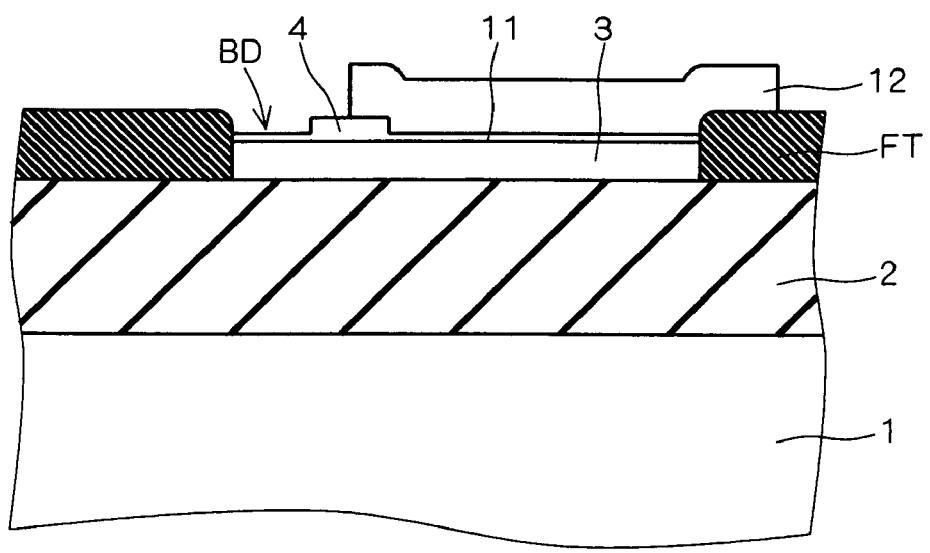
Figure 19:
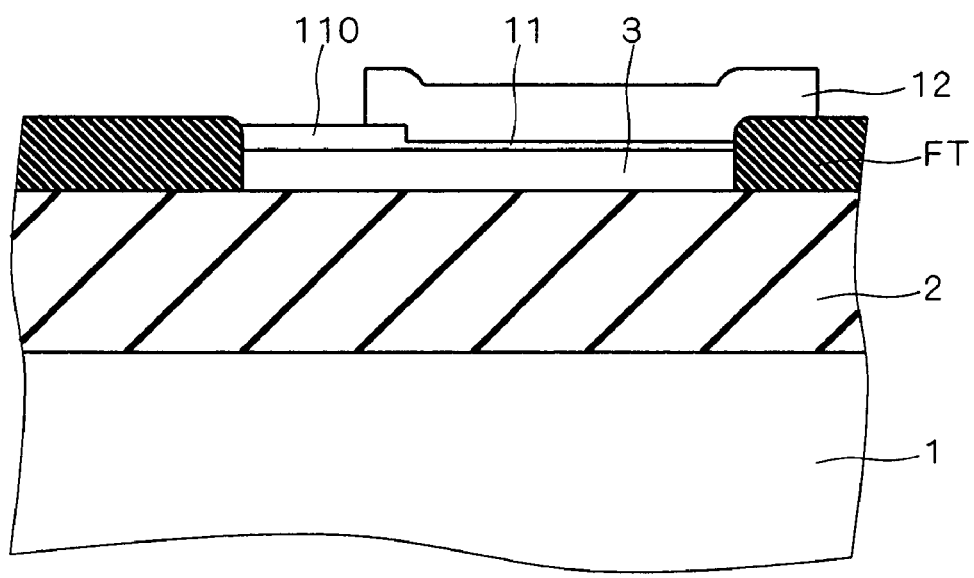

While FIG. 18 shows such a structure that the thin gate insulating film 11 is formed on the body contact portion BD, it is also possible to employ such a structure that the gate insulating film 4 is formed on the body contact portion BD as shown in FIG. 19. By changing the patterning of the resist mask RM3 shown in FIG. 16, it is possible to optionally set a region in which the gate insulating film 4 is to be left.

<D-2. Function and Effect>

According to the manufacturing method of the fourth embodiment described above, the underlaid oxide film is also used as the thick gate insulating film. Therefore, a process for forming the thick gate insulating film can be omitted and the process can be thereby simplified so that a manufacturing cost can be prevented from being increased.

D-3. APPLIED EXAMPLE

By application of the manufacturing method according to the fourth embodiment, it is possible to form, on a common SOI substrate in a simplified manufacturing process, four kinds of MOS transistors including two kinds of MOS transistors provided with gate insulating films having different thicknesses and two kinds of MOS transistors in which a gate insulating film having a comparatively small thickness and a gate insulating film having a comparatively great thickness are provided continuously in the direction of the gate width and body fixation can be carried out. Thus, a manufacturing cost can be prevented from being increased.

The method will be described below with reference to FIGS. 20 to 26 to be sectional views showing the manufacturing process in order.

Figure 20:
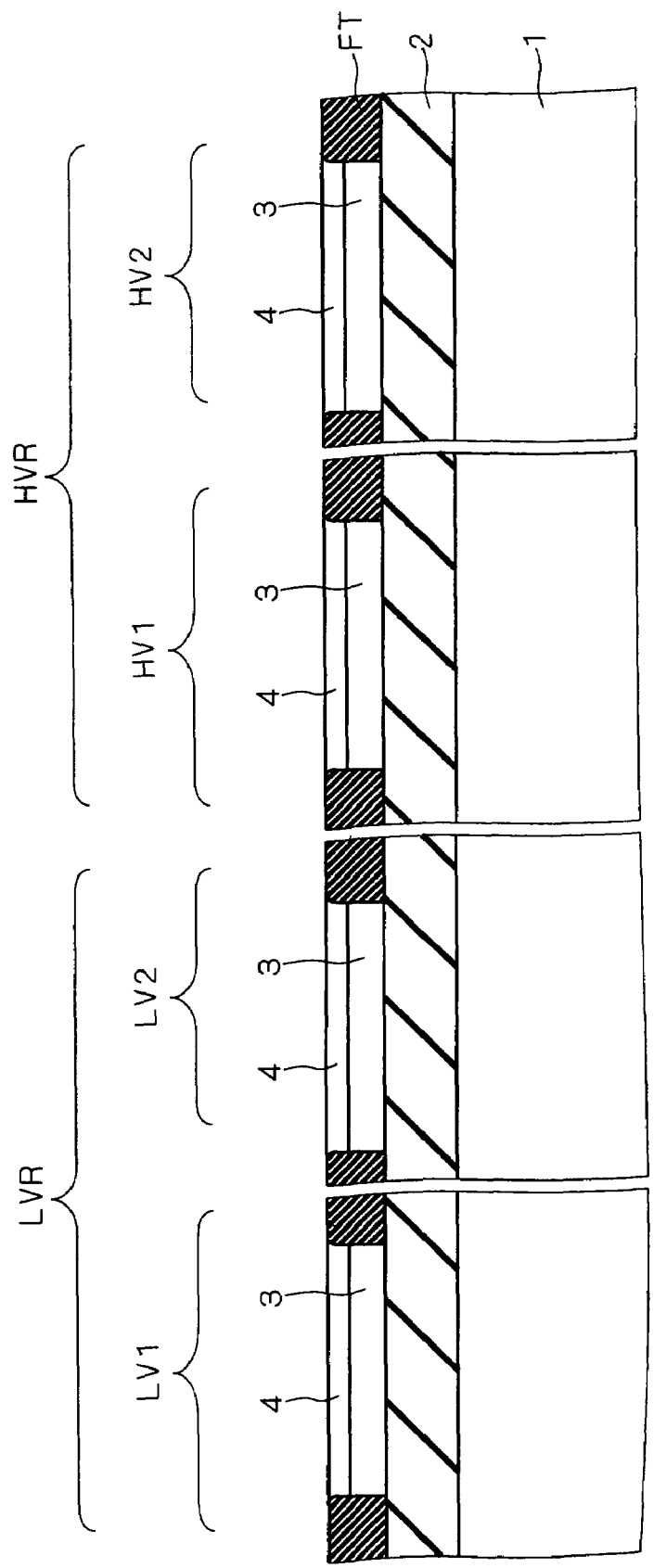
FIGS. 20 to 26 are views illustrating an applied example of a manufacturing method according to the fourth embodiment of the present invention.

First of all, the steps described with reference to FIGS. 13 to 16 are carried out to obtain such a structure that an oxide film 4 is formed on a plurality of regions of an SOI layer 3 defined by a perfect trench isolating oxide film FT as shown in FIG. 20. The oxide film 4 has a thickness of 7 to 30 nm.

The regions of the SOI layer 3 are classified into regions LV1, LV2, HV1 and HV2. In the regions LV1 and LV2, a low voltage transistor having a gate voltage of 0.5 to 2.0 V is to be formed, for example. The regions LV1 and LV2 are formed in a low voltage region LVR.

In the regions HV1 and HV2, moreover, a high voltage transistor having a gate voltage of 1.5 to 5.0 V is to be formed, for example. The regions HV1 and HV2 are formed in a high voltage region HVR.

Figure 21:
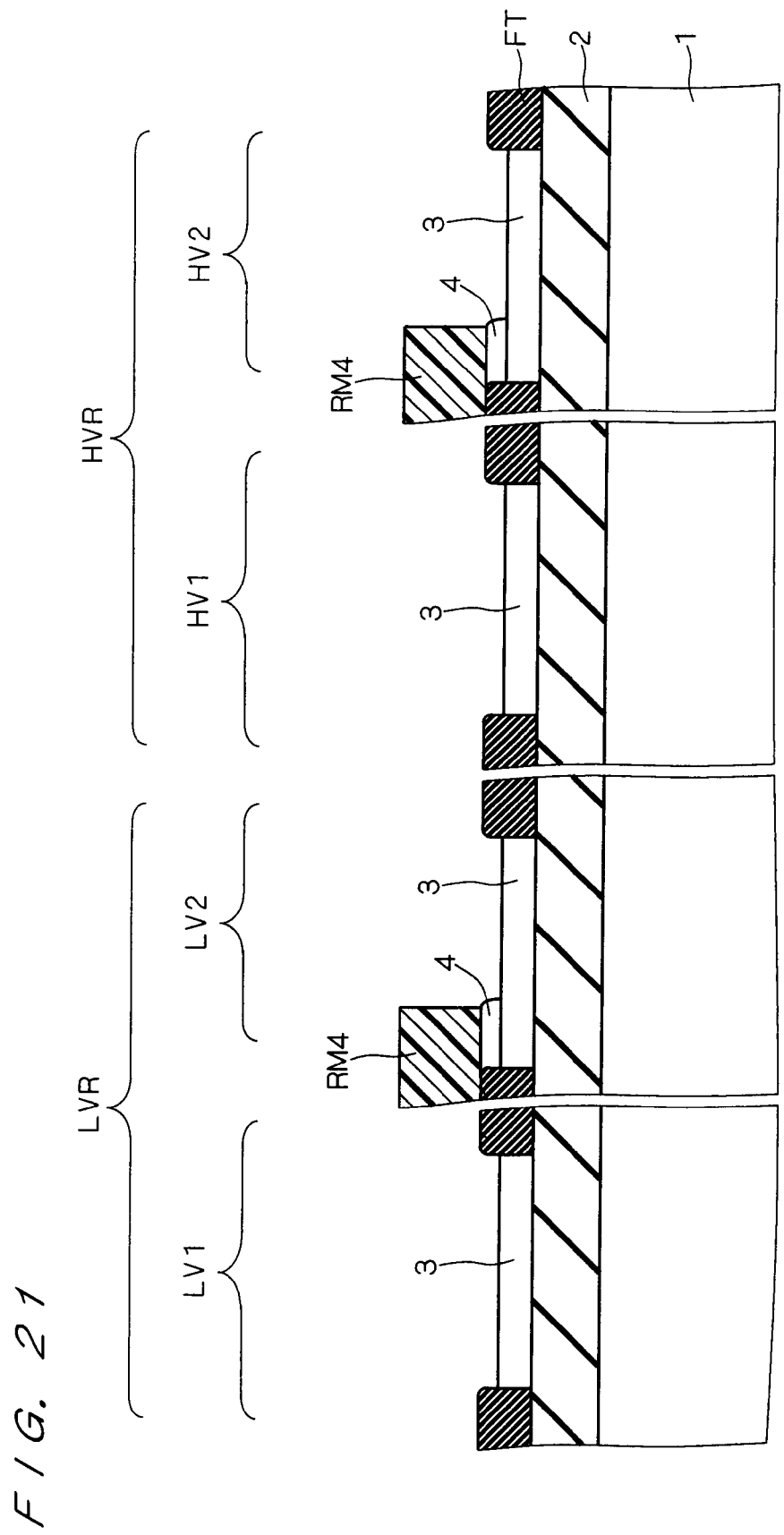

At a step shown in FIG. 21, next, a resist mask RM4 is patterned to cover a predetermined region on the oxide film 4 in the regions LV2 and HV2. The region covered by the resist mask RM4 acts as a thick gate insulating film.

Then, the oxide film 4 in a region which is not covered by the resist mask RM4 is removed by wet etching using hydrofluoric acid (HF) or the like.

Subsequently, the resist mask RM4 is removed and a gate insulating film 11B is thereafter formed on the exposed SOI layer 3 by gate oxidation at a step shown in FIG. 22. The gate insulating film 11B has a thickness of 3 to 10 nm.

Figure 23:
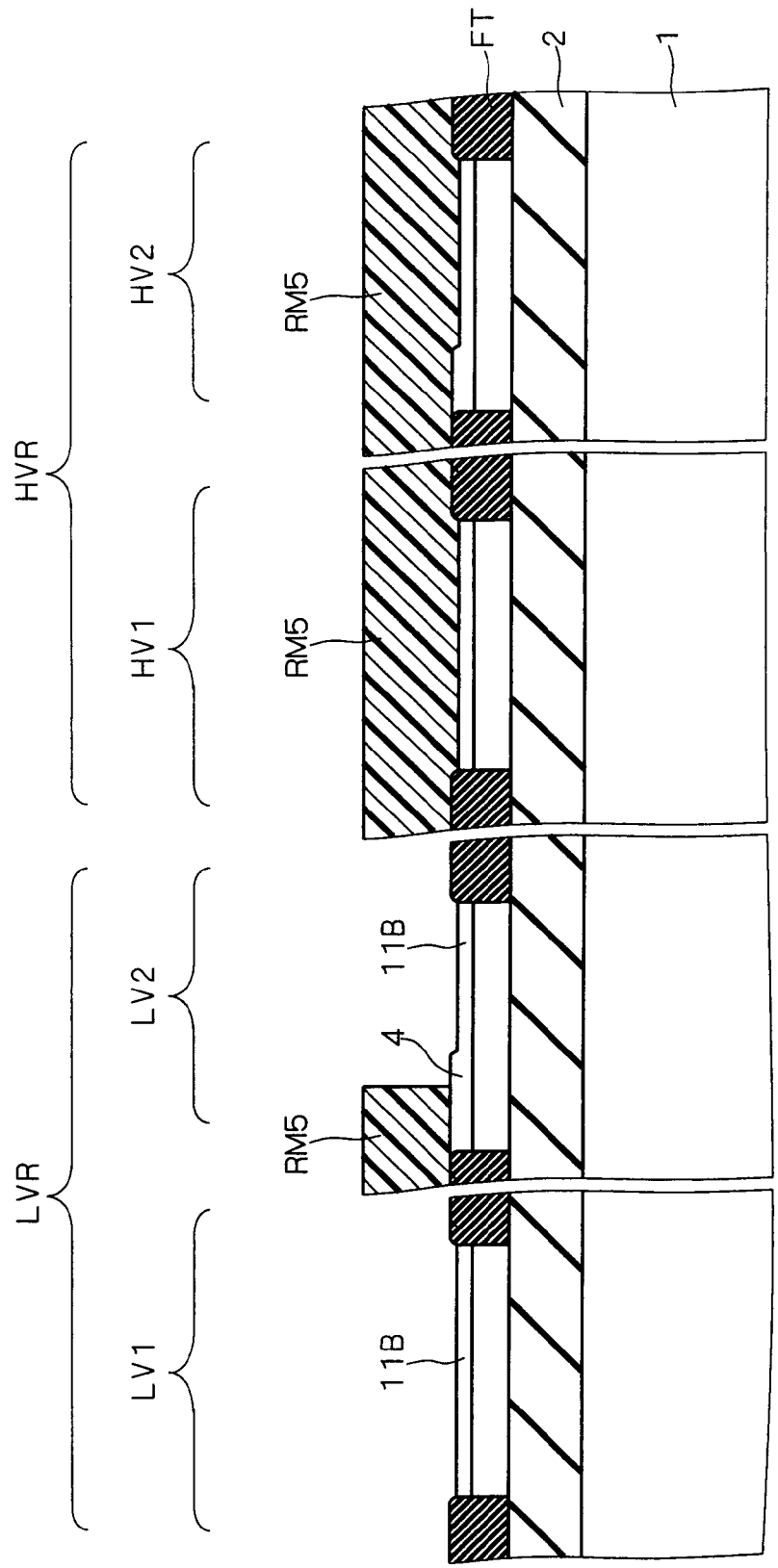

At a step shown in FIG. 23, next, a resist mask RM5 is patterned to cover a whole region of the high voltage region HVR and a predetermined region on the oxide film 4 in the region LV2. The resist mask RM5 is also formed on the oxide film 4 in the region LV2 in order to leave only the oxide film 4 in a portion covered by the resist mask RM5. At the step shown in FIG. 21, the oxide film 4 is left in a larger region than a region to be required finally. At the step shown in FIG. 23, the oxide film 4 is reduced to the region to be required finally. By such a structure, an area of the oxide film 4 to be required finally in the region LV2 can be prevented from being reduced due to a superposition shift of the resist mask RM5.

Figure 24:
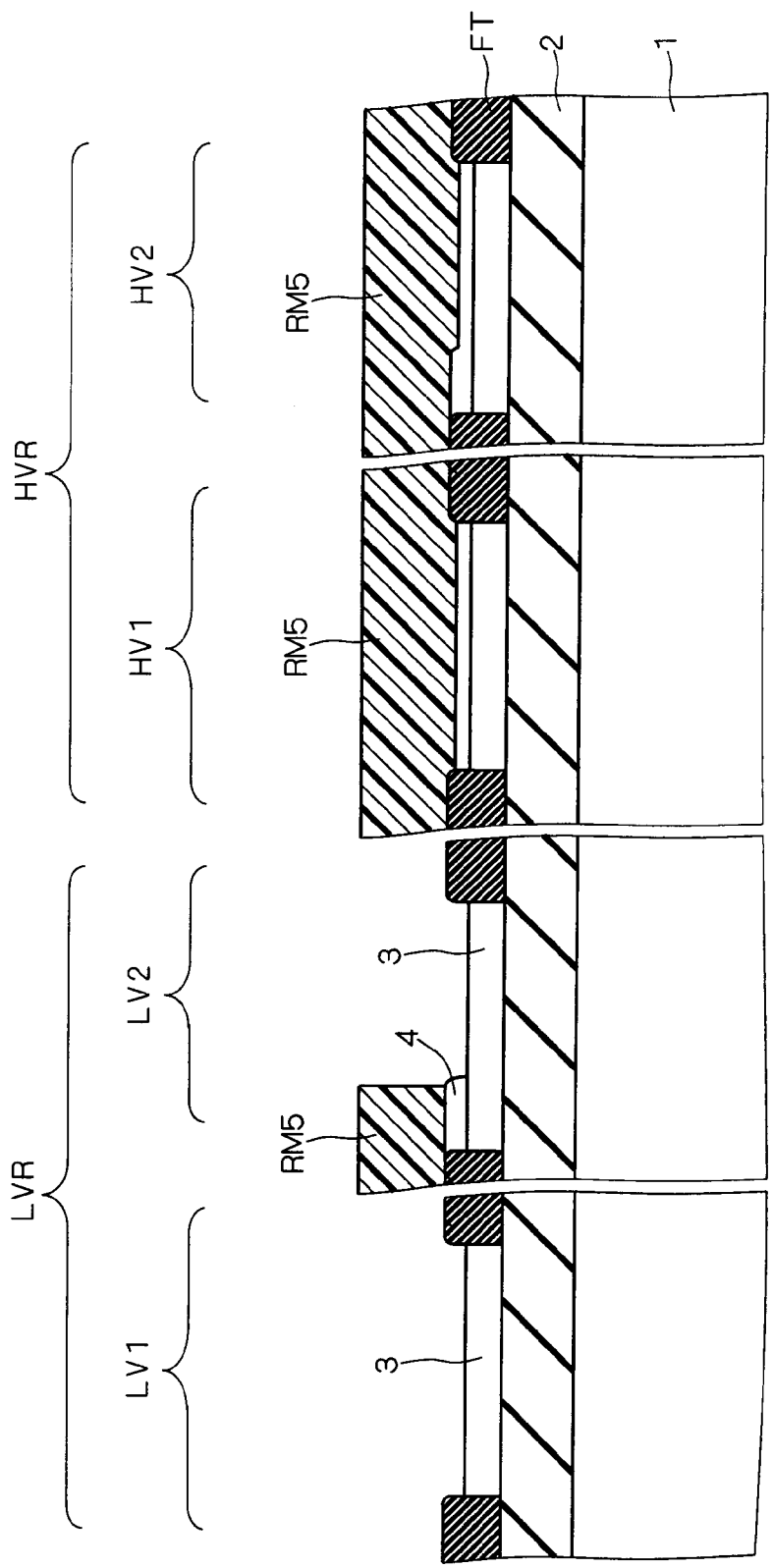

At a step shown in FIG. 24, then, the oxide film 4 in the region which is not covered by the resist mask RM5 is removed by the wet etching using hydrofluoric acid (HF) or the like.

Figure 25:
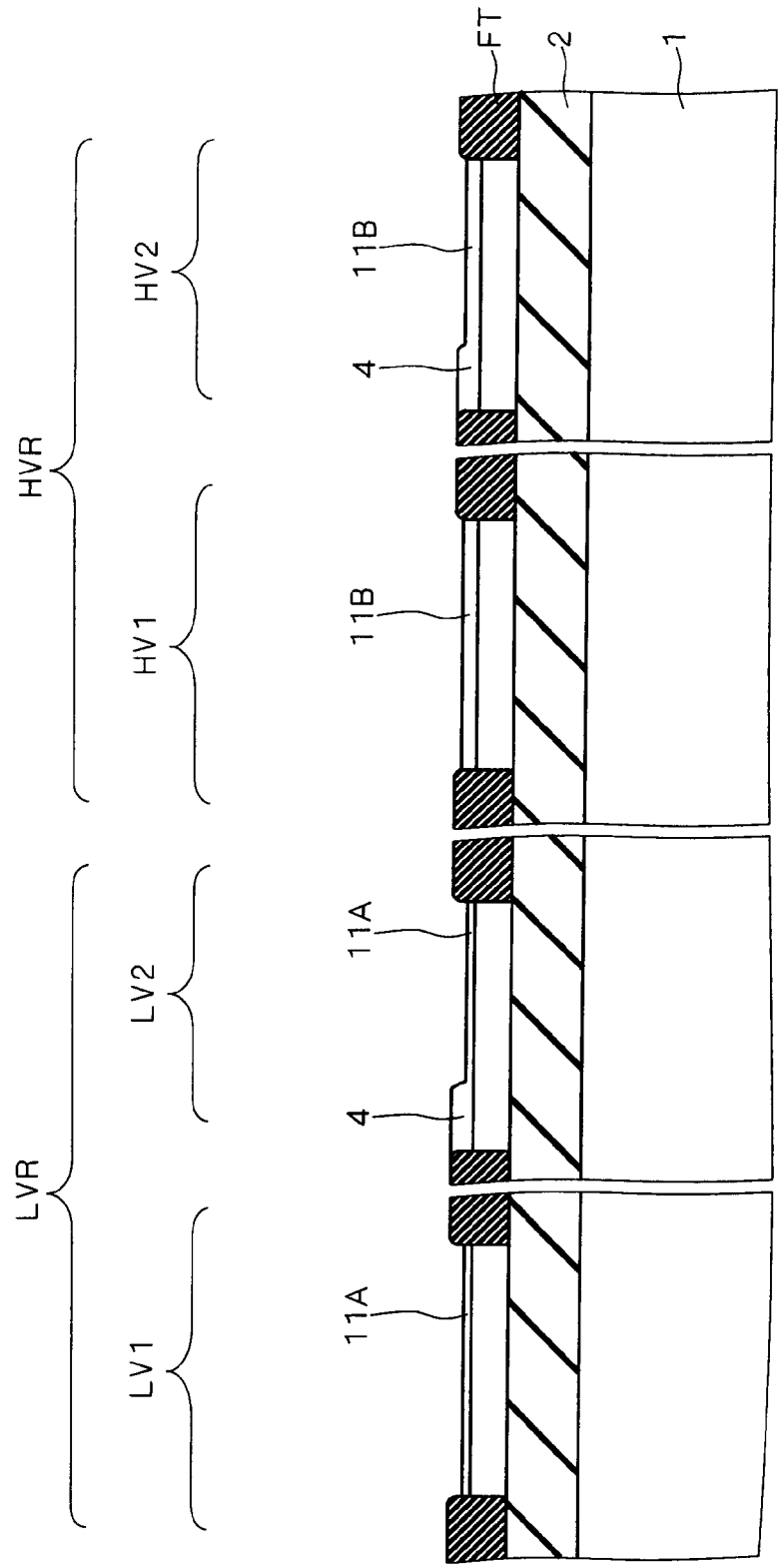

Subsequently, the resist mask RM5 is removed and a gate insulating film 11A is thereafter formed on the exposed SOI layer 3 by gate oxidation at a step shown in FIG. 25. The gate insulating film 11A has a thickness of 1 to 5 nm.

Figure 26:
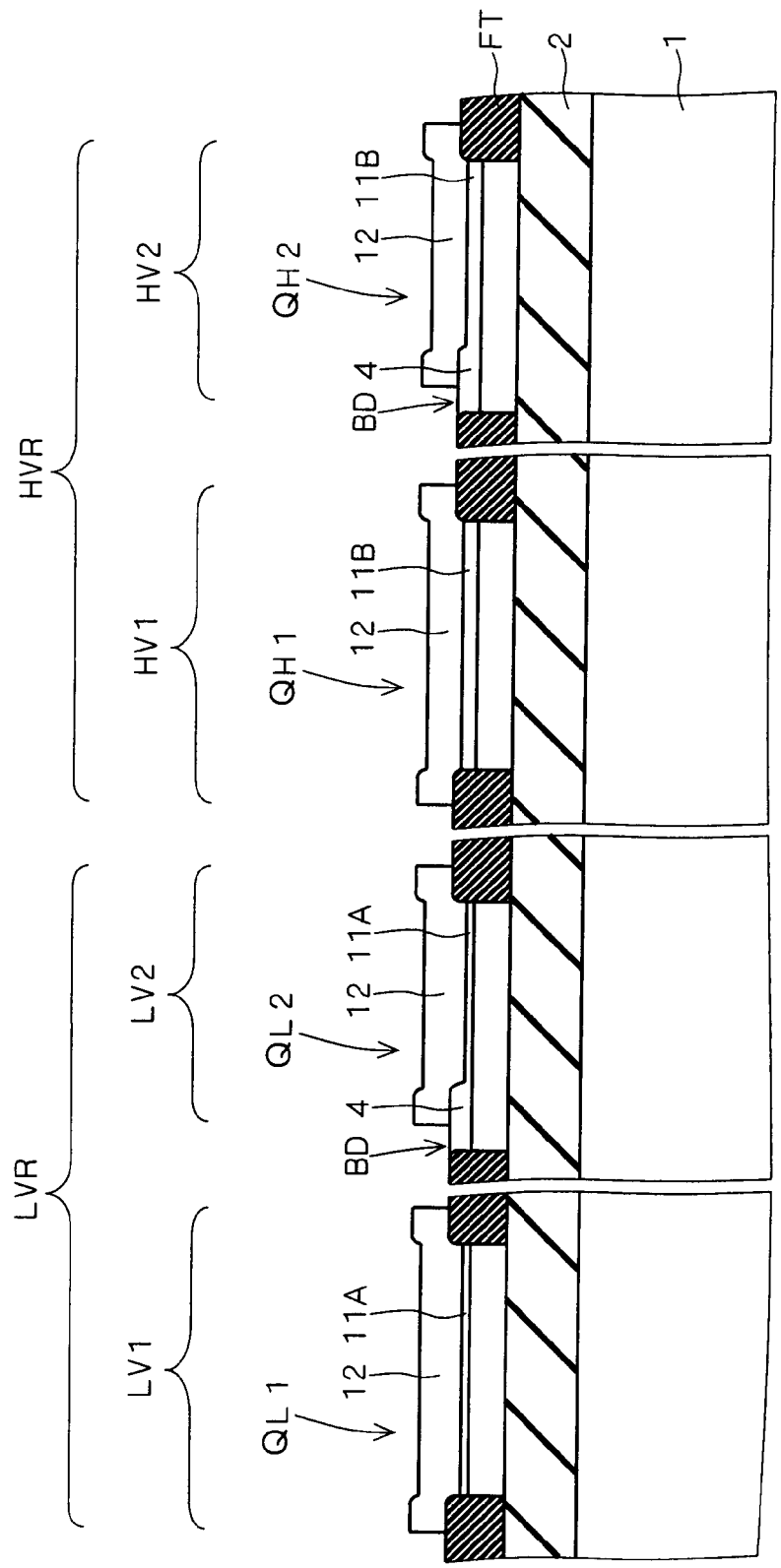

At a step shown in FIG. 26, next, a gate electrode 12 is patterned in each of the regions LV1, LV2, HV1 and HV2. At this time, in the regions LV2 and HV2, the gate electrode 12 is formed such that one of ends of the gate electrode 12 in a direction of a gate width is engaged with the oxide film 4.

By the above-mentioned steps, floating transistors QL1 and QH1 having gate insulating films 11A and 11B are obtained in the regions LV1 and HV1, a transistor QL2 in which the gate insulating film 11A having the smallest thickness and the gate insulating film 4 having the greatest thickness are provided continuously in a direction of a gate width and body fixation can be carried out is obtained in the region LV2, and a transistor QH2 in which the gate insulating film 11B having a middle thickness and the gate insulating film 4 having the greatest thickness are provided continuously in the direction of the gate width and the body fixation can be carried out is obtained in the region HV2. By the simplified manufacturing process, thus, it is possible to obtain four kinds of MOS transistors in total.

A body contact portion BD is provided in a surface of the SOI layer 3 on the outside of the end of the gate electrode 12 on the side on which the gate insulating film 4 of the transistors QL2 and QH2 is to be provided.

Figure 22:
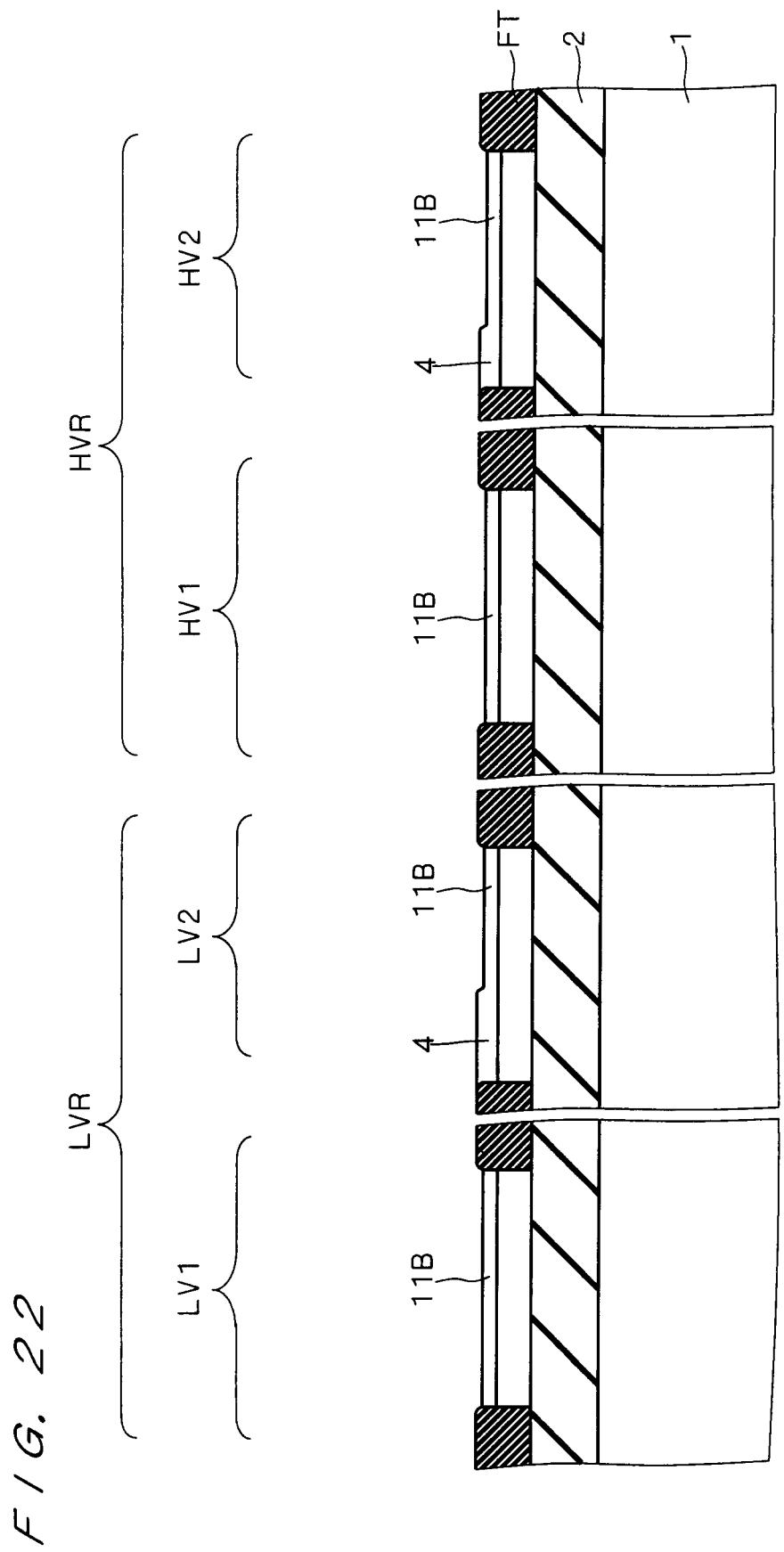

In the case in which the oxide film 4 has a thickness of 7.2 nm, for example, and the gate insulating film 11B having a thickness of 3.5 nm is formed by gate oxidation at the step shown in FIG. 22, the thickness of the oxide film 4 is increased by approximately 0.3 nm through the gate oxidation and is not greatly changed.

E. Fifth Embodiment

While the thick gate insulating film is formed over the whole surface of the SOI layer in the active region and the region in which the thick gate insulating film is to be left is then defined by the mask pattern in the first embodiment described with reference to FIGS. 1 and 2 and the second embodiment described with reference to FIGS. 8 to 11, a thick gate insulating film can also be obtained by a manufacturing method which will be described below as a fifth embodiment.

<E-1. Manufacturing Method>

The manufacturing method according to the fifth embodiment will be described with reference to FIGS. 27 to 33 to be sectional views showing a manufacturing process in order.

Figure 27:
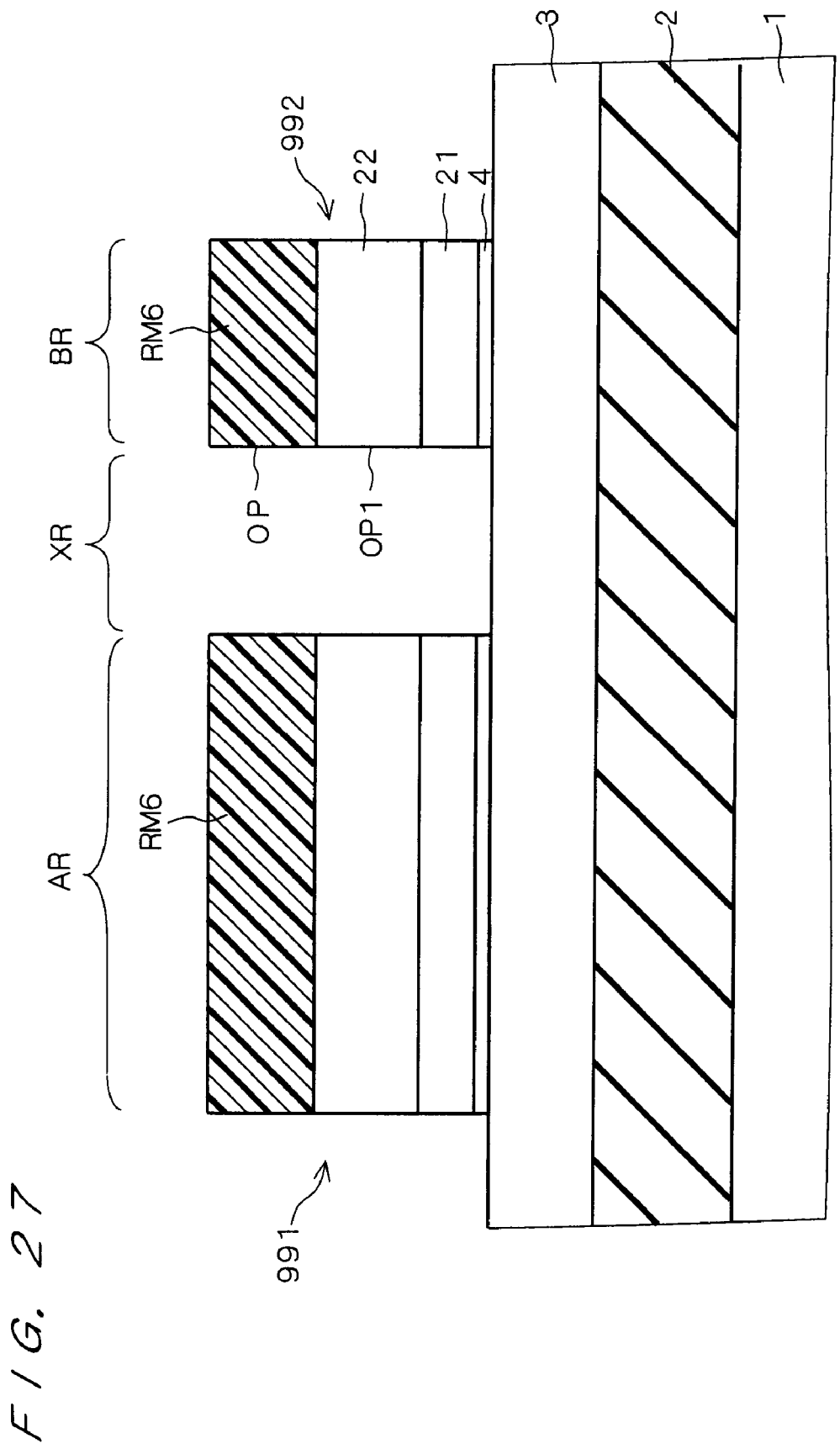
FIGS. 27 to 32 are views illustrating a process for manufacturing an MOS transistor according to a fifth embodiment of the present invention.

As shown in FIG. 27, first of all, an SOI substrate is prepared and an oxide film 4 is formed on an SOI layer 3 of the SOI substrate. The oxide film 4 is a so-called underlaid oxide film (a pad oxide film).

Next, a polysilicon film 21 is formed on the oxide film 4 by a CVD method and a nitride film 22 is formed on the polysilicon film 21 by the CVD method. Since the oxide film 4, the polysilicon film 21 and the nitride film 22 auxiliary function for forming an isolating oxide film, they are also referred to as auxiliary films in some cases. The polysilicon film 21 is not always required.

Then, an active region AR of an MOS transistor and a region on the nitride film 22 corresponding to a region BR in which a body contact portion is to be formed are covered by a resist mask RM6.

At this time, the resist mask RM6 is patterned such that a region XR in which a thick gate insulating film is to be formed acts as an opening portion OP.

Thereafter, the nitride film 22 and the polysilicon film 21 are selectively removed by dry etching or wet etching using the resist mask RM6 as an etching mask.

Furthermore, the oxide film 4 and the SOI layer 3 which are not covered by the nitride film 22 are removed by using the patterned nitride film 22 as an etching mask, thereby leaving stacked films 991 and 992 having the nitride film 22, the polysilicon film 21 and the oxide film 4 in only the active region AR of the MOS transistor and the body contact portion formation region BR. The region XR acts as a lower OP1 and the SOI layer 3 is exposed to a bottom portion thereof.

A width W of the stacked film 991 corresponds to a gate width of the MOS transistor to be formed later.

Figure 28:
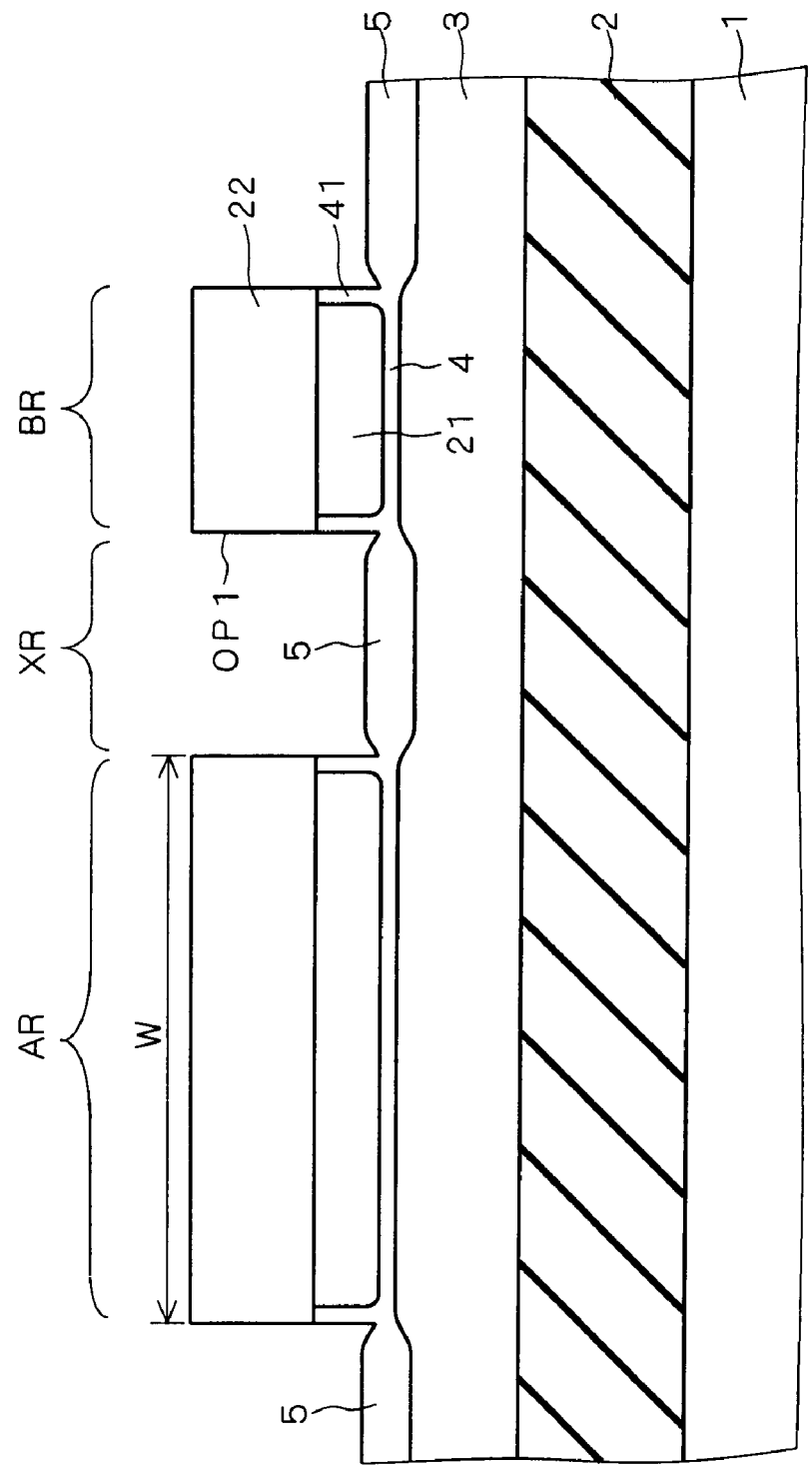

Next, the resist mask RM6 is removed and thermal oxidation is then carried out to form an oxide film 5 having a thickness of 10 to 40 nm on a surface of the SOI layer 3 including a bottom surface of the opening portion OP1 at a step shown in FIG. 28. At this time, an oxide film 41 is also formed on an exposed side wall of the polysilicon film 21 (side wall oxidation).

At a step shown in FIG. 29, subsequently, a resist mask RM7 is formed to cover only the active region AR of the MOS transistor, the body contact portion formation region BR and the region XR in which the thick gate insulating film is to be formed. The resist mask RM7 has an opening pattern for defining a region in which a perfect trench isolating oxide film is to be formed later, and the perfect trench isolating oxide film is formed in a region which is not covered by the resist mask RM7.

The oxide film 5 and the SOI layer 3 in the region which is not covered by the resist mask RM7 are removed by using the resist mask RM7 as an etching mask. Consequently, a stacked film 993 having the nitride film 22, the polysilicon film 21, the oxide film 4 and the SOI layer 3 is formed.

Figure 29:
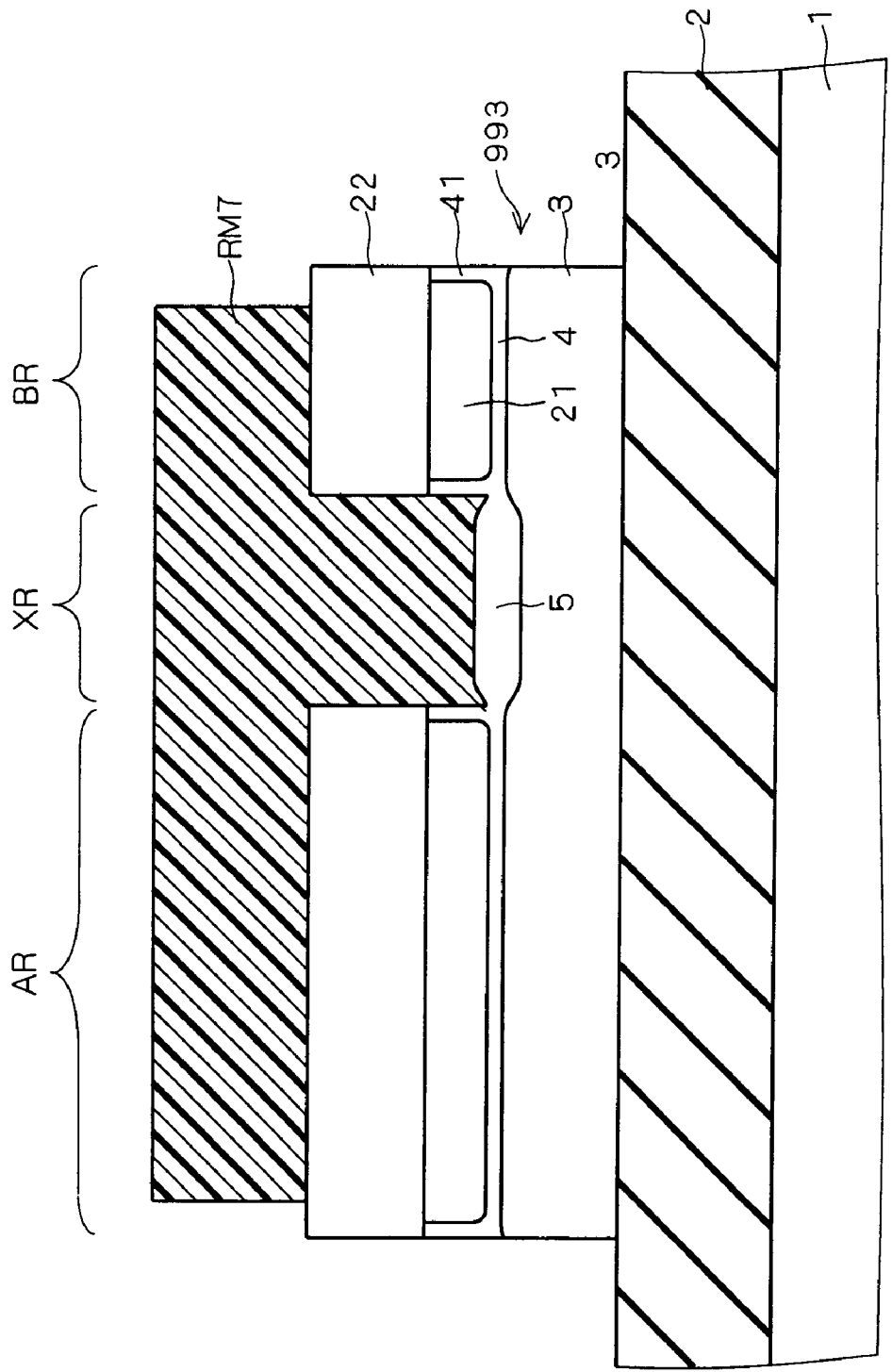

In FIG. 29, the resist mask RM7 does not completely cover the nitride film 22 in consideration of the fact that the resist mask RM7 causes a superposition shift in an actual process. Even if the resist mask RM7 thus causes the superposition shift, it functions as the etching mask because the nitride film 22 is present. A gate width of the MOS transistor is determined by a width of the nitride film 22 in the region BR so that the resist mask RM7 is not influenced by the superposition shift.

Figure 30:
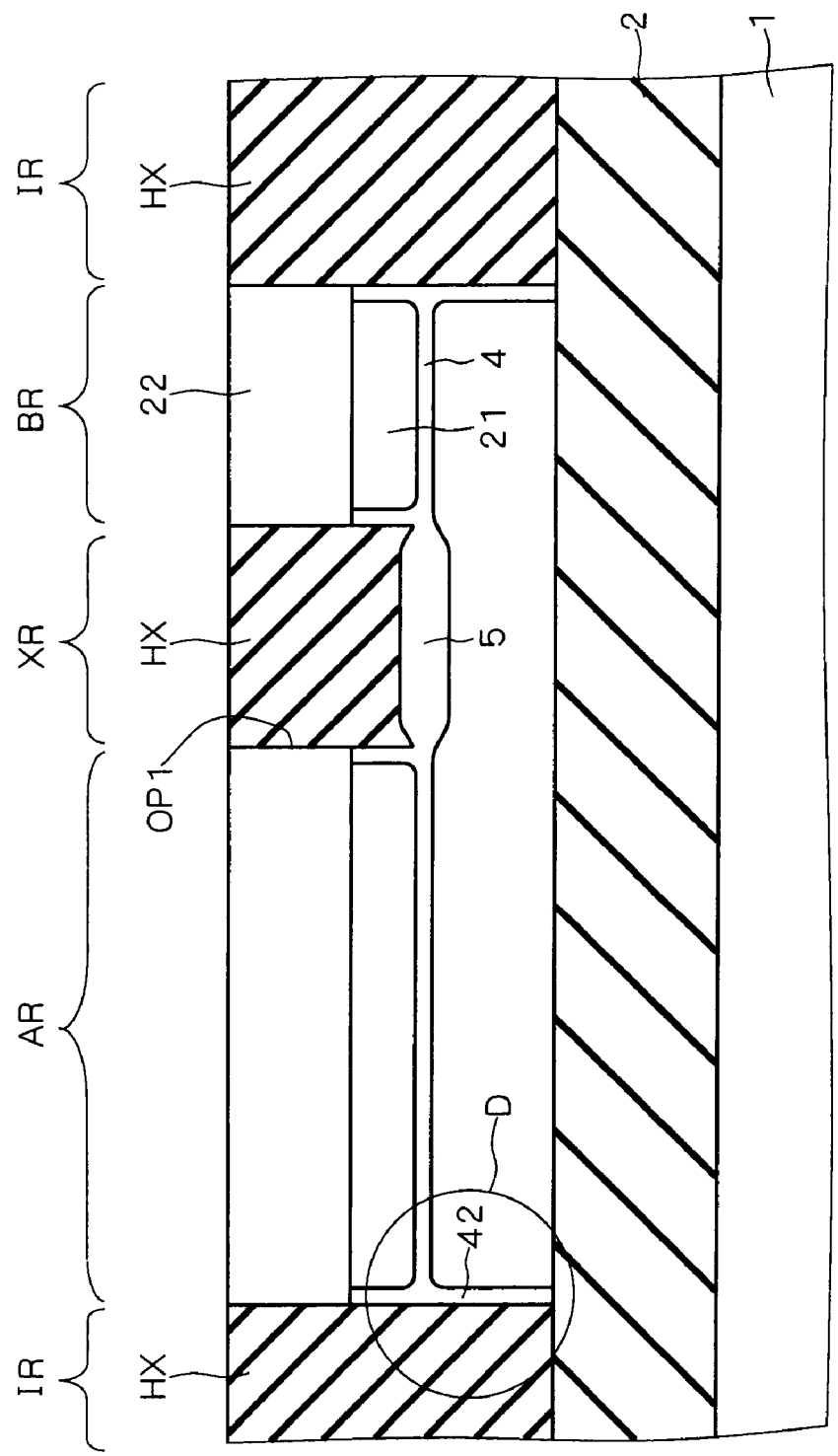

Next, the resist mask RM7 is removed and thermal oxidation is then carried out at a step shown in FIG. 30, thereby forming an oxide film 42 having a thickness of 3 to 30 nm on an exposed side wall of the SOI layer 3 (side wall oxidation). Thereafter, an oxide film ($SiO_2$) HX is formed over the whole surface of the substrate by an HDP-CVD method to cover the stacked film 993, and the oxide film HX is then flattened by a CMP treatment to expose an uppermost surface of the nitride film 22. Consequently, the oxide film HX is filled in a region IR in which a perfect trench isolating oxide film is to be formed later and the opening portion OP1 of the region XR.

Figure 31:
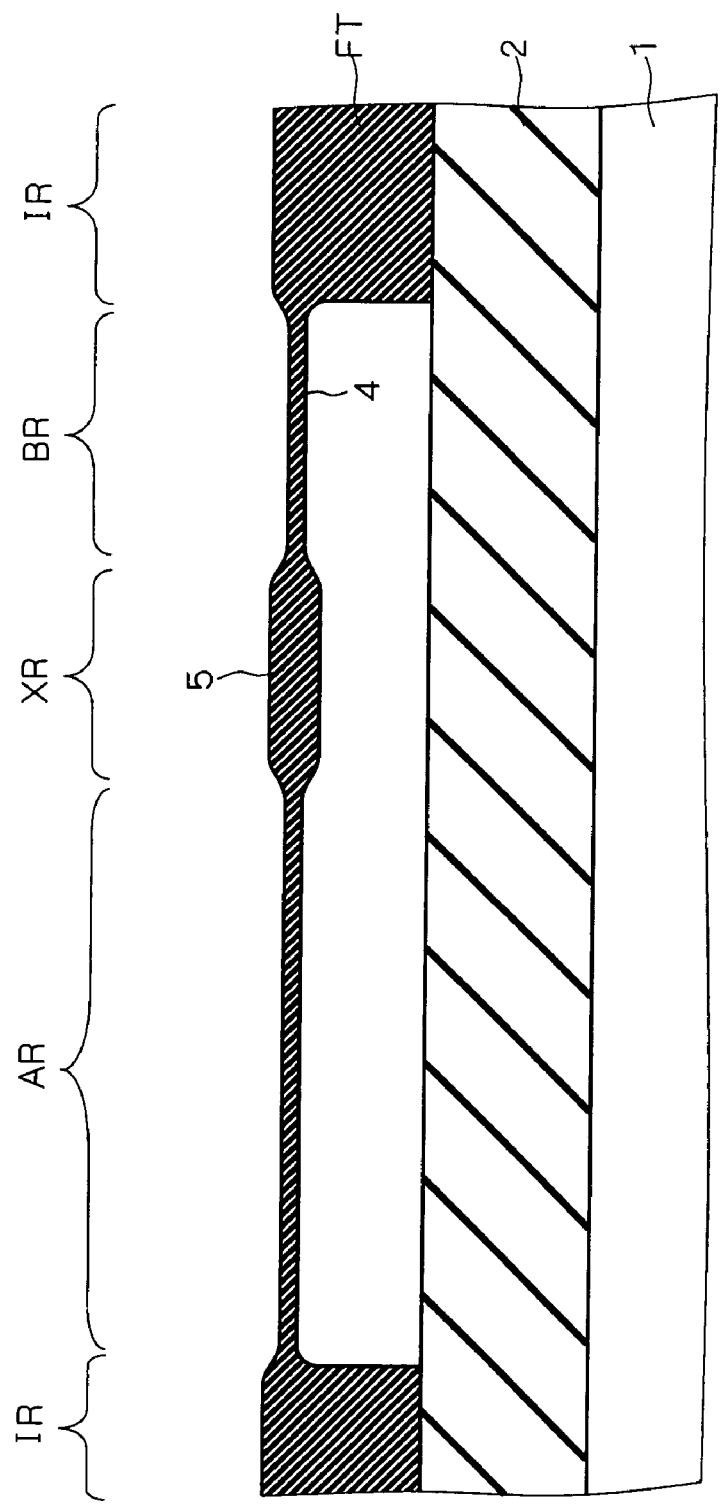

At a step shown in FIG. 31, next, a thickness of the oxide film HX is reduced by the wet etching and the nitride film 22 is removed by thermal phosphoric acid, and furthermore, the polysilicon film 21 is removed. Consequently, it is possible to obtain such a structure that the oxide films 4 and 5 are left on the SOI layer 3 defined by a perfect trench isolating oxide film FT.

The polysilicon film 21 may be removed by wet etching using a mixed solution of an alkaline solution, for example, a KOH (potassium hydroxide) solution or ammonia and aqueous hydrogen peroxide or by dry etching having a selectivity with an oxide film.

Figure 32:
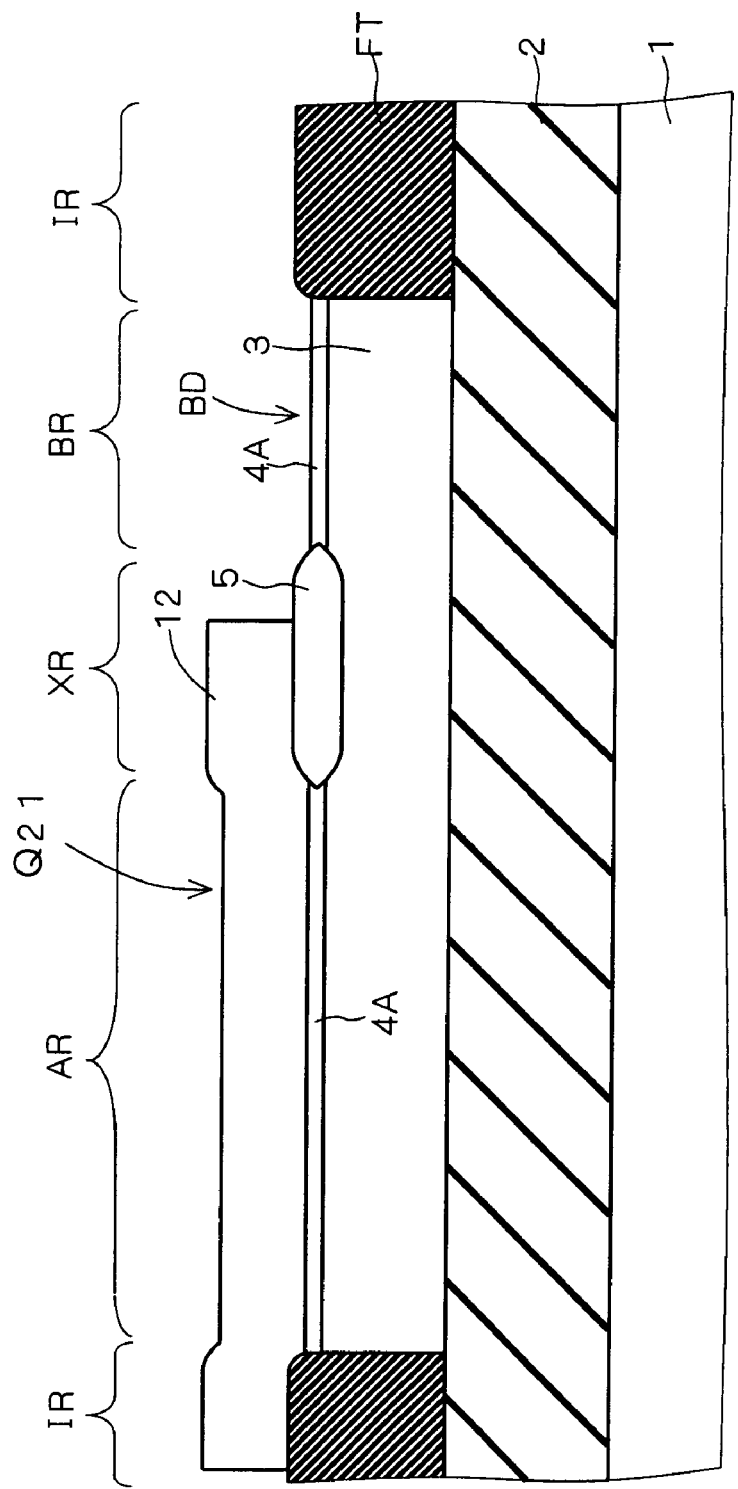

At a step shown in FIG. 32, then, the underlaid oxide film 4 is removed and an oxide film 4A is thereafter formed in the active region AR of the MOS transistor and the body contact portion formation region BR. The oxide film 4A acts as a gate insulating film and a thickness thereof is preferably selected within a range of 1 to 10 nm, for example. Subsequently, a gate electrode 12 is patterned on the oxide film 4A in the active region AR. At this time, the gate electrode 12 is patterned such that one of ends in a direction of the gate width is engaged with the oxide film 5 and the other end is engaged with the perfect trench isolating oxide film FT, and a portion to be formed on the oxide film 4A in the region BR functions as a substantial gate. The oxide film 5 can also be referred to as a gate insulating film and a continuous gate insulating film is constituted by the oxide films 4A and 5. Then, a source-drain region is formed by an implantation of a source-drain impurity, and furthermore, the body contact portion BD is formed by an impurity implantation into a surface of the SOI layer 3 on the outside of the end of the gate electrode 12 on the side on which the gate insulating film 5 is to be provided. Thus, an MOS transistor Q21 can be obtained.

While the example in which the oxide film 42 is formed on the side wall of the SOI layer 3 has been described above with reference to FIG. 30, FIG. 33 shows a detailed structure of a region D in FIG. 30.

Figure 33:
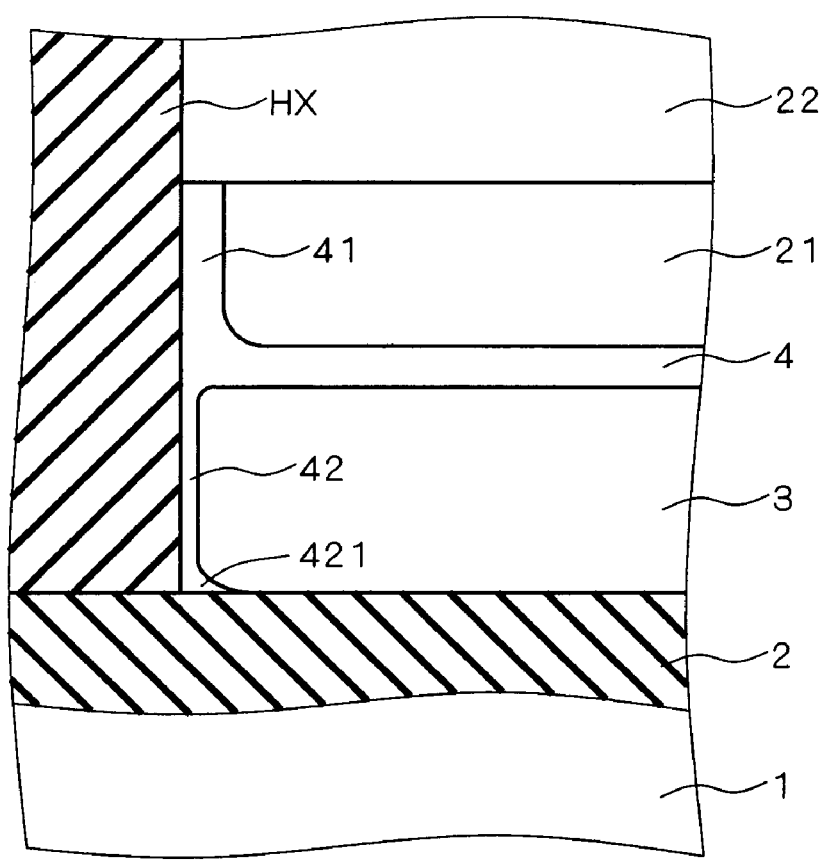
FIG. 33 is a partial detailed view showing the process for manufacturing an MOS transistor according to the fifth embodiment of the present invention.

As shown in FIG. 33, in some cases in which the oxide film 42 is formed on the side wall of the SOI layer 3 as shown in FIG. 33, an oxide film 421 to enter between a bottom surface of the SOI layer 3 and a buried oxide film 2 is formed. When the oxide film 421 is formed, a mechanical stress is applied to the SOI layer 3 so that a current leakage is caused.

Figure 34:
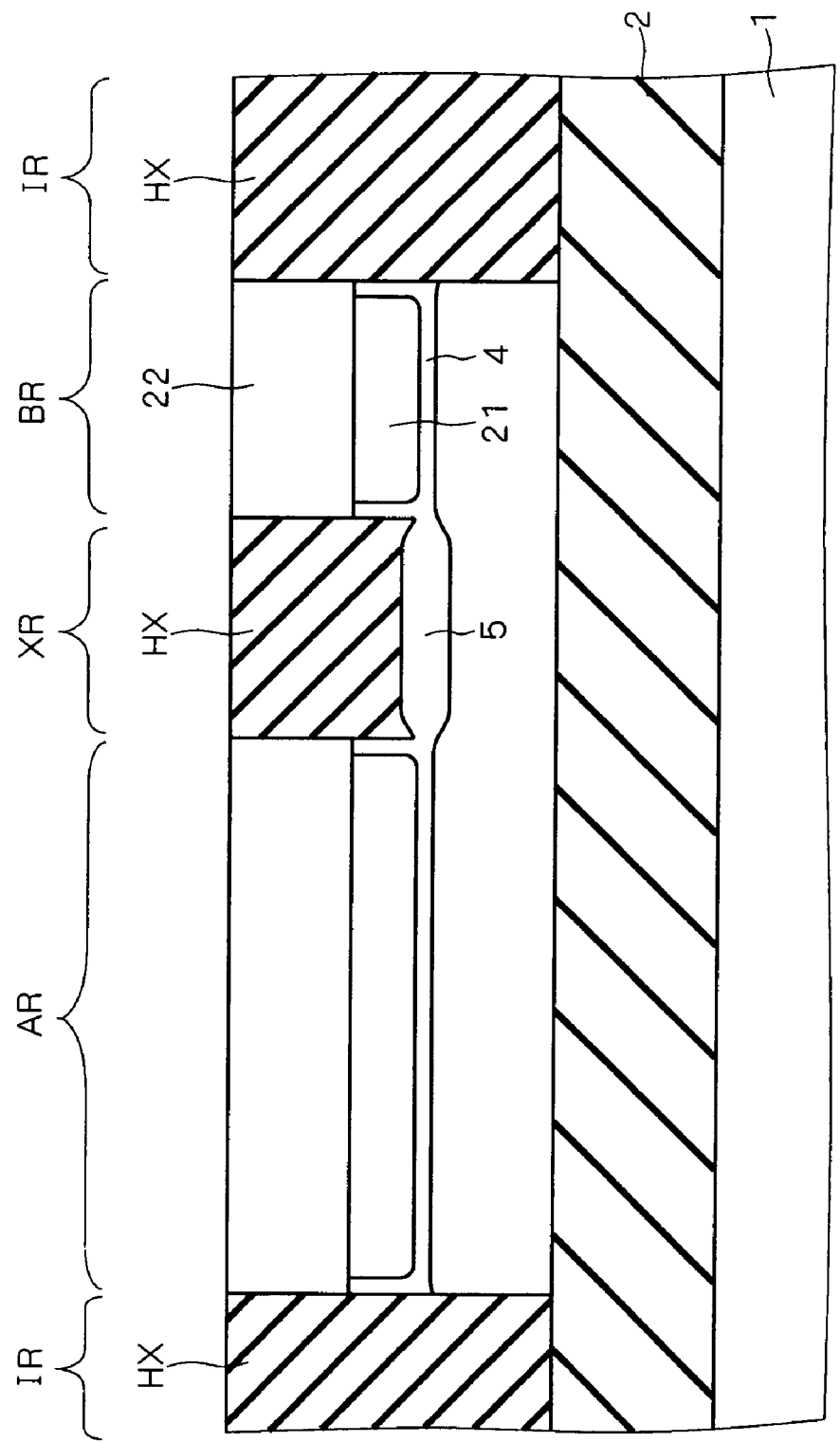
FIG. 34 is a view showing a step at which a side wall of an SOI layer is not oxidized in the process for manufacturing an MOS transistor according to the fifth embodiment of the present invention.

After the step shown in FIG. 29, the resist mask RM7 is removed and the thermal oxidation is not carried out, and the oxide film (SiO$_2$) HX is then formed over the whole surface of the substrate by the HDP-CVD method to cover the stacked film 993. Thus, it is possible to obtain such a structure that the side wall of the SOI layer 3 is not oxidized as shown in FIG. 34.

In some cases in which the side wall of the SOI layer 3 is damaged by etching for forming the perfect trench isolating oxide film shown in FIG. 29, the current leakage is caused. In those cases, it is desirable that the side wall oxidation should be carried out to prevent the current leakage.

Accordingly, it is the most desirable to determine whether or not the side wall oxidation of the SOI layer 3 should be carried out in consideration of a trade-off relationship between the current leakage caused by the oxide film 42 formed on the side wall of the SOI layer 3 and the current leakage caused by the etching damage of the side wall of the SOI layer 3.

<E-1-1. First Variant>

Figure 35:
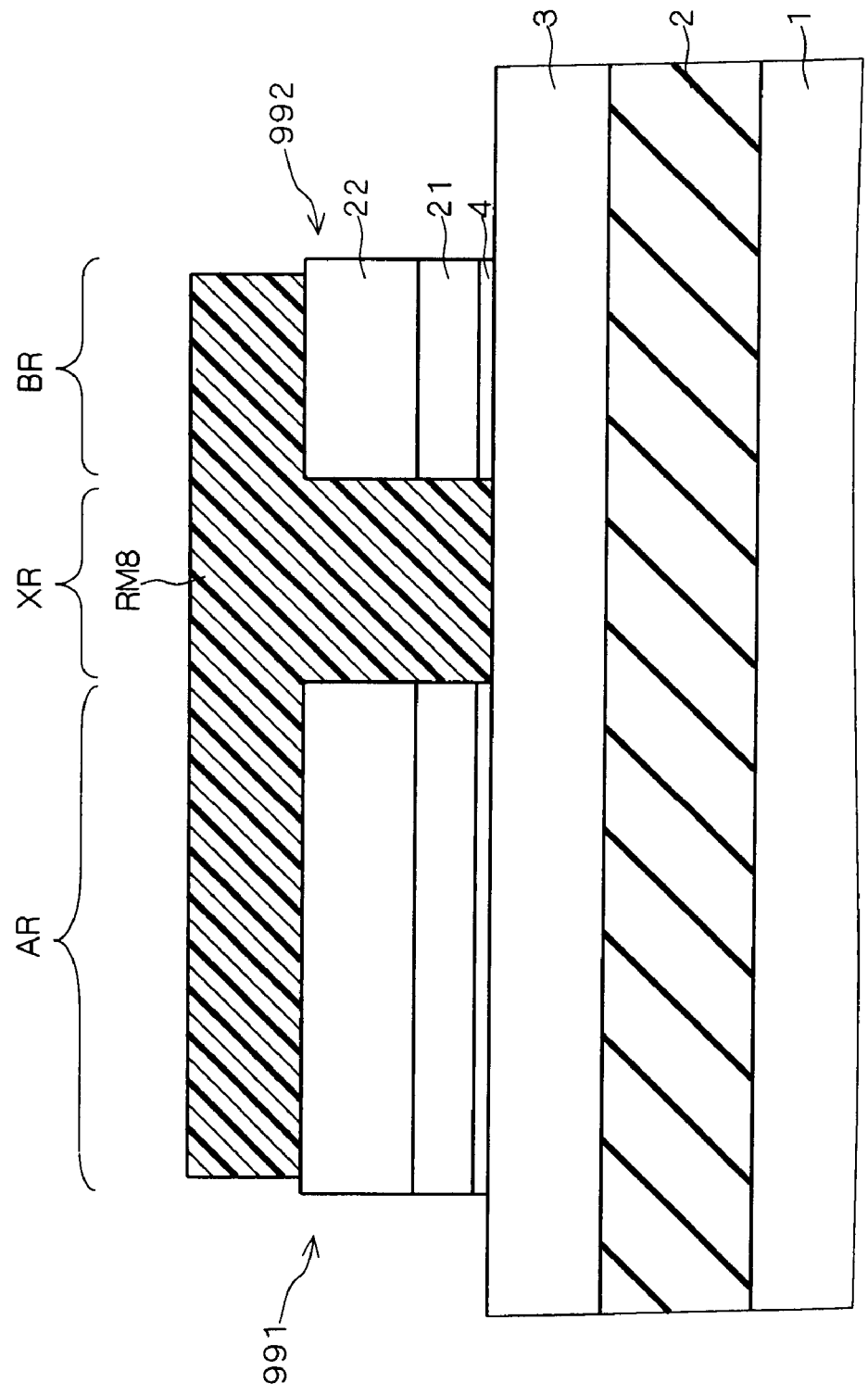
FIGS. 35 to 42 are views illustrating a variant of the process for manufacturing an MOS transistor according to the fifth embodiment of the present invention.

In place of the steps shown in FIGS. 28 and 29, it is also possible to employ steps shown in FIGS. 35 to 37 which will be described below.

More specifically, after the step described with reference to FIG. 27 is executed, the resist mask RM6 is removed. Instead, a resist mask RM8 is formed to cover only the active region AR of the MOS transistor, the body contact portion formation region BR and the region XR in which a thick gate insulating film is to be formed as shown in FIG. 35.

Figure 36:
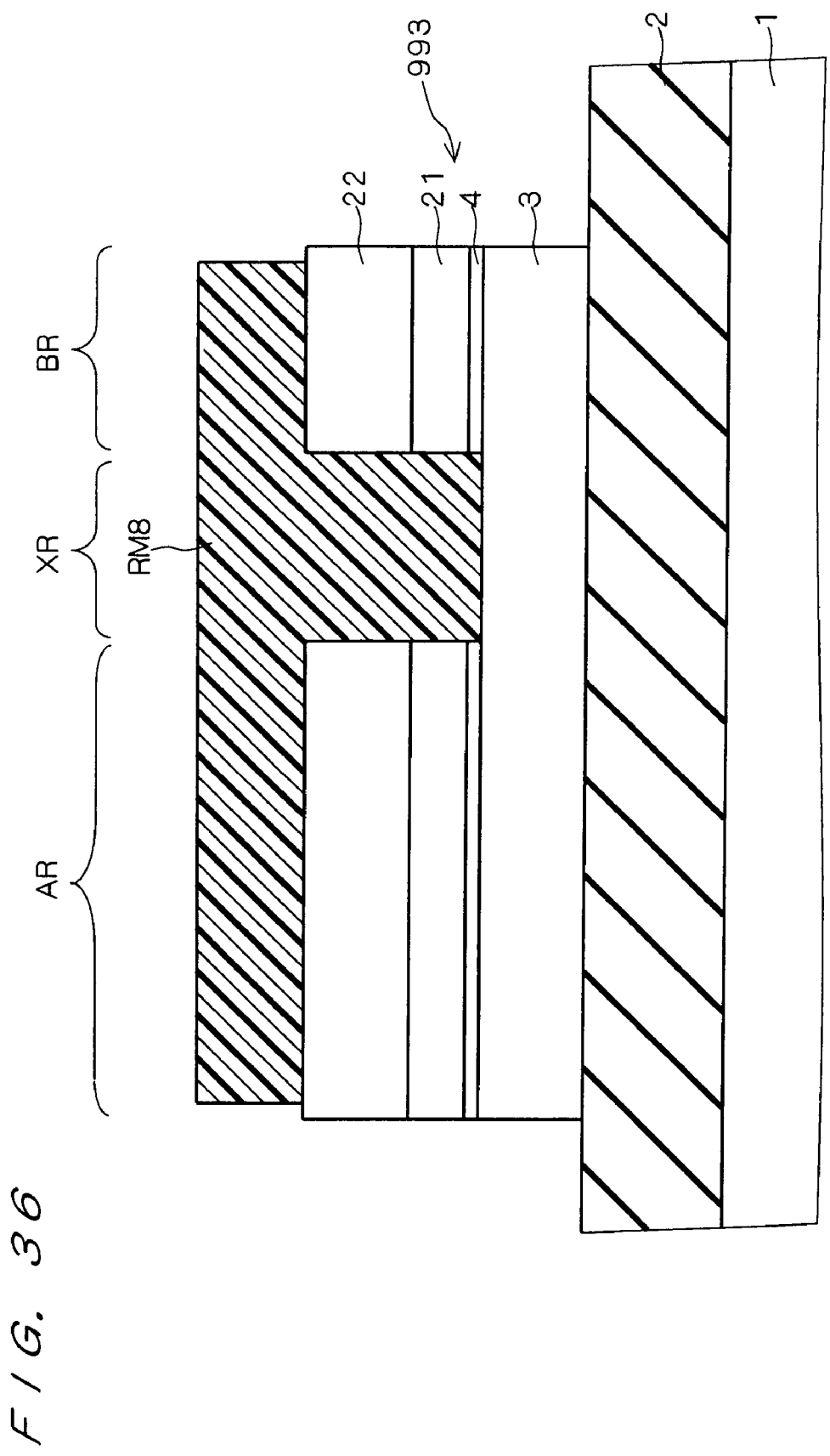

At a step shown in FIG. 36, next, the oxide film 4 and the SOI layer 3 in the region which is not covered by the resist mask RM8 are removed by using the resist mask RM8 as an etching mask. Consequently, a stacked film 993 having the nitride film 22, the polysilicon film 21, the oxide film 4 and the SOI layer 3 is formed.

Figure 37:
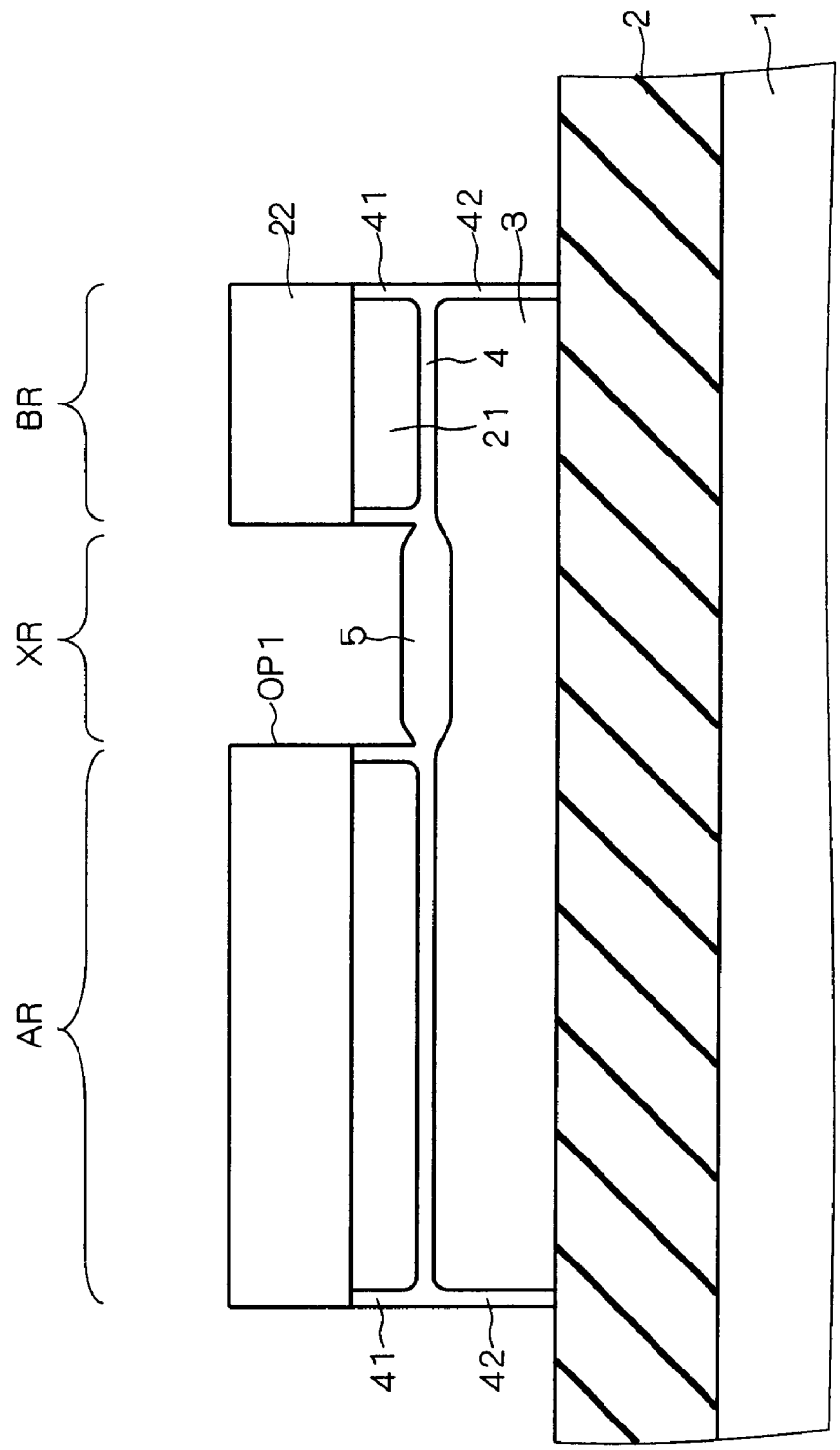

Next, the resist mask RM8 is removed and thermal oxidation is then carried out at a step shown in FIG. 37, thereby forming an oxide film 5 having a thickness of 10 to 40 nm on a surface of the SOI layer 3 and oxide films 41 and 42 are formed on the exposed side walls of the polysilicon layer 21 and the SOI layer 3 (side wall oxidation).

If the above-mentioned method is employed, the side wall oxidation of the SOI layer 3 can be carried out simultaneously with the formation of the oxide film 5. Therefore, it is possible to obtain such an advantage that the manufacturing process can be simplified. On the other hand, it is impossible to carry out such selection that the side wall oxidation of the SOI layer 3 is not executed. In consideration of the trade-off relation-ship with the current leakage, therefore, it is desirable to determine whether or not the above-mentioned method is to be employed.

<E-1-2. Second Variant>

In place of the steps shown in FIGS. 27 to 29, it is also possible to employ steps shown in FIGS. 38 to 40 which will be described below.

Figure 38:
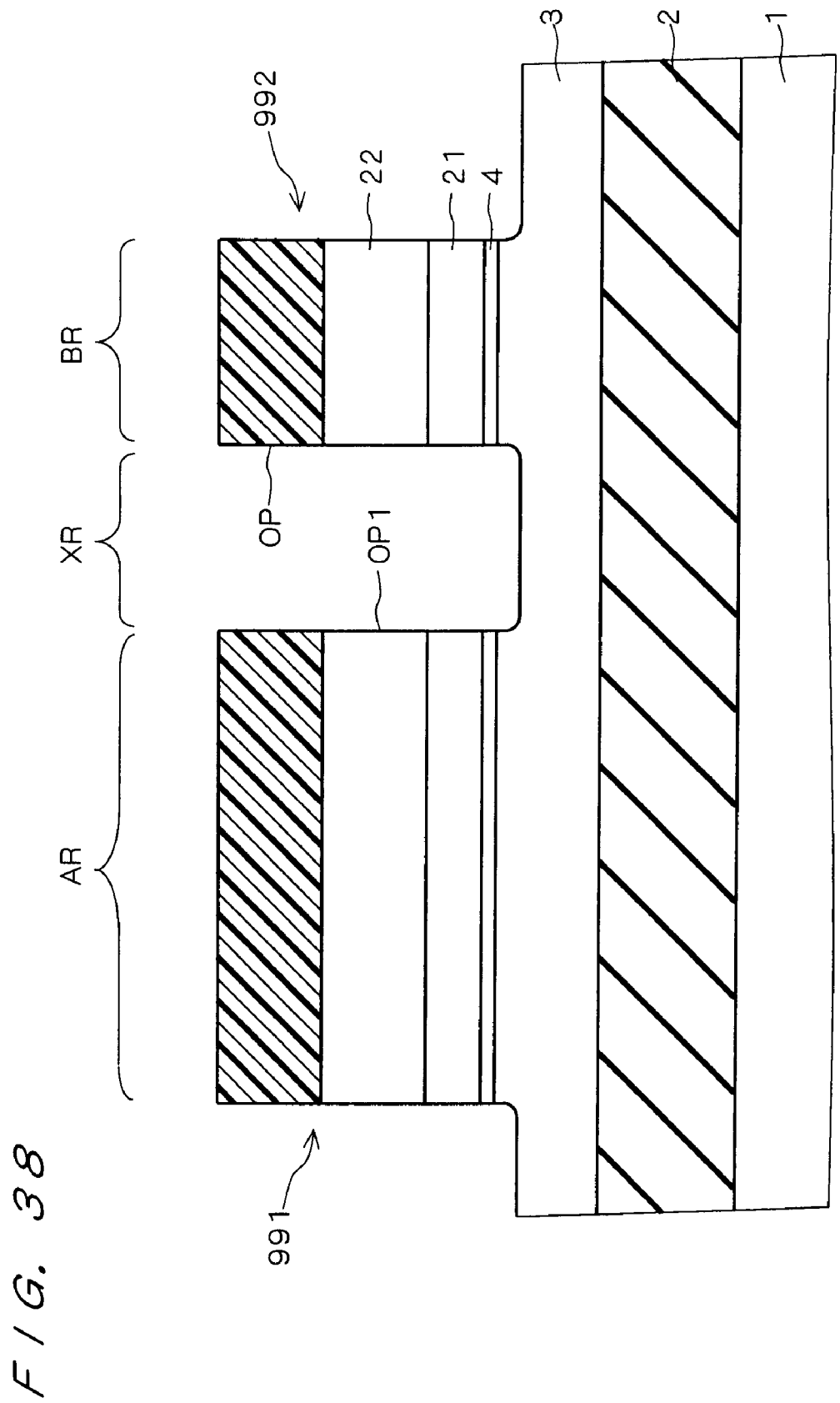

As shown in FIG. 38, a stacked film having a nitride film 22, a polysilicon film 21 and an oxide film 4 is formed on an SOI substrate and a region on the nitride film 22 which corresponds to an MOS transistor formation region is covered by a resist mask RM6.

At this time, the resist mask RM6 is patterned such that a region XR in which a thick gate insulating film is to be formed acts as an opening portion OP.

By using the resist mask RM6 as an etching mask, then, the nitride film 22 and the polysilicon film 21 are selectively removed by dry etching or wet etching.

Furthermore, the oxide film 4 and the SOI layer 3 which are not covered by the nitride film 22 are removed by using the patterned nitride film 22 as an etching mask, thereby leaving stacked films 991 and 992 having the nitride film 22, the polysilicon film 21 and the oxide film 4 in only an active region AR of the MOS transistor and a body contact portion formation region BR. The region XR acts as a lower OP1 and the SOI layer 3 is exposed to a bottom portion thereof. At this time, the SOI layer 3 is slightly removed by overetching. The removal is carried out in a maximum thickness of approximately 50 nm. Moreover, the nitride film 22, the polysilicon film 21 and the oxide film 4 are sequentially etched one by one. Therefore, an overetching amount of the SOI layer 3 is rarely varied differently from the formation of PTI.

Figure 39:
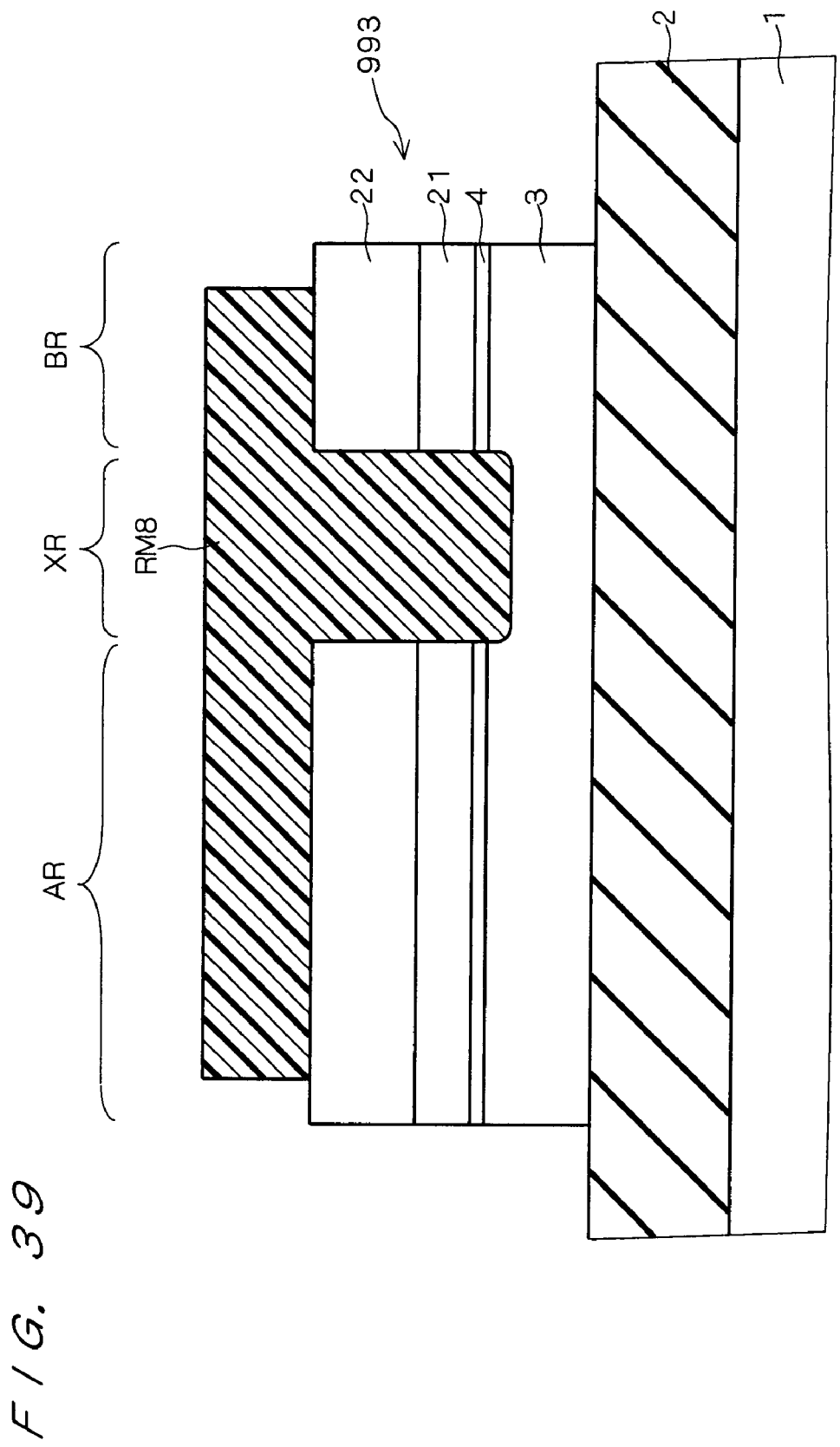
Figure 40:
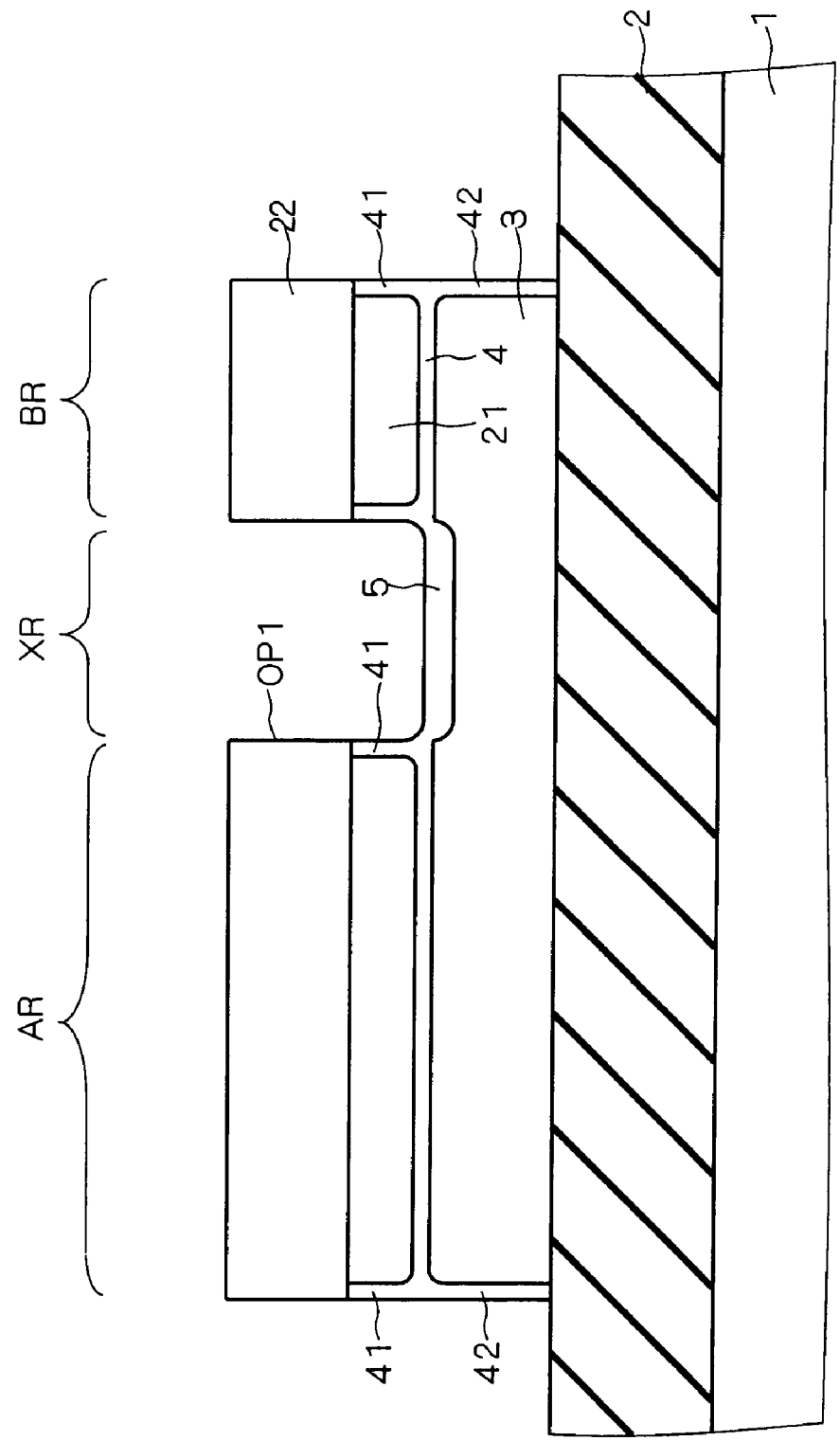

Next, the resist mask RM6 is removed and a resist mask RM8 is then formed to cover only the active region AR of the MOS transistor, the body contact portion formation region BR and the region XR in which a thick gate insulating film is to be formed, and the oxide film 4 and the SOI layer 3 in a region which is not covered by the resist mask RM8 are removed by using the resist mask RM8 as an etching mask, thereby forming a stacked film 993 having the nitride film 22, the polysilicon film 21, the oxide film 4 and the SOI layer 3 at a step shown in FIG. 39.

Subsequently, the resist mask RM8 is removed and thermal oxidation is then carried out to form an oxide film 5 having a thickness of 10 to 40 nm on a surface of the SOI layer 3 including a bottom surface of the opening portion OP1 and to form oxide films 41 and 42 on exposed side walls of the polysilicon layer 21 and the SOI layer 3 at a step shown in FIG. 40 (side wall oxidation).

Since the oxide film 5 is formed in the overetched portion of the SOI layer 3, a thickness thereof can easily be increased.

After the step shown in FIG. 38 is executed, the inside of the opening portion OP1 may be oxidized to form the oxide film 5.

At the steps shown in FIGS. 27 and 38, moreover, the nitride film 22 and the polysilicon film 21 are selectively removed by dry etching or wet etching, and furthermore, the oxide film 4 and the SOI layer 3 are removed by using the patterned nitride film 22 as an etching mask. In the removal of the oxide film 4 and the SOI layer 3, an etching damage is not applied to the surface of the SOI layer 3 if etching having a small etching damage such as chemical dry etching (CDE) is used. In the case in which the overetching is to be carried out, moreover, a controllability of an overetching amount can also be enhanced.

The CDE is one configuration of dry etching to be carried out in a specific gas atmosphere or in a vacuum container in which a pressure is controlled, and is carried out by using a chemically active radical as an etching species and a device for separating a portion in which an active radical is to be formed from a portion in which the etching is to be performed.

For the etching species, there has been reported an example utilizing a fluorine (F) radical obtained from a plasma using a mixed gas of a $CF_4$ gas and an $O_2$ gas (see Monthly Semiconductor World 1994. 1, P 64 to P 67 published by Press Journal Co., Ltd.).

<E-1-3. Third Variant>

Moreover, a stacked film having a nitride film 22, a polysilicon film 21 and an oxide film 4 is formed on an SOI substrate. Then, it is also possible to first carry out etching for defining a region in which a perfect trench isolating oxide film is to be formed.

Figure 41:
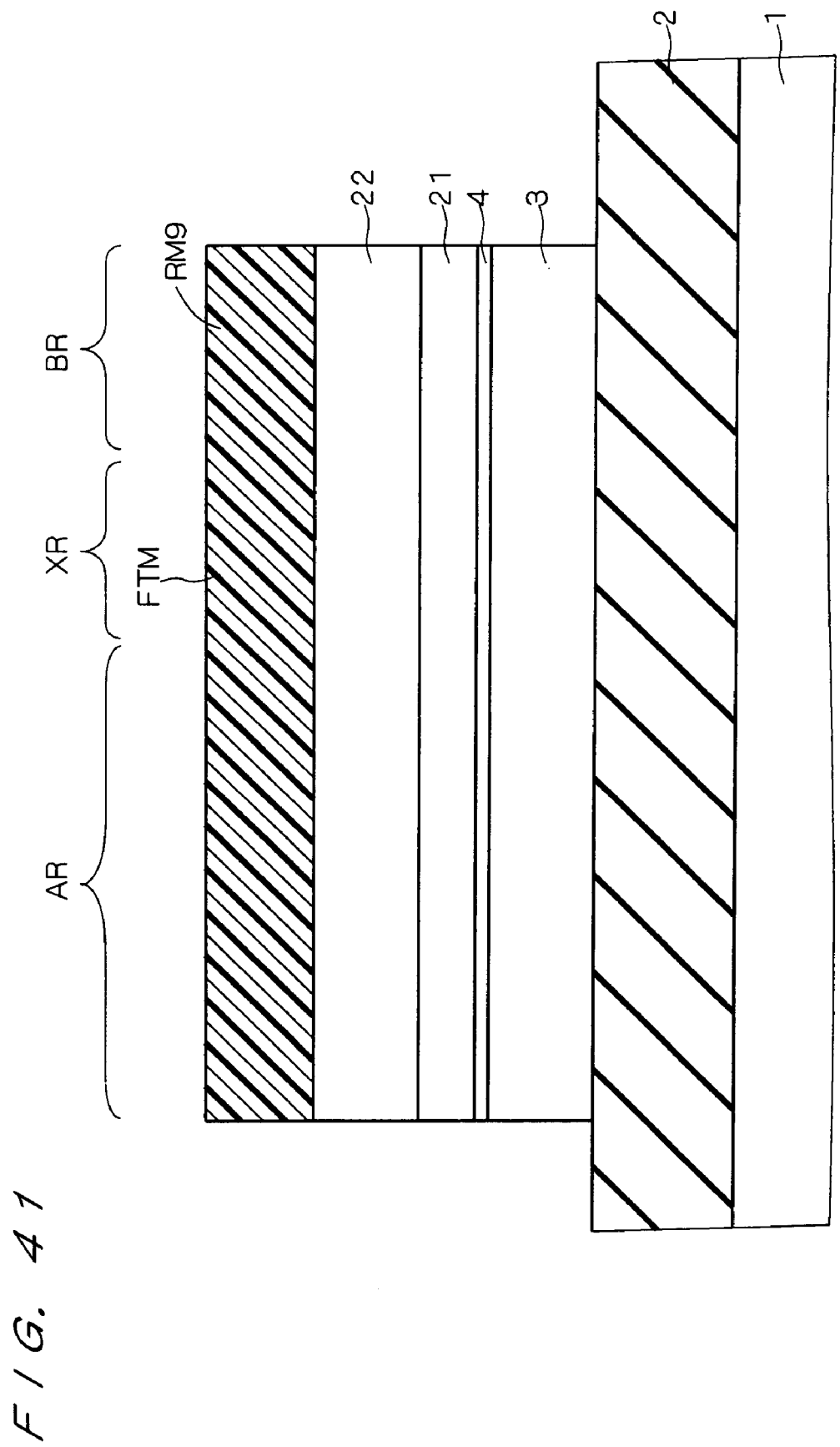

More specifically, as shown in FIG. 41, a resist mask RM9 having an opening pattern for defining the region in which a perfect trench isolating oxide film is to be formed is provided on the stacked film having the nitride film 22, the polysilicon film 21 and the oxide film 4 which is formed on the SOI substrate, and the nitride film 22, the polysilicon film 21, the oxide film 4 and the SOI layer 3 in a region which is not covered by the resist mask RM9 are removed.

Figure 42:
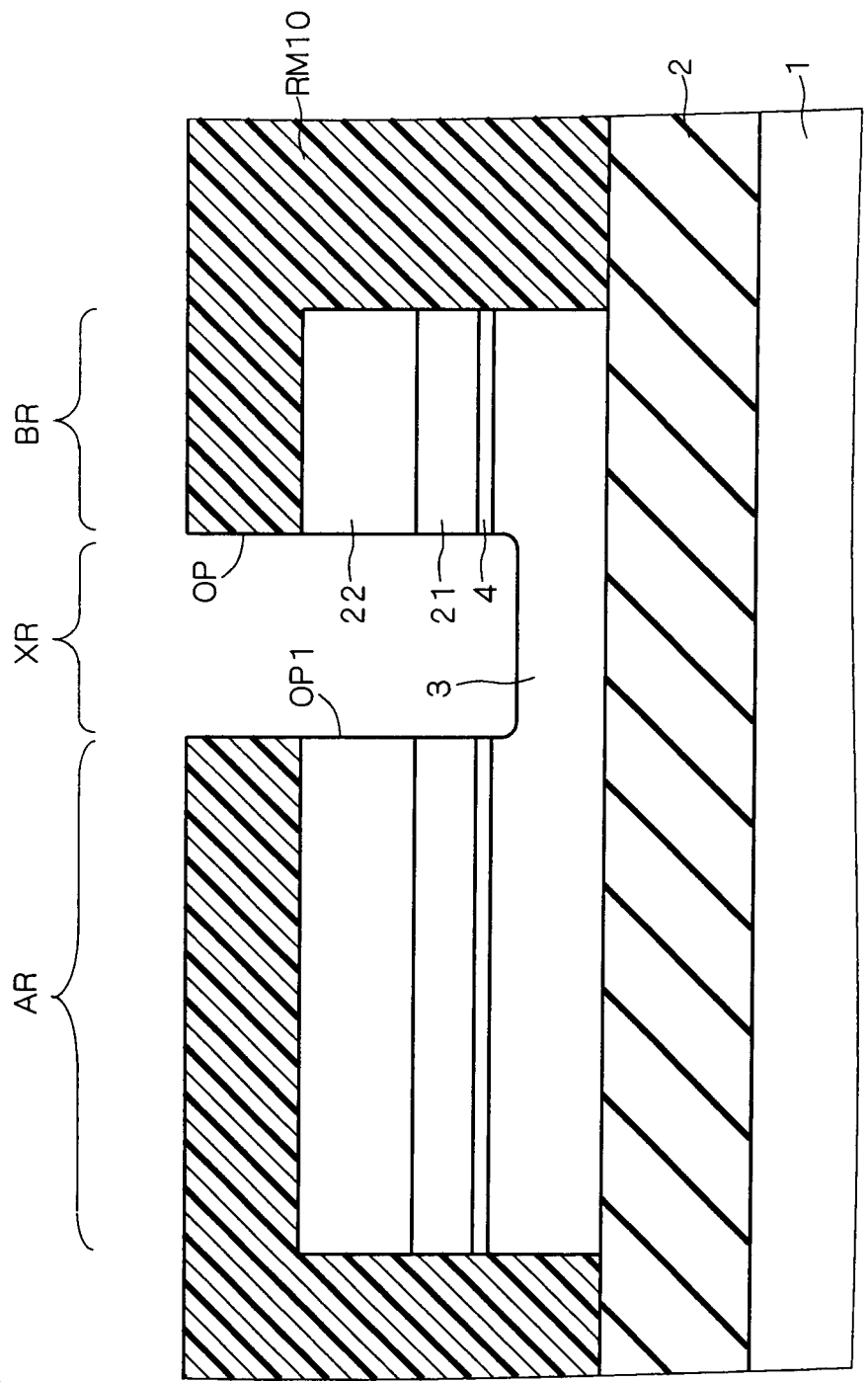

At a step shown in FIG. 42, thereafter, a resist mask RM10 is formed over a whole surface of the SOI substrate. The resist mask RM10 is patterned such that only a region XR in which a thick gate insulating film is to be formed acts as an opening portion OP. Then, the nitride film 22, the polysilicon film 21 and the oxide film 4 are removed to form an opening portion OP1 by using the resist mask RM10 as an etching mask.

Subsequently, it is preferable that the step described with reference to FIG. 37 or the step described with reference to FIG. 40 should be employed for a step of oxidizing the inside of the opening portion OP1 to form an oxide film 5.

<E-2. Planar Layout>

An example of a planar layout in each of the steps described with reference to FIGS. 27 to 32 will be described below with reference to FIGS. 43 to 46.

FIG. 43 shows a planar layout of the resist mask RM6 to be used in the step shown in FIG. 27, and resists having individually different shapes are provided in regions corresponding to the active region AR of the MOS transistor and the body contact portion formation region BR and other regions act as opening portions. A region in which the resist is provided acts as a so-called field region. In FIG. 43, moreover, mask data for defining the field region including the active region AR (not shown) and mask data for defining the field region including the body contact portion formation region BR (not shown) are typically shown as FM1 and FM2, respectively. A portion between the mask data FM1 and FM2 acts as a region in which a thick gate insulating film is to be formed as described with reference to FIG. 27.

FIG. 44 shows a planar layout of the resist mask RM7 to be used in the step shown in FIG. 29, and a continuous resist is provided in regions corresponding to the active region AR of the MOS transistor, the region XR in which a thick gate insulating film is to be formed later and the body contact portion formation region BR and other regions act as opening portions. The region in which the resist is provided and a region other than a region surrounded by a broken line which is defined by the mask data FM1 and FM2 act as a so-called perfect trench isolating oxide film formation region. In FIG. 44, mask data for defining a perfect trench isolating oxide film non-formation region FTR are typically shown as FTM.

FIG. 45 shows a planar layout of a resist mask RM11 (which is not shown in FIG. 32) for forming the gate electrode 12 at the step shown in FIG. 32. A resist is provided in only a portion in which the gate electrode 12 is to be formed.

FIG. 46 shows a planar layout of an MOS transistor Q21 formed by using the resist masks RM6, RM7 and RM11 described above.

FIG. 46 shows the MOS transistor Q21 comprising the active region AR including a source-drain region and the gate electrode 12 and the body contact portion BD provided on the outside in a direction of a gate width on the gate contact pad GP side of the gate electrode 12.

Figure 47:
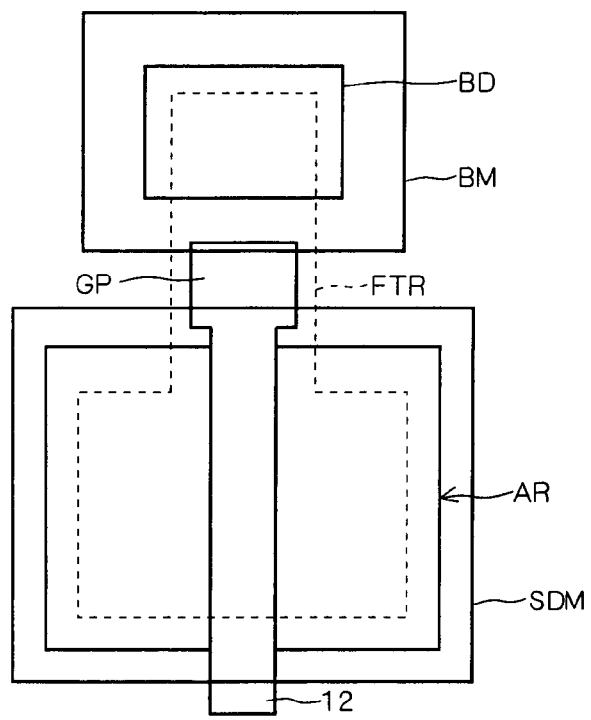
FIGS. 47 and 48 are views illustrating a planar structure of the MOS transistor according to the fifth embodiment of the present invention.

FIG. 47 is a typical view which is superposed on FIG. 46, showing mask data SDM and BM for defining an implantation region of a source-drain impurity into the active region AR and an implantation region of an impurity into the body contact portion BD.

In FIG. 47, rectangular regions indicated as the mask data SDM and BM act as the opening portions of the resist. Desirably, the mask data BM should be set such that a tip of the gate pad GP reaches the region of the mask data BM. If the tip of the gate pad GP does not reach the region of the mask data BM, the source-drain impurity is introduced into the SOI layer between the body contact portion BD and the active region AR. The reason is that the introduction is to be prevented.

In the case in which an implantation mask is to be formed, two forming methods can be employed depending on a difference in a material of the resist.

More specifically, there are two methods including a method of designing, by CAD or the like, a region in which an impurity is to be implanted, then creating a negative mask setting a region other than the impurity implantation region as a light shielding portion and exposing a positive resist by using the negative mask, thereby forming an opening preference mask, and a method of designing, by the CAD or the like, a region in which an impurity is to be implanted, then creating a positive mask setting the impurity implantation region to be a light shielding portion on the mask as it is, and exposing a negative resist using the positive mask, thereby forming an opening preference mask.

Figure 48:
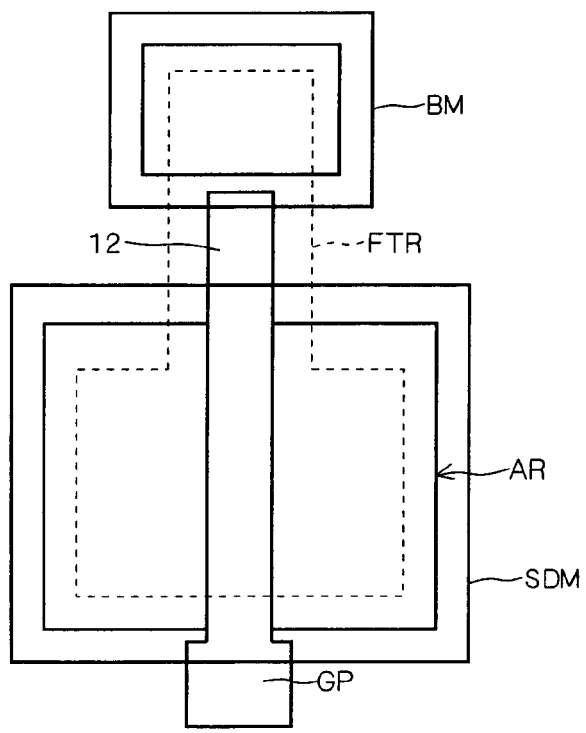

While the structure in which the body contact portion BD is provided on the outside in the direction of the gate width on the gate pad GP side of the gate electrode 12 is shown in FIG. 47, it is also possible to employ a planar layout in which the gate electrode 12 is inverted. FIG. 48 shows the planar layout.

FIG. 48 shows the layout in which the body contact portion BD is provided on the outside in the direction of the gate width on the opposite side of the gate pad GP of the gate electrode 12.

<E-3. Function and Effect>

According to the manufacturing method of the fifth embodiment described above, in the case in which the method of forming a perfect trench isolating oxide film by using an auxiliary film is employed, a thickness of a gate insulating film is varied in the direction of the gate width. The thick gate insulating film 5 can be formed under the gate contact pad GP provided over a large area on the SOI layer 3. By reducing a thickness of the gate insulating film 5 in a region in which a current flows in a large amount, it is possible to reduce a parasitic capacitance between a gate and a drain with such a structure that body fixation can be carried out. Thus, it is possible to obtain an MOS transistor in which a quick and stable operation can be carried out with low power consumption.

In FIG. 28, moreover, the gate width of the MOS transistor can be determined in self-alignment by one photolithographic process as is indicated by the width W of the stacked film 991.

Therefore, it is possible to obtain an MOS transistor having a small variation in the gate width.

Figure 49:
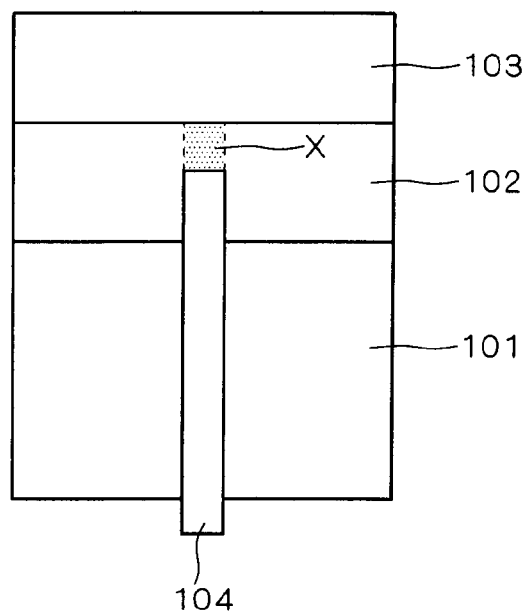
FIG. 49 is a plan view for explaining an advantage of the MOS transistor according to the fifth embodiment of the present invention.

For a planar layout of a body fixed MOS transistor, moreover, a structure shown in FIG. 49 has also been published by B. W. Min et al. (2001 IEEE International SOI Conference P 71, 72). The structure has a possibility that a current leakage path might be formed between a source and a drain.

More specifically, in FIG. 49, a partial trench isolating region 102 is provided between an active region 101 and a body contact region 103 and a gate electrode 104 is extended to the middle of the partial trench isolating region 102. Accordingly, in the case in which a source-drain implantation is carried out, there is a possibility that a source-drain impurity might also be introduced into an SOI layer provided under the trench isolating region 102 in a region X (a hatching portion) between a tip of the gate electrode 102 and the body contact region 103, resulting in generation of a current leakage between the source and the drain through the region X.

In order to prevent the generation of the current leakage, it is necessary to increase a concentration of the impurity (having a reverse conductivity type to that of the source-drain impurity) in the SOI layer of the region X so as not to be compensated by the implanted source-drain impurity. Consequently, it is hard to cause the source-drain impurity layer or a depletion layer formed thereunder to reach a buried oxide film 2. Thus, it is impossible to obtain such an advantage that a junction capacitance is small which is a characteristic of an SOI device. Moreover, even if the source-drain impurity layer or the depletion layer reaches the buried oxide film 2, the junction capacitance is increased if an impurity concentration of a channel region is high. Consequently, the advantage of the SOI device cannot be obtained.

If the planar layout according to the present embodiment shown in FIGS. 47 and 48 is employed, however, such a problem does not arise.

<E-4. Variant of Planar Layout>

Figure 50:
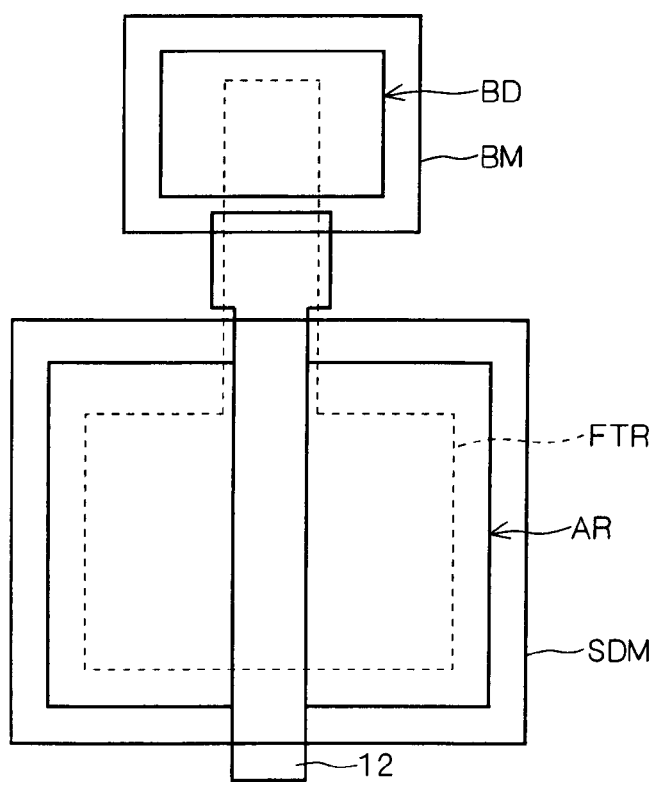
FIG. 50 is a view illustrating a variant of the planar structure of the MOS transistor according to the fifth embodiment of the present invention.

In the planar layout shown in FIG. 47, a perfect trench isolating oxide film non-formation region FTR has a T shape seen on a plane and a length in a direction of a gate length of a portion corresponding to a leg portion of the T shape is set to be greater than a length in a direction of a gate length of the gate contact pad GP of the gate electrode 12. As shown in FIG. 50, the length in the direction of the gate length of the portion corresponding to the leg portion of the T shape may be set to be smaller than the length in the direction of the gate length of the gate contact pad GP of the gate electrode 12.

By such a structure, a connecting portion between the body contact portion BD and the active region AR is covered by the gate contact pad GP. In the implantation of the source-drain impurity, consequently, introduction into the connecting portion can be prevented.

<E-5. Semiautomatic Creation of Mask Data>

While at least three resist masks including the resist masks RM6, RM7 and RM11 are required for creating the planar layout of the MOS transistor shown in FIG. 46 as described with reference to FIGS. 43 to 45, the mask data FTM for forming the resist mask RM7 can easily be obtained by employing the following method.

More specifically, the mask data FTM for defining the perfect trench isolating oxide film non-formation region FTR can be created semiautomatically by using the mask data FM1 for defining the active region AR and the mask data FM2 for defining the body contact portion formation region BR.

FIG. 51 is a view typically showing a method of semiautomatically creating the mask data FTM. The mask data FM1 and FM2 are subjected to an undersize processing by a dimension of $\epsilon$ so that mask data FTM1 and FTM2 (subjected to the undersize processing) can be obtained automatically, and mask data FTM3 between the mask data FTM1 and FTM2 (data of a connecting portion between a body contact region and an active region) are input thereto. Consequently, it is possible to obtain the mask data FTM for defining the perfect trench isolating oxide film non-formation region FTR (in other words, mask data for defining the perfect trench isolating oxide film formation region). Thus, it is possible to easily obtain the mask data FTM.

The undersize processing serves to isotropically reduce object data in a predetermined amount. For example, (L31 UN0.1 μm) implies that each of four sides is moved inwardly by 0.1 μm if original field data (referred to as L31) define a rectangular region.

E-6. APPLIED EXAMPLE

As an applied example of the manufacturing method according to the fifth embodiment described above, a method of forming two kinds of MOS transistors including gate insulating films having different thicknesses will be described with reference to FIGS. 52 to 55 to be sectional views sequentially showing a manufacturing process.

Figure 52:
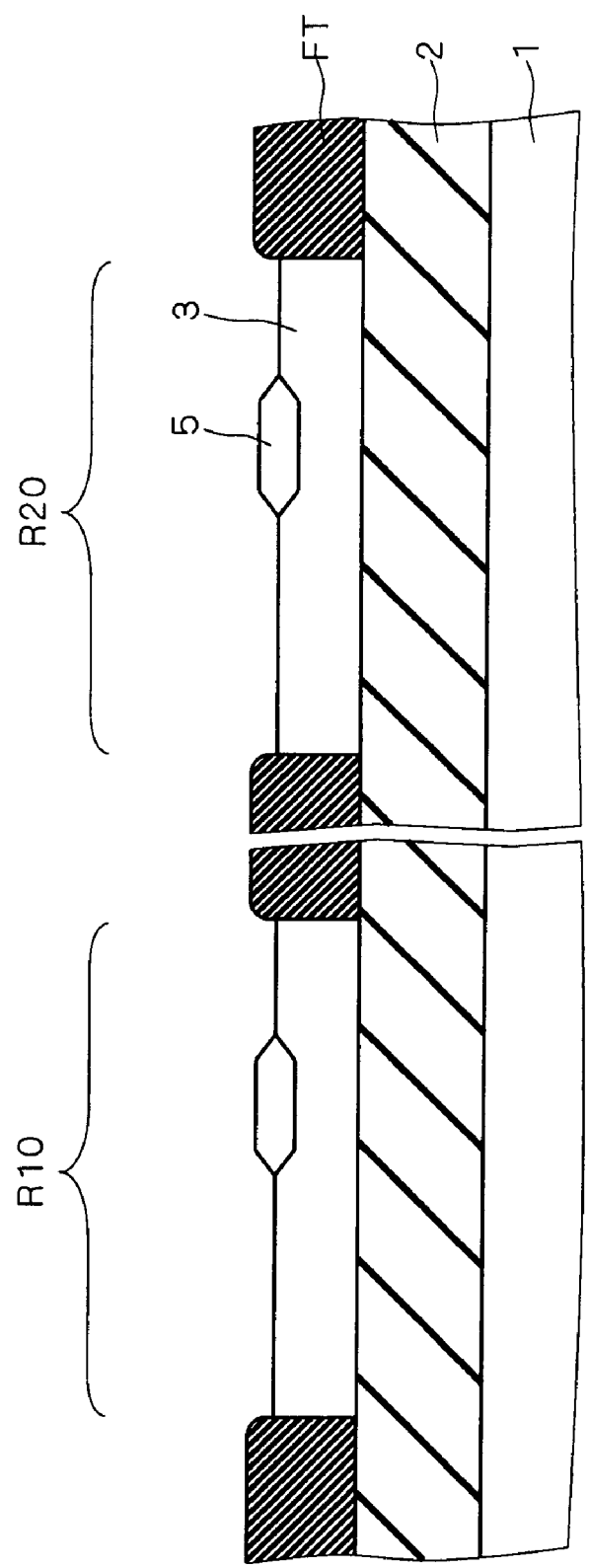
FIGS. 52 to 55 are views illustrating an applied example of a manufacturing method according to the fifth embodiment of the present invention.

First of all, the steps described with reference to FIGS. 27 to 31 are carried out to obtain such a structure that an oxide film 5 is formed in two regions R10 and R20 of an SOI layer 3 defined by a perfect trench isolating oxide film FT as shown in FIG. 52. The oxide film 5 has a thickness of 10 to 40 nm.

Figure 53:
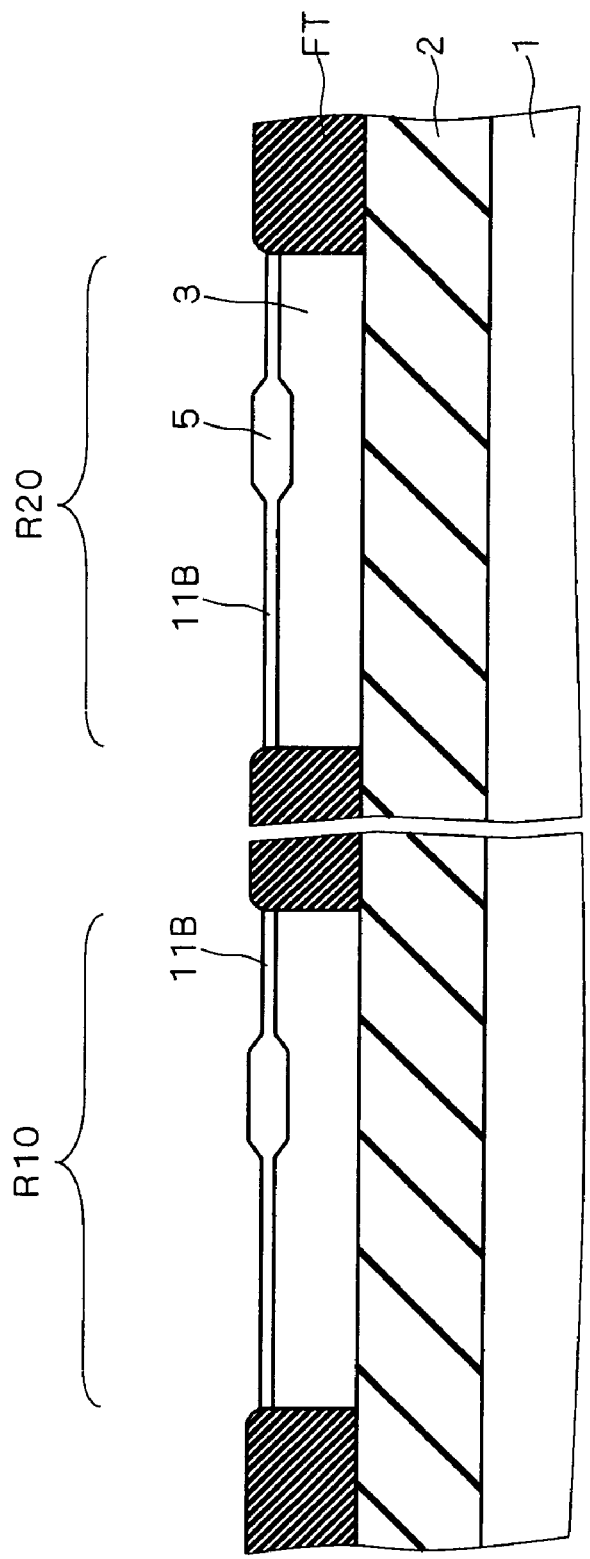

At a step shown in FIG. 53, next, gate oxidation is carried out over the exposed SOI layer 3 in the regions R10 and R20 and a gate insulating film 11B is thus formed. The gate insulating film 11B has a thickness of 3 to 10 nm.

Figure 54:
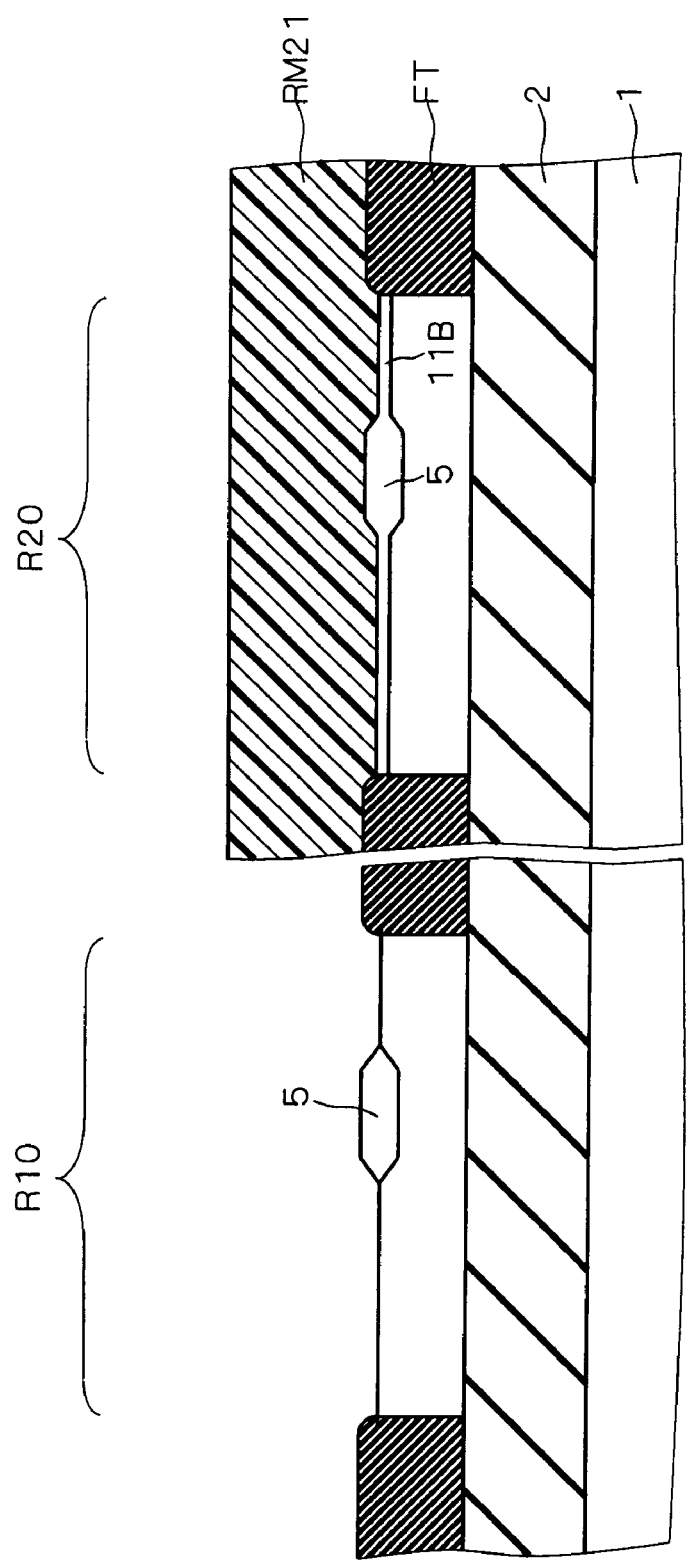

At a step shown in FIG. 54, then, a resist mask RM21 is patterned to cover the region R20 and the gate insulating film 11B in the region R10 which is not covered with the resist mask RM21 is removed by wet etching using hydrofluoric acid (HF) or the like.

Figure 55:
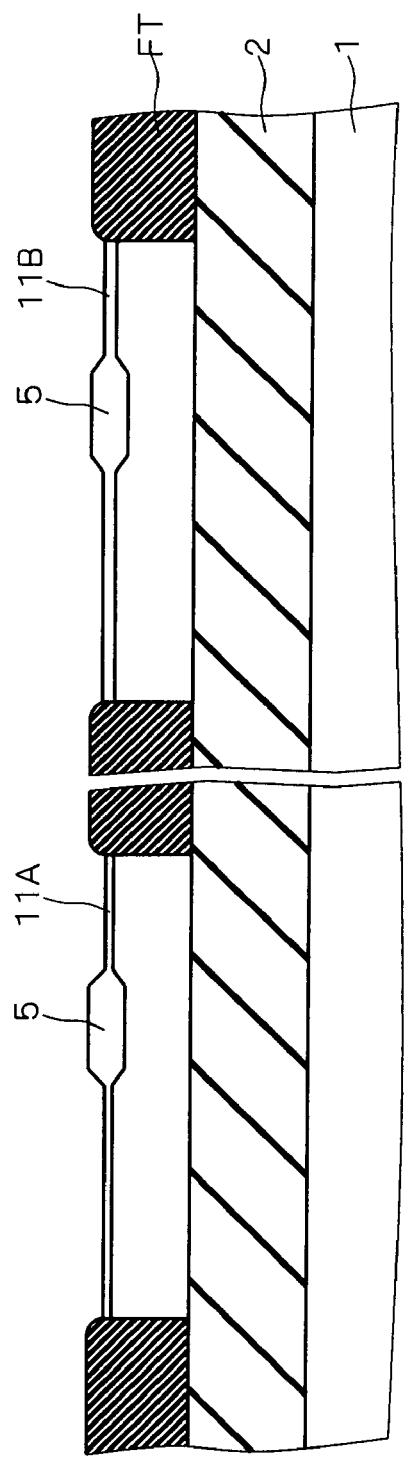

Subsequently, the resist mask RM21 is removed and a gate insulating film 11A is thereafter formed on the exposed SOI layer 3 by the gate oxidation at a step shown in FIG. 55. The gate insulating film 11A has a thickness of 1 to 5 nm.

The step described with reference to FIG. 32 is carried out. Consequently, it is possible to obtain two kinds of MOS transistors including gate insulating films having different thicknesses.

E-7. IMPROVED EXAMPLE

A boundary between an active region and a perfect trench isolating oxide film for defining the active region is referred to as a field edge. In some cases in which a gate electrode is provided on the field edge and a dent or the like is formed in the field edge portion due to a manufacturing process, the gate electrode enters therein so that a phenomenon referred to as so-called gate winding is generated.

Figure 56:
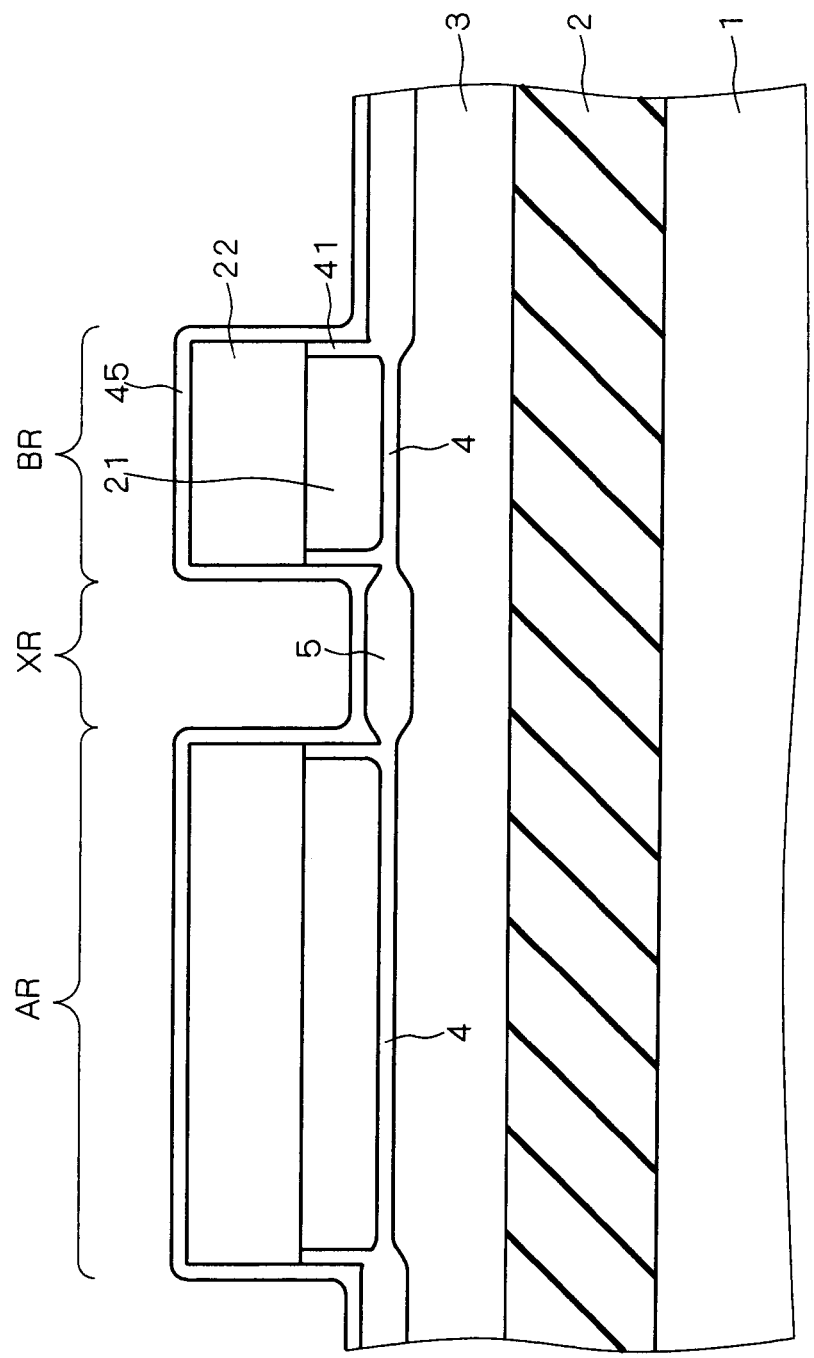
FIGS. 56 to 60 are views illustrating an improved example of the manufacturing method according to the fifth embodiment of the present invention.

A manufacturing method for preventing the gate winding will be described below with reference to FIGS. 56 to 58 to be sectional views sequentially showing a manufacturing process.

First of all, the steps described with reference to FIGS. 27 and 28 are carried out to form an oxide film 5 having a thickness of 10 to 40 nm on a surface of an SOI layer 3 and to form an oxide film 41 on an exposed side wall of a polysilicon film 21 by side wall oxidation. At a step shown in FIG. 56, then, an oxide film 45 having a thickness of 5 to 20 nm is formed on a whole surface of an SOI substrate by a CVD method.

Figure 57:
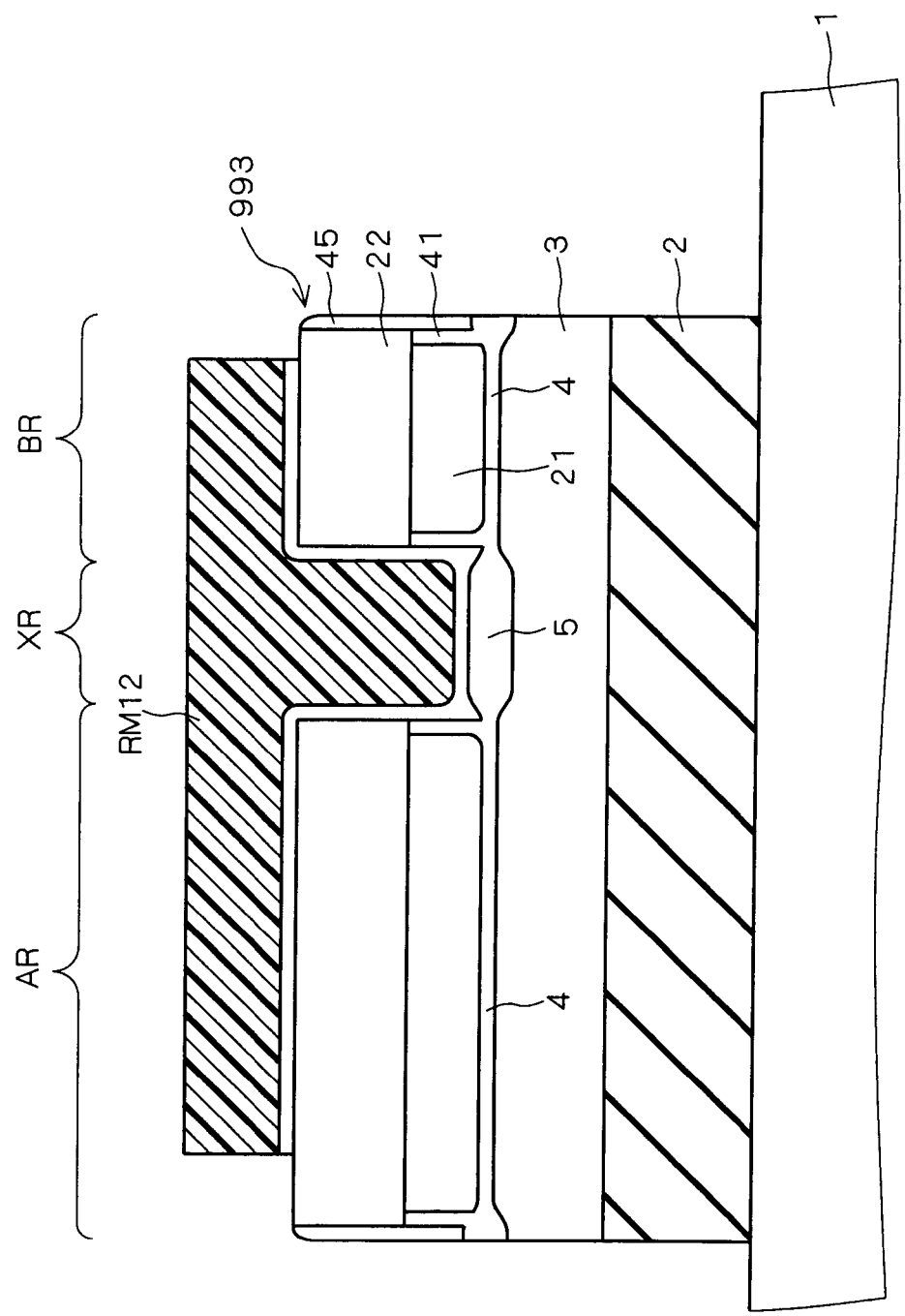

At a step shown in FIG. 57, next, a resist mask RM12 is formed to cover only an active region AR of an MOS transistor, a body contact portion formation region BR and a thick gate insulating film formation region XR. This is the same as the resist mask RM7 shown in FIG. 29.

Then, the oxide films 5 and 45 and the SOI layer 3 which are not covered by the resist mask RM12 are removed by using the resist mask RM12 as an etching mask. Consequently, a stacked film 993 having a nitride film 22, the polysilicon film 21, an oxide film 4 and the SOI layer 3 is formed. The oxide film 45 remains on side walls of the nitride film 22 and the polysilicon film 21.

Thereafter, the steps described with reference to FIGS. 30 and 31 are carried out to obtain a structure shown in FIG. 58.

Figure 58:
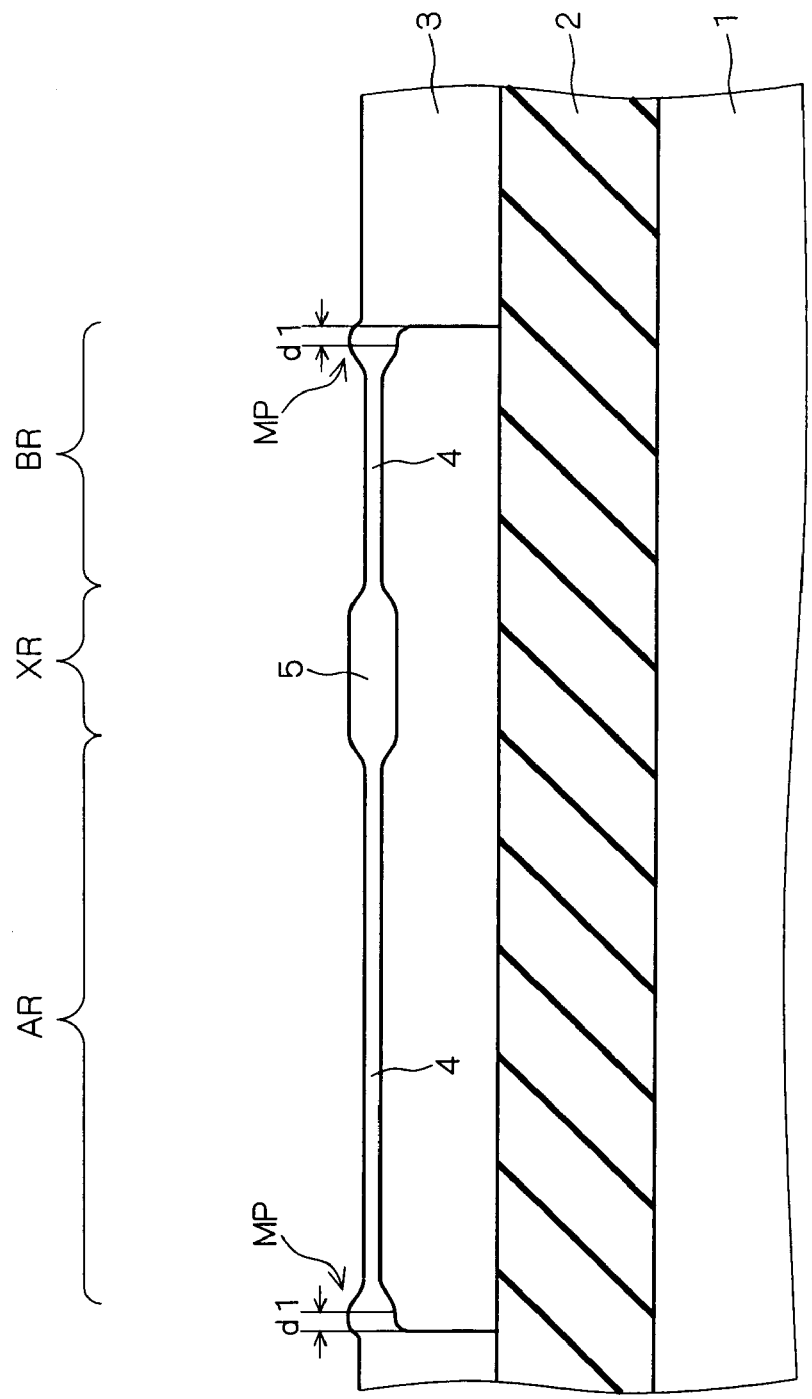

As shown in FIG. 58, a bulged portion MP having a thickness of the oxide film increased locally is formed in a field edge portion to be a boundary between a perfect trench isolating oxide film FT and the active region AR and a boundary portion between the perfect trench isolating oxide film FT and the body contact portion formation region BR.

The bulged portion MP corresponds to an edge portion of the oxide film 5 formed by thermal oxidation, and the oxide film 5 formed by the thermal oxidation has a smaller etching rate than that of an oxide film HX formed by an HDP-CVD method. In the wet etching of the oxide film HX described with reference to FIG. 31, therefore, the edge portion of the oxide film 5 remains with a bulge.

In the bulged portion MP, the oxide film 45 is formed in an upper portion of a region indicated as a width d1 from an end of the perfect trench isolating oxide film FT in which the influence of the etching of the oxide film HX is smaller. Accordingly, the oxide film 45 can be referred to as a spacer for enlarging the bulged portion MP.

By intentionally forming the bulged portion MP of the oxide film in the field edge portion, thus, the gate winding can be prevented also when the gate electrode is engaged with the field edge.

While there has been described the example in which the steps described with reference to FIGS. 27 and 28 are carried out and the oxide film 45 is then formed over the whole surface of the SOI substrate by the CVD method, a nitride film may be formed as the spacer.

Figure 59:
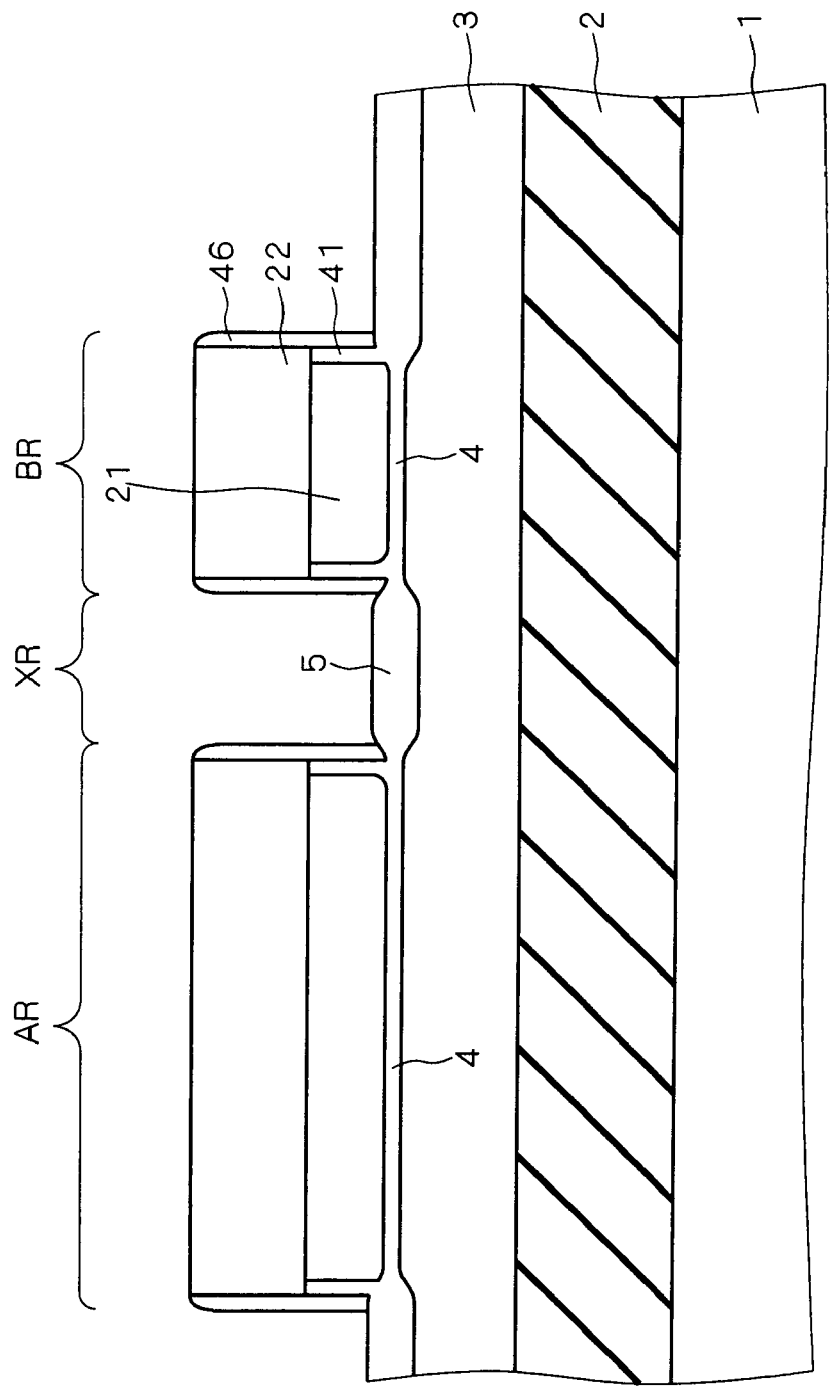

FIG. 59 shows a state in which the steps described with reference to FIGS. 27 and 28 are carried out, a nitride film 46 is then formed over the whole surface of the SOI substrate by the CVD method and the nitride film 46 is thereafter removed by anisotropic etching. The nitride film 46 remains on the side walls of the nitride film 22 and the polysilicon film 21.

Figure 60:
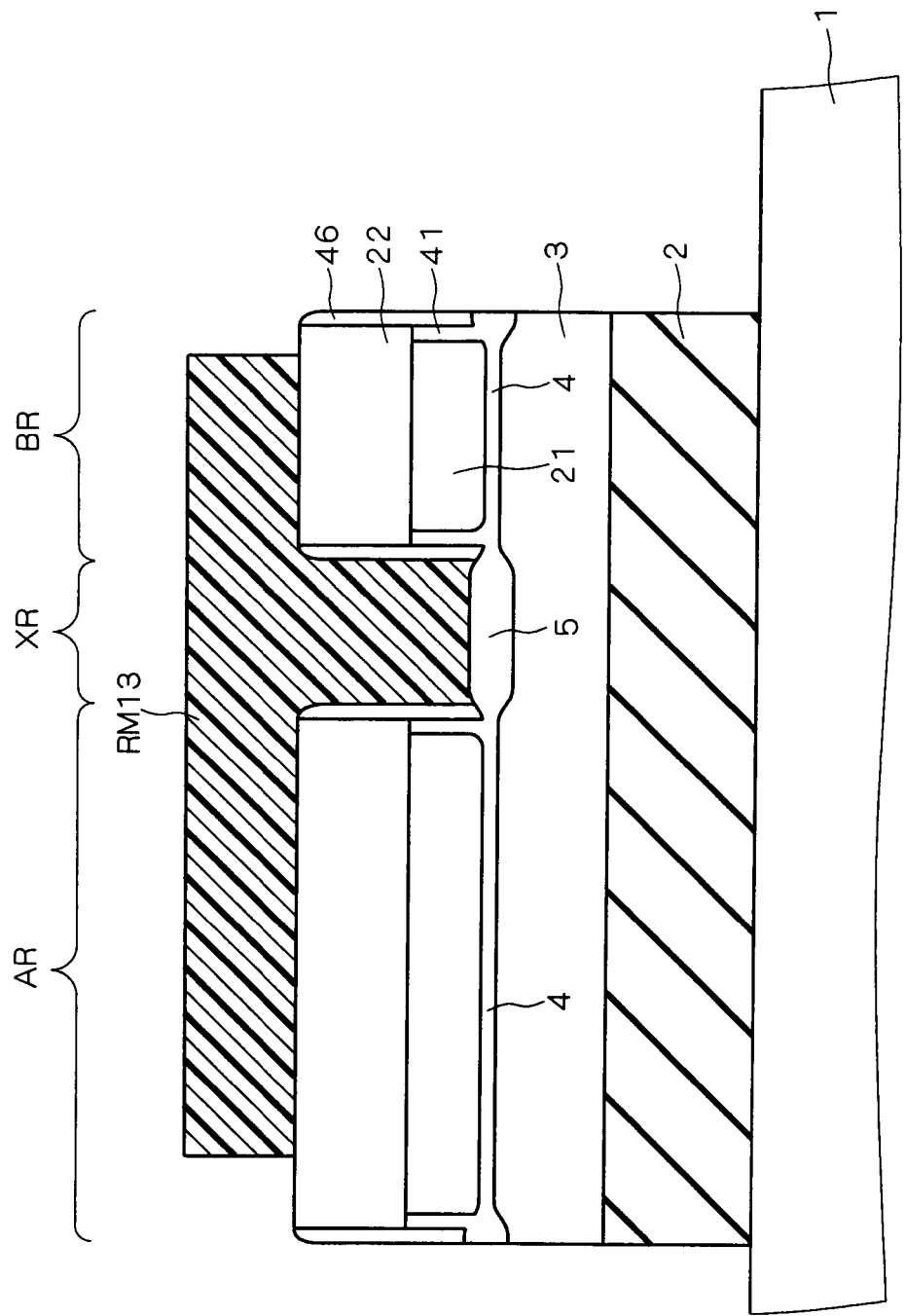

In this state, as shown in FIG. 60, a resist mask RM13 is formed to cover only the active region AR of the MOS transistor, the body contact portion formation region BR and the thick gate insulating film formation region XR. This is the same as the resist mask RM7 shown in FIG. 29.

By using the resist mask RM13 as an etching mask, the oxide films 5 and 45 and the SOI layer 3 in a region which is not covered by the resist mask RM13 are removed to form a stacked film 993 having the nitride film 22, the polysilicon film 21, the oxide film 4 and the SOI layer 3. The nitride film 46 remains on the side walls of the nitride film 22 and the polysilicon film 21.

Then, the steps described with reference to FIGS. 30 and 31 are carried out so that a structure shown in FIG. 58 is obtained.

F. Sixth Embodiment

In the planar layout of the MOS transistor Q1 according to the first embodiment described with reference to FIG. 1, one side of the mask data RX1 does not completely overlap with one side on the source-drain region side of the gate contact pad GP but is shifted toward the body contact portion BD side by a length of α.

In this case, however, a part of the gate contact pad GP is formed on a thin gate insulating film. Therefore, there is a possibility that a parasitic capacitance might be increased in the same region.

In a sixth embodiment according to the present invention, description will be given to a planar layout and manufacturing method of an MOS transistor for eliminating such a possibility.

<F-1. Planar Layout>

Figure 61:
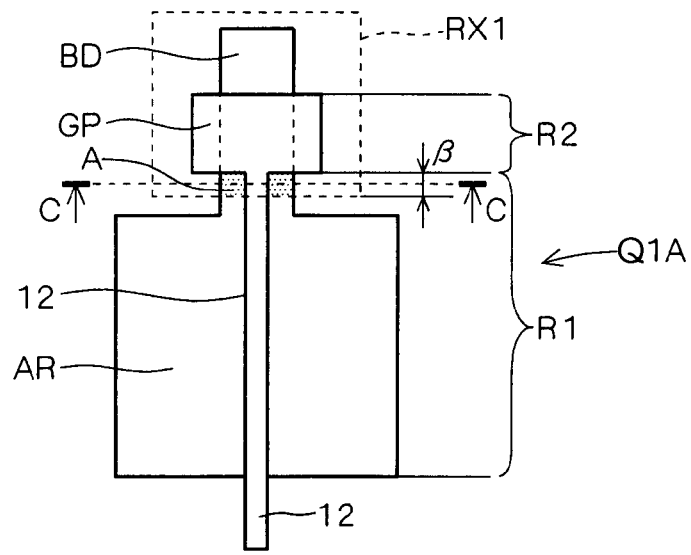
FIG. 61 is a view showing a planar structure of an MOS transistor according to a sixth embodiment of the present invention.

As shown in FIG. 61, in an MOS transistor Q1A, one side of mask data RX1 of a thick gate insulating film does not completely overlap with one side on the source-drain region side of a gate contact pad GP but is shifted toward the active region AR side by a length of β. In addition, the same structures as those of the MOS transistor Q1 described with reference to FIG. 1 have the same reference numerals and repetitive description will be omitted.

The length of β is defined by a length from an edge portion on the active region AR side of the gate contact pad GP to an edge portion on the active region AR side of the mask data RX1.

By employing such a planar layout, the gate contact pad GP is wholly formed on the thick gate insulating film. Therefore, a parasitic capacitance between a gate and a drain can be reduced with such a structure that body fixation can be carried out. Thus, it is possible to obtain an MOS transistor capable of carrying out a quick and stable operation with low power consumption.

<F-2. Consideration for Impurity Implantation>

If the planar layout shown in FIG. 61 is employed, there is a possibility that a current leakage might be generated between a source and a drain in an A region (a hatching region) of FIG. 61, that is, a region in which a gate length is small and a thick gate insulating film is present under a gate electrode 12.

In order to prevent the generation of the current leakage, consideration is taken such that an impurity to be implanted is lessened as much as possible in an LDD (low dope drain) implantation (an extension implantation) in the A region of FIG. 61.

Figure 62:
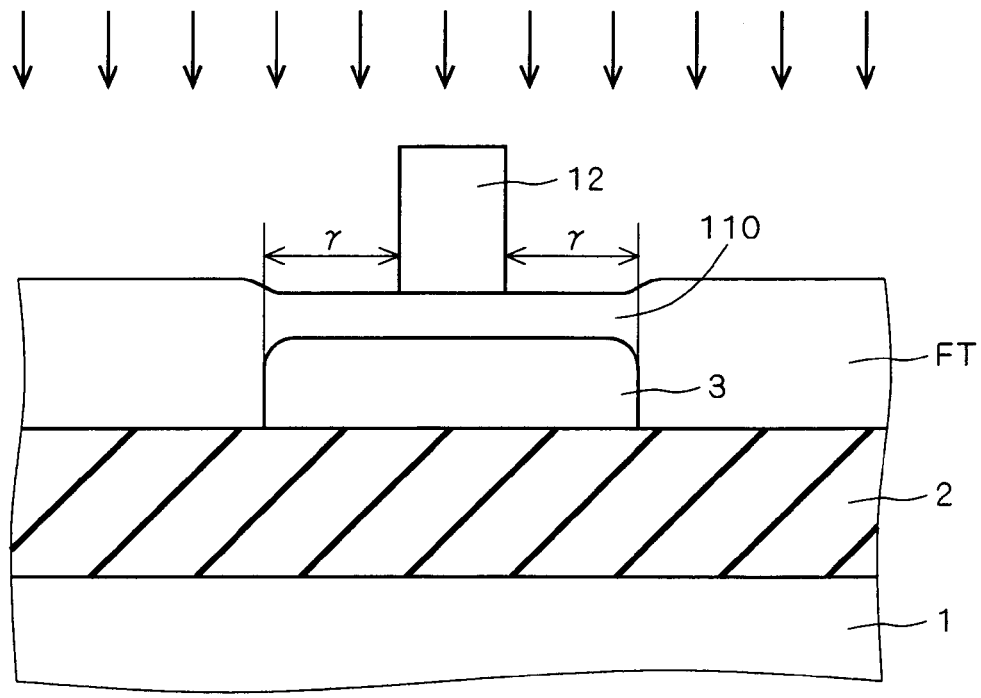

FIG. 62 shows a structure of a section taken along a line C-C (that is, a section in the A region) in FIG. 61 during the LDD implantation. As shown in FIG. 62, a thick gate insulating film 110 is provided under the gate electrode 12 within a range of a length γ in a direction of a gate length from both side surfaces of a gate.

In formation of a low dope drain layer (or a source-drain extension layer), accordingly, an impurity is implanted at an energy equal to an implantation energy in the active region AR so that the impurity implantation is blocked by the thick gate insulating film 110. Consequently, an amount of the impurity to be implanted into an SOI layer 3 in the A region of FIG. 61 is smaller than that of the impurity to be implanted into the SOI layer 3 in the active region AR so that a current leakage can be reduced.

Such consideration of a manufacturing process is also effective for the case in which the structures shown in FIGS. 47 and 48 and the structure shown in FIG. 50 are employed.

By taking consideration such that the impurity to be implanted for the source-drain implantation is lessened as much as possible in the A region shown in FIG. 61, moreover, it is possible to reduce a current leakage between a source and a drain.

FIG. 63 shows a structure of a section taken along the line C-C in FIG. 61 in the source-drain implantation.

As shown in FIG. 63, a side wall insulating film 13 is formed on a side surface of the gate electrode 12. In the formation of the side wall insulating film 13, it is possible to prevent a source-drain impurity from being introduced into the SOI layer 3 provided under the gate insulating film 110 by setting a width δ of the side wall insulating film 13 to be equal to or greater than the length of γ (γ≦δ) indicative of a formation range of the thick gate insulating film 110.

More specifically, for example, if the length of γ is set to be 30 nm, the width of δ is set to be approximately 50 nm so that the object can be attained.

By changing a viewpoint, moreover, it is preferable that a length in a direction of a gate length of the SOI layer 3 provided under the thick gate insulating film 110 should be set to be smaller than a length obtained by adding a gate length (Lg) of the gate electrode 12 to a double of the width (δ) of the side wall insulating film 13.

<F-3. Function and Effect>

As described above, the introduction of the impurity for the LDD implantation and the impurity for the source-drain implantation is prevented as much as possible in the SOI layer 3 of the region in which a gate length is small and the thick gate insulating film is provided under the gate electrode 12. Consequently, a current leakage can be reduced.

As shown in FIG. 61, moreover, the thick gate insulating film 110 may be extended to a body contact portion BD and makes a difference on an arrangement pattern from a trench isolating oxide film which is not extended to the body contact portion BD.

G. Seventh Embodiment

The oxidizing step is carried out at least twice in order to obtain the structure in which the thickness of the gate insulating film is varied in the direction of the gate width in the manufacturing methods according to the first and second embodiments and the fifth embodiment. By employing a method according to a seventh embodiment which will be described below, it is possible to obtain the structure in which the thickness of the gate insulating film is varied in the direction of the gate width at one oxidizing step.

<G-1. Manufacturing Method>

First of all, as shown in FIG. 64, an SOI substrate constituted by a silicon substrate 1, a buried oxide film 2 and an SOI layer 3 is prepared, a perfect trench isolating oxide film FT reaching the buried oxide film 2 through the SOI layer 3 of the SOI substrate is formed and regions to be an active region and a body contact portion are then defined.

For example, a resist mask RM31 is patterned based on the mask data RX1 shown in FIG. 1. In the resist mask RM31, a region in which an opening portion OP10 is to be formed corresponds to a region in which a thick gate insulating film is to be formed.

Thereafter, a fluorine ion is implanted into the SOI layer 3 from above the resist mask RM31. At this time, impurity conditions include an implantation energy of 10 to 50 keV and a dose of $1\times10^{14}$ to $1\times10^{15}/cm^2$.

Next, the resist mask RM31 is removed and thermal oxidation is then carried out on the condition that a thin gate insulating film is to be formed. As shown in FIG. 65, consequently, an effectively thick gate insulating film 110 is formed on an electric physical property basis in a region of the SOI layer 3 in which the fluorine ion is implanted, and a thin gate insulating film 11 is formed on a region of the SOI layer 3 which is covered by the resist mask RM31.

The reason is that the fluorine implanted into the SOI layer 3 is diffused into an oxide film so that a dielectric constant of the oxide film is reduced and the thickness is effectively increased on an electric physical property basis.

Actually, the thickness is not increased differently from the gate insulating film 110 in FIG. 65.

Moreover, it is also possible to utilize such a phenomenon that a thin oxide film is formed on an SOI layer in which nitrogen is implanted.

More specifically, L. K. Han et al. (IEDM97 p 643-p 646) has reported that nitrogen is implanted into a silicon substrate at $5\times10^{14}/cm^2$ or more so that a thickness of an oxide film to be formed thereon is reduced by 50% or more as compared with the case of non-implantation.

At a step shown in FIG. 66, accordingly, a resist mask RM32 is patterned based on the mask data RX1 shown in FIG. 1, for example. In the resist mask RM32, a region in which an opening portion OP20 is to be formed corresponds to a region in which a thin gate insulating film is to be formed.

Then, a nitrogen ion is implanted into the SOI layer 3 from above the resist mask RM32. At this time, implantation conditions include an implantation energy of 3 to 30 keV and a dose of $5\times10^{14}/cm^2$ or more.

Next, after the resist mask RM32 is removed, thermal oxidation is carried out on the condition that a thick gate insulating film is to be formed. As shown in FIG. 67, consequently, a thin gate insulating film 11 is formed on a region of the SOI layer 3 in which the nitrogen ion is implanted, and a thick gate insulating film 110 is formed on a region of the SOI layer 3 which is covered by the resist mask RM32.

In this case, the thickness of the thin gate insulating film 11 is almost half of that of the thick gate insulating film 110.

<G-2. Function and Effect>

As described above, it is possible to obtain such a structure that the thickness of the gate insulating film is varied in the direction of the gate width at one oxidizing step by selectively implanting the fluorine or nitrogen ion into the SOI layer.

When fluorine or nitrogen is implanted into a silicon layer, a very small amount of crystal defect is generated in the silicon layer and the crystal defect acts as a life time killer. Therefore, it is also possible to obtain the effect of enhancing a body fixing capability in an SOI device for body fixation.

H. Low Voltage Transistor and High Voltage Transistor

A method of manufacturing a high voltage transistor and a low voltage transistor will be described below with reference to FIGS. 68 to 72.

Figure 68:
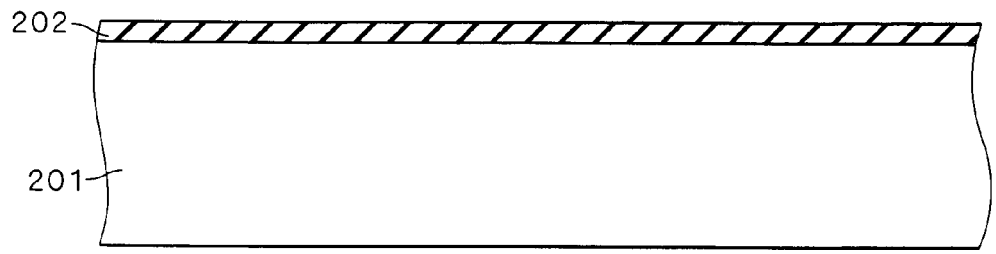

As shown in FIG. 68, first of all, an insulating film 202 having a comparatively great thickness is formed on a semiconductor substrate 201 such as a silicon substrate.

Figure 69:
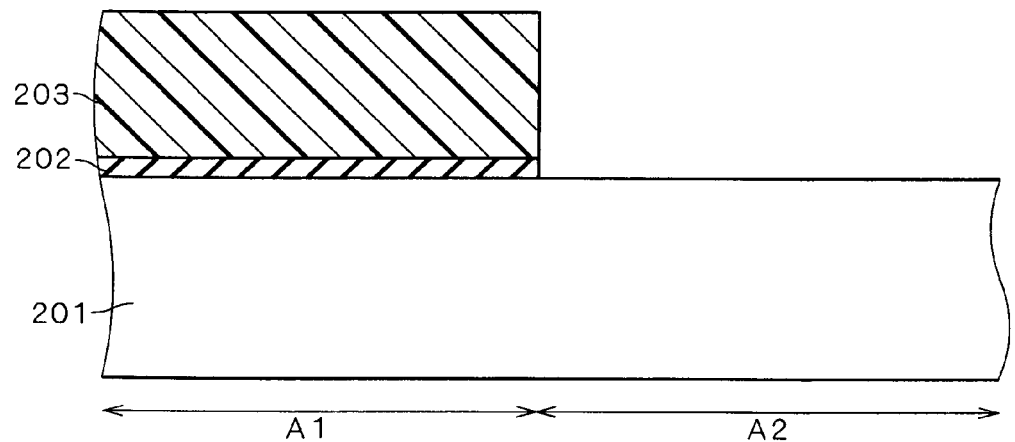

As shown in FIG. 69, a patterned resist 203 is formed to cover a high voltage operating region A1 and the insulating film 202 is subjected to etching by using the resist 203 as a mask, thereby removing the insulating film 202 formed on a low voltage operating region A2.

Figure 70:
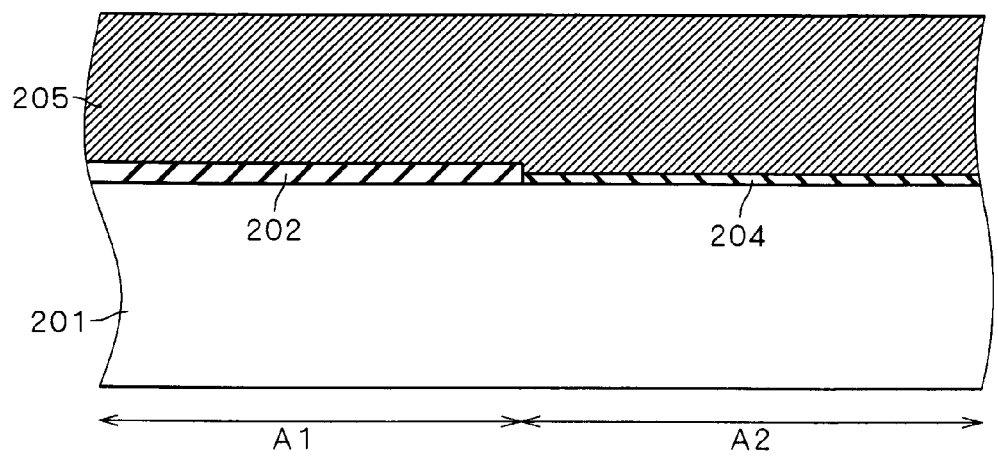
Figure 74:
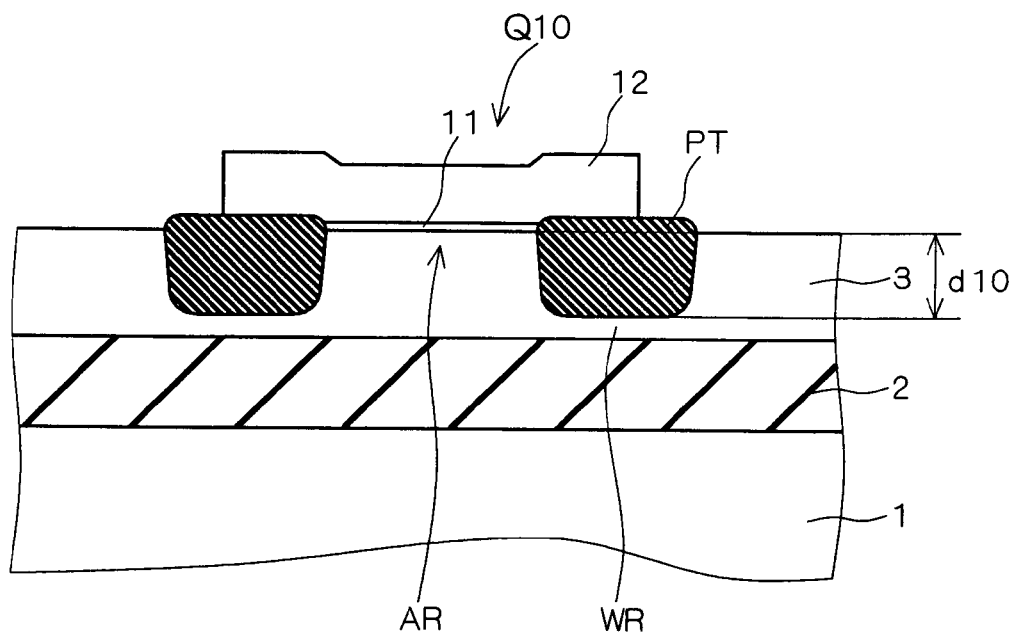
FIG. 74 is a view showing a sectional structure of an MOS transistor having a general PTI structure.
Figure 75:
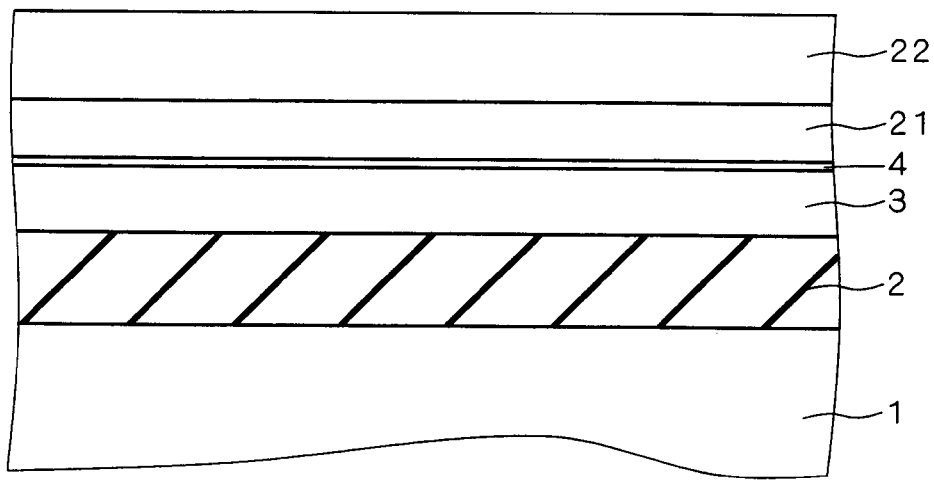
FIGS. 75 and 76 are views illustrating a process for manufacturing an MOS transistor having a PTI structure according to the conventional art.
Figure 76:
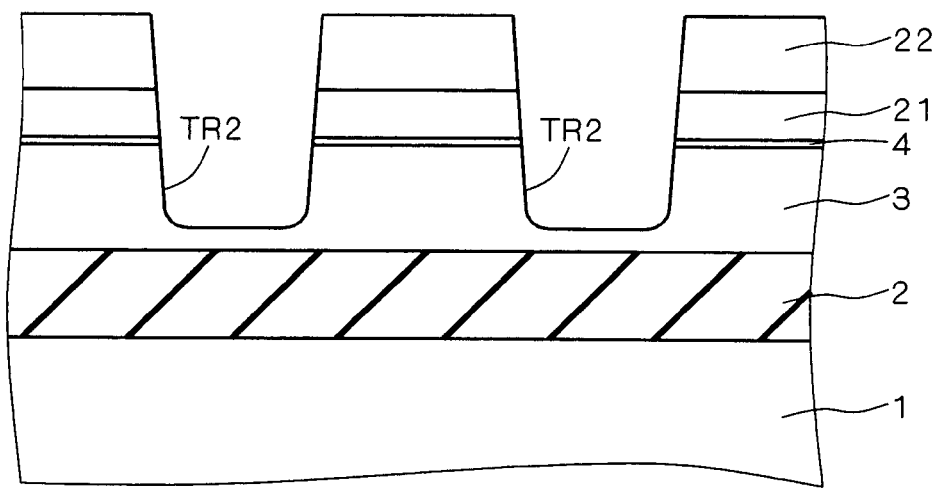
Figure 77:
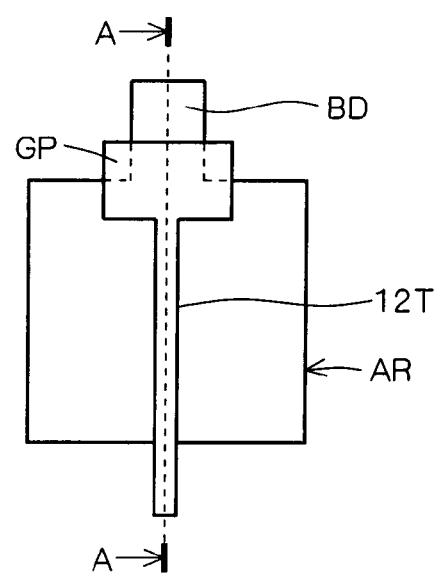
FIGS. 77 to 80 are views showing a planar structure of an MOS transistor according to the conventional art.
Figure 78:
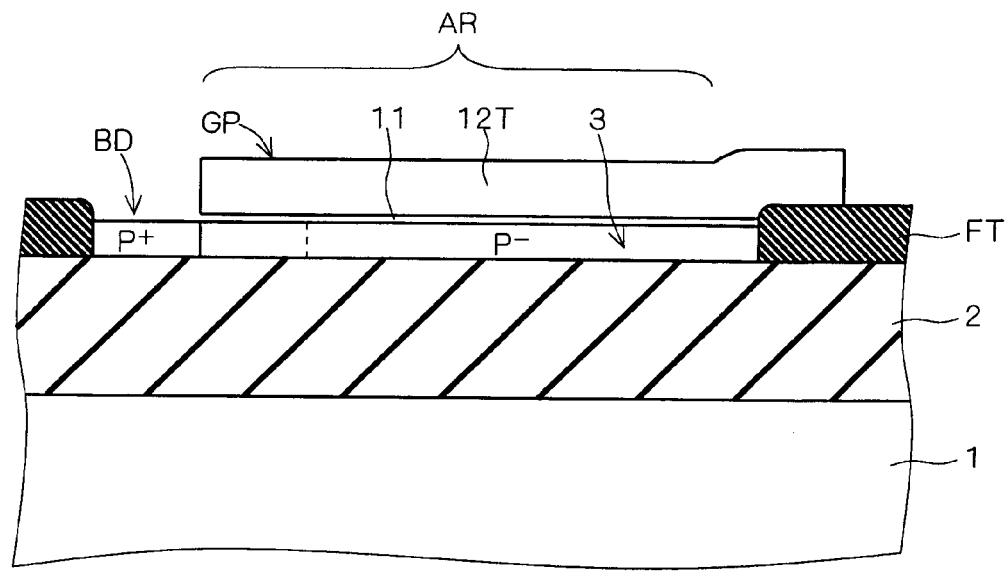
Figure 79:
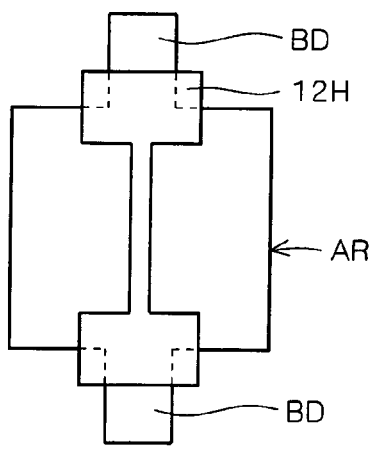
Figure 80:
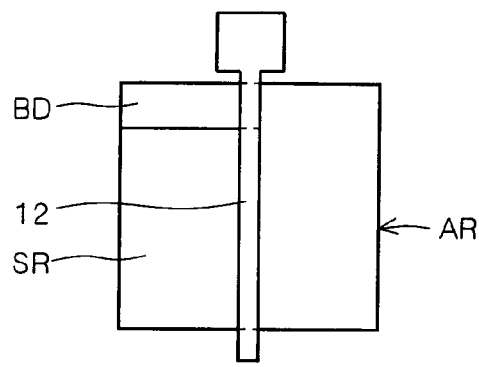

As shown in FIG. 70, then, the resist 203 is removed to form an insulating film having a comparatively small thickness over a whole surface, thereby forming an insulating film 204 in the low voltage operating region A2 and slightly increasing the thickness of the insulating film 202 in the high voltage operating region A1. Thereafter, a conductive layer 205 is deposited over a whole surface.

As shown in FIG. 71, subsequently, the conductive layer 205 is selectively etched to form a gate insulating film 61 and a gate electrode 62 in the high voltage operating region A1 and to form a gate insulating film 71 and a gate electrode 72 in the low voltage operating region A2 at the same time. In this case, the gate insulating film 61 is formed to have a greater thickness than that of the gate insulating film 71, and the gate electrode 62 is formed to have a greater gate length than that of the gate electrode 72.

Furthermore, the low voltage operating region A2 is covered by a first resist (which is not shown in FIG. 72) and an impurity ion 64 is implanted into only the high voltage operating region A1 at the same time, thereby forming an impurity diffusion region 63 to be an origin of an LDD region. Thus, a first LDD implantation process is carried out. In addition, the high voltage operating region A1 is covered by a second resist (which is not shown in FIG. 71) and an impurity ion 74 is implanted into only the low voltage operating region A2 at the same time, thereby forming an impurity diffusion region 73 to be the origin of the LDD region. Thus, a second LDD implantation process is carried out.

Thus, the first and second LDD implantations are carried out at separate steps, and the impurity diffusion region 63 is usually formed more deeply than the impurity diffusion region 73. In the first and second LDD implantation processes, a pocket implantation process for forming a pocket region may be executed together.

As shown in FIG. 72, subsequently, insulating layers (side wall insulating films) to be side walls of lower and upper layers are sequentially formed to carry out etch back. Consequently, the side wall insulating film comprising an upper layer side wall 65 and a lower layer side wall 66 is formed on a side surface of the gate electrode 62 in the high voltage operating region A1 and the side wall insulating film comprising an upper layer side wall 75 and a lower layer side wall 76 is formed on a side surface of the gate electrode 72 in the low voltage operating region A2.

Furthermore, an impurity ion 55 is implanted from above by using the gate electrode 62, the upper layer side wall 65 and the lower layer side wall 66 as a mask in the high voltage operating region A1 and using the gate electrode 72, the upper layer side wall 75 and the lower layer side wall 76 as a mask in the low voltage operating region A2. Thus, a source-drain region forming process is executed to form a source-drain region 67 and an LDD region 68 (the impurity diffusion region 63 provided under the side walls 65 and 66) in the high voltage operating region A1 and a source-drain region 77 and an LDD region 78 (the impurity diffusion region 73 provided under the side walls 75 and 76) in the low voltage operating region A2.

As a result, a high voltage MOS transistor Q101 comprising the gate insulating film 61, the gate electrode 62, the upper layer side wall 65, the lower layer side wall 66, the source-drain region 67 and the LDD region 68 is formed in the high voltage operating region A1 and a low voltage MOS transistor Q102 comprising the gate insulating film 71, the gate electrode 72, the upper layer side wall 75, the lower layer side wall 76, the source-drain region 77 and the LDD region 78 is formed in the low voltage operating region A2. The high voltage MOS transistor implies an MOS transistor to be mainly used for input and output which is operated at approximately 3.3 V, and the low voltage MOS transistor implies an MOS transistor to be mainly used for a logical operation which is operated at approximately 1.8 V.

With reference to a flow chart in FIG. 73, description will be given to a manufacturing process for obtaining a semiconductor device having a CMOS structure by utilizing the manufacturing method described above.

The flow chart in FIG. 73 shows a processing procedure to be carried out after the gate insulating film and the gate electrode have already been formed in both the high voltage operating region A1 and the low voltage operating region A2.

First of all, an LDD implantation process for a low voltage NMOS transistor is carried out at a step S1, the LDD implantation process for a low voltage PMOS transistor is carried out at a step S2, the LDD implantation process for a high voltage NMOS transistor is carried out at a step S3, and the LDD implantation process for a high voltage PMOS transistor is carried out at a step S4.

The processes of the steps S1 to S4 are carried out in no special order, and the pocket implantation process for forming a pocket region may be executed together in each of the steps S1 and S2.

Next, a pretreatment using a wet treatment (including wet etching, cleaning using liquid and the like) is executed at a step S5. Examples of the pretreatment using the wet treatment include RCA cleaning and the like. The RCA cleaning implies a treatment having both a treatment using $NH_4OH/H_2O_2$ (a treatment for removing particles) and a treatment using $HCl/H_2O_2$ (a treatment for eliminating metal contamination).

Subsequently, the lower layer side wall film is formed at a step S6, an upper layer side wall film is then formed at a step S7, and a post-treatment such as an HF (hydrofluoric acid) treatment is thereafter carried out. Thus, the side wall is formed on the side surfaces of the gate electrodes in all the MOS transistors.

Subsequently, a source-drain region forming process for all the (high and low voltage) NMOS transistors is carried out at a step S8 and a source-drain region forming process for all the PMOS transistors is carried out at a step S9. The processes in the steps S8 and S9 are carried out in no special order.

Then, silicide (salicide) such as $CoSi_2$ or $TiSi_2$ is formed on a surface of the source-drain region and that of the gate electrode. Thus, all the MOS transistors are finished.

As described above, a technique for forming the low voltage transistor and the high voltage transistor on one semiconductor substrate is established. It is possible to obtain plural kinds of MOS transistors in a simplified process by combining, with the technique, the method according to the third embodiment described with reference to FIG. 12 and the method described according to the fourth embodiment with reference to FIGS. 20 to 26.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device comprising an MOS transistor provided on an SOI layer of an SOI substrate in which a semiconductor substrate, a buried oxide film and said SOI layer are sequentially provided, and a body contact portion provided in a surface of said SOI layer and capable of fixing an electric potential from an outside, a gate electrode of said MOS transistor having a shape seen on a plane such that at least one of ends in a direction of a gate width is enlarged in a direction of a gate length to constitute a gate contact pad, said body contact portion being provided in said surface of said SOI layer on an outside of said end in said direction of said gate width of said gate contact pad and being electrically connected to a channel formation region provided under said gate electrode through said SOI layer, and a gate insulating film of said MOS transistor including a first portion having a first thickness and a second portion having a second thickness in said direction of said gate width, said second thickness being greater than said first thickness, the method comprising the steps of (a) selectively forming an insulating film having said second thickness including said second portion of said gate insulating film on said SOI layer;

(b) selectively forming an insulating film having said first thickness including said first portion of said gate insulating film on said SOI layer to be provided continuously with said insulating film having said second thickness including said second portion, wherein said step (a) includes a step of forming said insulating film having said second thickness in a region to be a lower part of at least said gate contact pad;

forming a trench isolating film for defining an active region to be a region in which said MOS transistor is to be formed, a region in which said body contact portion is to be formed, and a connecting portion of said active region and said body contact portion formation region and for electrically isolating said MOS transistor, said step (a) further comprising the steps of:

(a-1) forming, on said SOI layer, a multilayer film to be an auxiliary film for forming said trench isolating film;

(a-2) patterning, on said multilayer film, a resist mask having an opening portion to be a region in which said insulating film having said second thickness including at least said second portion of said gate insulating film is to be formed;

(a-3) removing a region which is not covered with said resist mask by etching to reach said surface of said SOI layer; and (a-4) forming an oxide film having a comparatively great thickness on said surface of said SOI layer which is exposed and setting said oxide film having a comparatively great thickness in a region corresponding to said opening portion to be said insulating film having said second thickness including said second portion of said gate insulating film, said step (a-1) including a step of forming an underlaid oxide film on said SOI layer to be a lowermost film of said multilayer film, and said step (b) being executed after said step (a) and including a step of removing said underlaid oxide film and then forming said insulating film having said first thickness where said underlaid oxide film was removed.

2. The method of manufacturing a semiconductor device according to claim 1, wherein said step (a-2) includes a step of patterning said resist mask to have an opening portion in a part corresponding to a region in which said trench isolating film is to be formed, said gate width of said MOS transistor being determined in self-alignment by said patterning of said resist mask.

3. The method of manufacturing a semiconductor device according to claim 1, wherein said step (a-3) includes a step of etching said SOI layer to be overetched.

4. The method of manufacturing a semiconductor device according to claim 1, wherein said step (a-3) includes a step of removing said underlaid oxide film by chemical dry etching.

5. The method of manufacturing a semiconductor device according to claim 3, wherein said overetching of said SOI layer includes a step of carrying out chemical dry etching.

6. The method of manufacturing a semiconductor device according to claim 1, wherein said step (a-3) further includes a step of etching said multilayer film in a portion corresponding to a region in which said trench isolating film is to be formed to reach said surface of said SOI layer; and a step of etching said SOI layer corresponding to said region in which said trench isolating film is to be formed to reach said buried oxide film after said step (a), thereby forming a trench for forming said trench isolating film.

7. The method of manufacturing a semiconductor device according to claim 6, further comprising a step of forming an insulating film on a surface of said multilayer film and a surface of said comparatively thick oxide film and then removing said insulating film by anisotropic etching, thereby forming a spacer of said insulating film on a side surface of said multilayer film prior to formation of said trench after said step (a), said trench being formed with said spacer of said insulating film left.

8. The method of manufacturing a semiconductor device according to claim 7, wherein said step of forming a spacer of said insulating film includes a step of forming a silicon oxide film by a CVD method.

9. The method of manufacturing a semiconductor device according to claim 7, wherein said step of forming a spacer of said insulating film includes a step of forming a silicon nitride film by a CVD method.

10. The method of manufacturing a semiconductor device according to claim 6, further comprising a step of oxidizing said SOI layer which is exposed to an internal wall of said trench after forming said trench.

11. The method of manufacturing a semiconductor device according to claim 1, wherein said step (a-3) includes a step of etching said multilayer film in a portion corresponding to a region in which said trench isolating film is to be formed to reach said surface of said SOI layer, the method further comprising:

a step of etching said SOI layer to reach said buried oxide film, thereby forming a trench for forming said trench isolating film between said steps (a-3) and (a-4).

12. The method of manufacturing a semiconductor device according to claim 11, further comprising a step of oxidizing said SOI layer which is exposed to an internal wall of said trench after forming said trench.

* * * * *